United States Patent
Choi et al.

(10) Patent No.: US 11,800,788 B2
(45) Date of Patent: *Oct. 24, 2023

(54) ORGANOMETALLIC COMPOUND AND ORGANIC LIGHT-EMITTING DEVICE INCLUDING I HE SAME

(71) Applicant: SAMSUNG ELECTRONICS CO., LTD., Suwon-si (KR)

(72) Inventors: Jongwon Choi, Yongin-si (KR); Soyeon Kim, Seoul (KR); Jiyoun Lee, Anyang-si (KR); Yongsuk Cho, Hwaseong-si (KR); Dmitry Kravchuk, Hwaseong-si (KR); Yoonhyun Kwak, Seoul (KR); Hyun Koo, Seongnam-si (KR); Myungsun Sim, Suwon-si (KR); Sunghun Lee, Hwaseong-si (KR); Byoungki Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/669,760

(22) Filed: Oct. 31, 2019

(65) Prior Publication Data

US 2020/0212319 A1    Jul. 2, 2020

(30) Foreign Application Priority Data

Dec. 28, 2018 (KR) .......................... 10-2018-0173083
Oct. 30, 2019 (KR) .......................... 10-2019-0136792

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ...... C09K 2211/185; C09K 2211/1029; C09K 11/06; C07F 15/0033; H01L 51/0085;
(Continued)

(56) References Cited

U.S. PATENT DOCUMENTS 6,465,115 B2  10/2002  Shi et al.
6,596,415 B2   7/2003  Shi et al.
(Continued)

FOREIGN PATENT DOCUMENTS

CN    104380494 A    2/2015
CN    104871333 A    8/2015
(Continued)

OTHER PUBLICATIONS

Julianne M. Thomsen, et al., Iridium-based complexes for water oxidation, Dalton Trans., 2015, 44, 12452-12472.
(Continued)

*Primary Examiner* — Jennifer A Boyd
*Assistant Examiner* — Elizabeth M. Dahlburg
(74) *Attorney, Agent, or Firm* — CANTOR COLBURN LLP

(57) ABSTRACT

An organometallic compound represented by Formula 1 and an organic light-emitting device including the same:
(Continued)

Formula 1

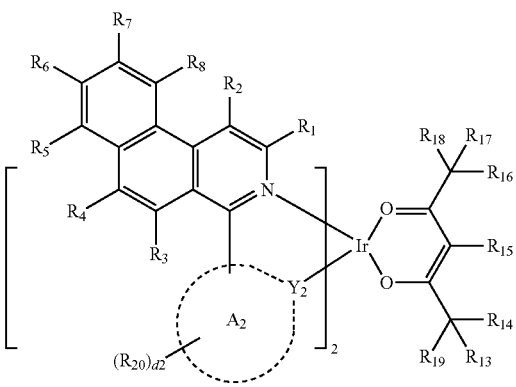

$Y_2$, ring $A_2$, $R_1$ to $R_8$, $R_{13}$ to $R_{20}$, and d2 in Formula 1 may be each independently the same as described in the specification.

16 Claims, 1 Drawing Sheet

(51) Int. Cl.
*C09K 11/06* (2006.01)
*H10K 50/11* (2023.01)
*H10K 50/15* (2023.01)
*H10K 50/16* (2023.01)
*H10K 50/17* (2023.01)
*H10K 50/18* (2023.01)

(52) U.S. Cl.
CPC .......... *C09K 2211/1029* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(58) Field of Classification Search
CPC . H01L 51/0072; H01L 51/50; H01L 51/5012; H01L 51/5016; H01L 51/5056; H01L 51/5072; H01L 51/5088; H01L 51/5092; H01L 51/5096; C09B 57/00; C09B 69/008; H10K 85/342; H10K 50/00; H10K 50/11; H10K 50/12; H10K 50/15; H10K 50/16; H10K 50/17; H10K 50/171; H10K 50/18; H10K 2101/10
See application file for complete search history.

(56) References Cited

U.S. PATENT DOCUMENTS

| | | | |
|---|---|---|---|
| 8,431,243 | B2 | 4/2013 | Kwong et al. |
| 9,130,177 | B2 | 9/2015 | Ma et al. |
| 9,379,361 | B2 | 6/2016 | Tsurutani et al. |
| 9,960,370 | B2 | 5/2018 | Kishino et al. |
| 10,109,807 | B2 | 10/2018 | Kamatani et al. |
| 2001/0019782 | A1 | 9/2001 | Igarashi et al. |
| 2010/0219407 | A1* | 9/2010 | Kamatani ............ H01L 51/006 257/40 |
| 2015/0076483 | A1 | 3/2015 | Tsurutani et al. |
| 2015/0295188 | A1* | 10/2015 | Kosuge ............... C07F 15/0033 345/173 |
| 2015/0303386 | A1* | 10/2015 | Kishino ................ C09K 11/06 257/40 |
| 2015/0333279 | A1 | 11/2015 | Kamatani et al. |
| 2015/0364701 | A1 | 12/2015 | Horiuchi et al. |
| 2015/0364702 | A1* | 12/2015 | Abe ........................ C09K 11/06 546/4 |
| 2015/0364703 | A1* | 12/2015 | Miyashita .............. C09K 11/06 345/204 |
| 2015/0372244 | A1* | 12/2015 | Abe ........................ C07D 333/76 257/40 |
| 2016/0285007 | A1* | 9/2016 | Swager ................ H01L 51/0061 |
| 2016/0285013 | A1 | 9/2016 | Boudreault et al. |
| 2017/0054095 | A1 | 2/2017 | Choi et al. |
| 2018/0130956 | A1* | 5/2018 | Boudreault ......... H01L 51/0085 |
| 2018/0198079 | A1 | 7/2018 | Boudreault et al. |
| 2019/0013484 | A1 | 1/2019 | Kamatani et al. |
| 2019/0157576 | A1 | 5/2019 | Kwong et al. |
| 2020/0071346 | A1 | 3/2020 | Choi et al. |
| 2020/0099000 | A1* | 3/2020 | Zhang ................... C09K 11/06 |
| 2020/0111977 | A1 | 4/2020 | Choi et al. |
| 2020/0308201 | A1 | 10/2020 | Lee et al. |
| 2020/0308202 | A1 | 10/2020 | Cho et al. |
| 2020/0313095 | A1 | 10/2020 | Lee et al. |

FOREIGN PATENT DOCUMENTS

| | | | |
|---|---|---|---|
| CN | 107827933 | A | 3/2018 |
| CN | 108059645 | A | 5/2018 |
| CN | 111747990 | A | 10/2020 |
| CN | 111747991 | A | 10/2020 |
| CN | 111755629 | A | 10/2020 |
| EP | 2465912 | A1 | 6/2012 |
| JP | 2000003782 | A | 1/2000 |
| JP | 2009114137 | A | 5/2009 |
| JP | 2014127687 | A | 7/2014 |
| JP | 2014127688 | A | 7/2014 |
| JP | 6157125 | B2 | 7/2017 |
| JP | 2020059709 | A | 4/2020 |
| KR | 101468065 | B1 | 12/2014 |
| KR | 1020180082339 | A | 7/2018 |
| WO | 2013176194 | A1 | 11/2013 |
| WO | 2014104395 | A1 | 7/2014 |

OTHER PUBLICATIONS

Jun Ohata, et al., Luminogenic iridium azide complexes, Chem. Commun., 2015, 51, 15192-15195.
M. A. Baldo, et al., Highly efficient phosphorescent emission fromorganic electroluminescent devicesNature v395, pp. 151-154 (1998).
M. A. Baldo, et al., Very high-efficiency green organic light-emitting devices based on electrophosphorescence Appl. Phys. Lett. 75, 4 (1999).
Qin Wang, et al., Effects of charged self-assembled quantum dots on two-dimensional quantum transport Appl. Phys. Lett. 76, 1704 (2000).
Raymond C. Kwong, et al., High operational stability of electrophosphorescent devices, Appl. Phys. Lett. 81, 162 (2002), 4pp.
Sergey Lamansky, et al., Highly Phosphorescent Bis-Cyclometalated Iridium Complexes:Synthesis, Photophysical Characterization, and Use in Organic Light Emitting DiodesJ. Am. Chem. Soc.2001, 123, 4304-4312.
Toshitada Yoshihara, et al., Mitochondria-targeted oxygen probes based on cationic iridium complexes with a 5-amino-1, 10-phenanthroline ligand, J. Photochem. Photobiol., 2015, 299, 172-182.
Extended European search report issued by the European Patent Office dated Apr. 22, 2020 in the examination of the European Patent Application No. 19217630.3, which corresponds to the U.S. Application.
Sergey Lamansky, et al., Synthesis and Characterization of Phosphorescent Cyclometalated Iridium Complexes, Inorg. Chem. 2001, 40, 1704-1711.
English translation of Office Action issued in corresponding JP Patent Application No. 2019-232371, dated Feb. 1, 2022, 6 pp.
Office Action issued in corresponding JP Patent Application No. 2019-232371, dated Feb. 1, 2022, 5 pp.

(56) References Cited

OTHER PUBLICATIONS

English Translation of Office Action dated Mar. 13, 2023, issued in corresponding CN Patent Application No. 201911324015.2, 10 pp.
English Translation of Office Action dated May 18, 2023 issued in corresponding KR Patent Application No. 10-2019-0136792, 6 pp.
English Translation of Office Action dated May 15, 2023 in corresponding TW Patent Application No. 108147808, 8 pp.
Joseph C. Sloop, "Advances in the Preparation of Fluorinated Isoquinolines: A Decade of Progress", Journal of Chemistry, 2017, Hindawi, Jan. 23, 2017, Article ID 2860123, 15 pages.
Office Action dated Mar. 13, 2023, issued in corresponding CN Patent Application No. 201911324015.2, 10 pp.
Office Action dated May 18, 2023 issued in corresponding KR Patent Application No. 10-2019-0136792, 7 pp.
Office Action dated May 15, 2023 in corresponding TW Patent Application No. 108147808, 6 pp.

* cited by examiner

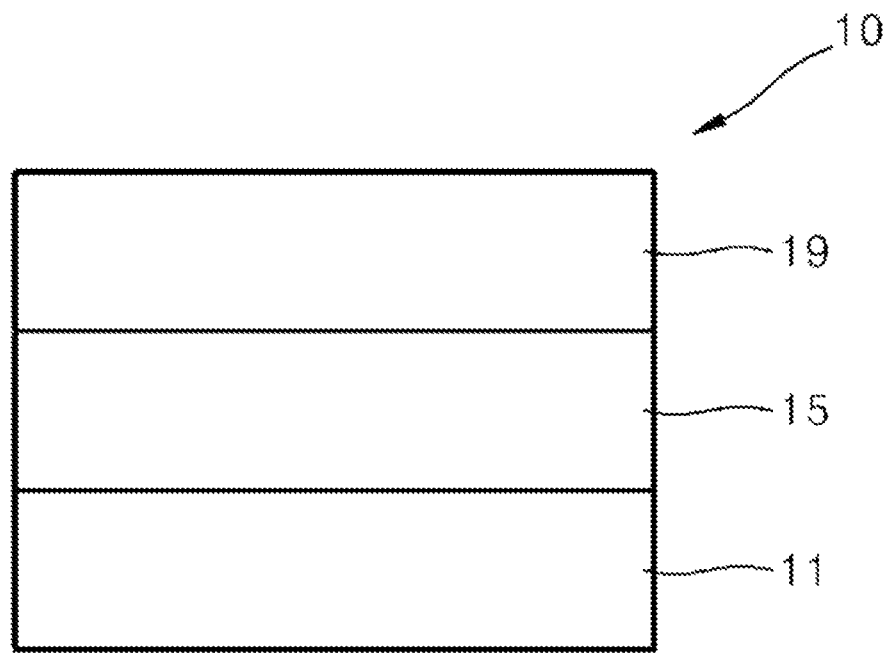

ORGANOMETALLIC COMPOUND AND ORGANIC LIGHT-EMITTING DEVICE INCLUDING THE SAME

CROSS-REFERENCE TO RELATED APPLICATION

This application claims priority to and the benefit of Korean Patent Applications Nos. 10-2018-0173083, filed on Dec. 28, 2018, and 10-2019-0136792, filed on Oct. 30, 2019, in the Korean Intellectual Property Office, and all the benefits accruing therefrom under 35 U.S.C. § 119, the content of which is incorporated herein in its entirety by reference.

JOINT RESEARCH AGREEMENT

The inventions described and claimed herein were made pursuant to a Joint Research Agreement, in effect on or before the date the inventions were made, between Samsung Electronics Co., Ltd. and Samsung SDI Co., Ltd.

BACKGROUND

1. Field

The present disclosure relates to an organometallic compound and an organic light-emitting device including the same.

2. Description of the Related Art

Organic light-emitting devices are self-emission devices, which have improved characteristics in terms of viewing angles, response times, brightness, driving voltages, and response speeds, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

SUMMARY

Provided are novel organometallic compounds and organic light-emitting devices including the same.

Additional aspects will be set forth in part in the description which follows and, in part, will be apparent from the description, or may be learned by practice of the presented embodiments.

According to an aspect of an embodiment, an organometallic compound represented by Formula 1:

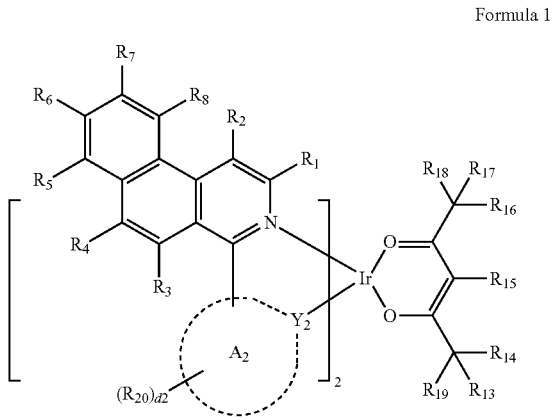

Formula 1

$Y_2$ may be C, ring $A_2$ may be a $C_5$-$C_{30}$ carbocyclic group or a $C_1$-$C_{30}$ heterocyclic group, $R_1$ to $R_8$, $R_{13}$ to $R_{17}$, and $R_{20}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$), d2 may be an integer from 0 to 10, and when d2 is 2 or more, two or more R$_{20}$(s) may be identical to or different from each other, i) at least one of R$_1$ to R$_8$ may include at least one fluoro group (—F), and ii) R$_{20}$ may include neither a fluoro group (—F) nor a cyano group, R$_{18}$ and R$_{19}$ may each independently be a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, two or more of $R_1$ to $R_8$ may be optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, two or more of $R_{20}$(s) in the number of d2 may be optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, two or more of $R_{13}$ to $R_{19}$ may be optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, $R_{1a}$ may be the same as explained in connection with $R_2$, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, or any combination thereof;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or any combination thereof; or any combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Another aspect provides an organic light-emitting device including a first electrode; a second electrode; and an organic layer disposed between the first electrode and the second electrode and including an emission layer, wherein the organic layer includes at least one organometallic compounds represented by Formula 1.

The organometallic compound in the emission layer of the organic layer may function as a dopant.

BRIEF DESCRIPTION OF THE DRAWING

These and/or other aspects will become apparent and more readily appreciated from the following description of the embodiments, taken in conjunction with FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the FIGURES is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the FIGURES is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing For example, a region illustrated or described as flat may, typically, have rough and/or nonlinear features Moreover, sharp angles that are illustrated may be rounded Thus, the regions illustrated in the FIGURES are schematic in nature and their shapes are not intended to illustrate the precise shape of a region and are not intended to limit the scope of the present claims.

An organometallic compound according to one embodiment is represented by Formula 1 below:

Formula 1

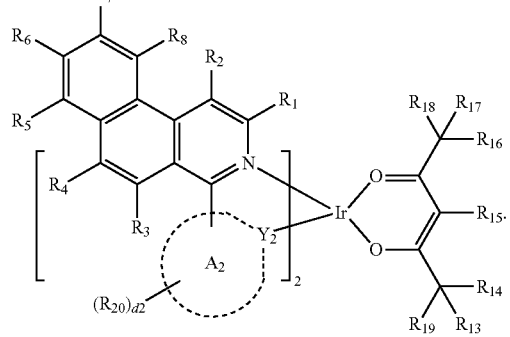

Y$_2$ in Formula 1 may be C.

Ring A$_2$ in Formula 1 may be a C$_5$-C$_{30}$ carbocyclic group or a C$_1$-C$_{30}$ heterocyclic group.

For example, ring A$_2$ in Formula 1 may be i) a first ring, ii) a second ring, iii) a condensed cyclic group in which two or more first rings are condensed with each other, iv) a condensed cyclic group in which two or more second rings are condensed with each other, or v) a condensed cyclic group in which at least one first ring is condensed with at least one second ring, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, the second ring may be an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclohexane group, a cyclohexene group, a benzene group, a pyridine group, a pyrimidine group, a pyrazine group, a pyridazine group, or a triazine group.

In one or more embodiments, ring $A_2$ in Formula 1 may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a thiophene group, a furan group, a pyrrole group, a cyclopentadiene group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a fluorene group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, ring $A_2$ may be a benzene group, a naphthalene group, a 1, 2, 3, 4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

$R_1$ to $R_8$, $R_{13}$ to $R_{17}$, and $R_{20}$ in Formula 1 may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$). Each of Q$_1$ to Q$_9$ are the same as described herein. Herein, R$_{20}$ may include neither a fluoro group (—F) nor a cyano group. In one or more embodiments, R$_{20}$ may be a group that includes neither a fluoro group (—F) nor a cyano group.

For example, $R_1$ to $R_8$, and $R_{13}$ to $R_{17}$ and $R_{20}$ in Formula 1 may each independently be:
  hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —SF$_5$, a $C_1$-$C_{20}$ alkyl group, or a $C_1$-$C_{20}$ alkoxy group;
  a $C_1$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group (a norbornyl group), a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof;
  a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a deuterium-containing C$_1$-C$_{20}$ alkyl group, a fluorinated C$_1$-C$_{20}$ alkyl group, a C$_1$-C$_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.1]heptyl group, a (C$_1$-C$_{20}$ alkyl)bicyclo[2.2.2]octyl group, a silolanyl group, a phenyl group, a (C$_1$-C$_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q)(Q$_9$), or —P(Q$_8$)(Q$_9$), wherein R$_{20}$ includes neither a fluoro group nor a cyano group, Q$_1$ to Q$_9$ may each independently be:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H or —CD$_2$CDH$_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a C$_1$-C$_{20}$ alkyl group, a phenyl group, or any combination thereof.

In one or more embodiments, R$_1$ to R$_8$, R$_{13}$ to R$_{17}$, and R$_{20}$ in Formula 1 may each independently be hydrogen, deuterium, —F, a substituted or unsubstituted C$_1$-C$_{20}$ alkyl group, a substituted or unsubstituted C$_3$-C$_{10}$ cycloalkyl group, a substituted or unsubstituted C$_2$-C$_{10}$ heterocycloalkyl group, —Si(Q$_3$)(Q$_4$)(Q$_5$), or —Ge(Q$_3$)(Q$_4$)(Q$_5$). Herein, R$_{20}$ may include neither a fluoro group nor a cyano group.

In one or more embodiments, R$_1$ to R$_8$ and R$_{13}$ to R$_{17}$ in Formula 1 may each independently be:
hydrogen, deuterium, or —F;
a C$_1$-C$_{20}$ alkyl group, a C$_3$-C$_{10}$ cycloalkyl group, or a C$_2$-C$_{10}$ heterocycloalkyl group, each unsubstituted or substituted with deuterium, —F, C$_1$-C$_{20}$ alkyl group, a C$_3$-C$_{10}$ cycloalkyl group, a C$_2$-C$_{10}$ heterocycloalkyl group, or any combination thereof; or
—Si(Q$_3$)(Q$_4$)(Q$_5$), or —Ge(Q$_3$)(Q$_4$)(Q$_5$).

In one or more embodiments, R$_{20}$ in Formula 1 may be:
hydrogen or deuterium;
a C$_1$-C$_{20}$ alkyl group, a C$_3$-C$_{10}$ cycloalkyl group, or a C$_2$-C$_{10}$ heterocycloalkyl group, each unsubstituted or substituted with deuterium, a C$_1$-C$_{20}$ alkyl group, a C$_3$-C$_{10}$ cycloalkyl group, a C$_2$-C$_{10}$ heterocycloalkyl group, or any combination thereof; or
—Si(Q$_3$)(Q$_4$)(Q$_5$), or —Ge(Q$_3$)(Q$_4$)(Q$_5$).

The designation d2 in Formula 1 indicates the number of R$_{20}$(s), and may be an integer from 0 to 10. When d2 is 2 or more, two or more R$_{20}$(s) may be identical to or different from each other. For example, d2 may be an integer from 0 to 6.

In one or more embodiments, at least one of R$_1$ to R$_8$ in Formula 1 may include at least one fluoro group (—F).

In one or more embodiments, at least one of R$_1$ to R$_8$ of Formula 1 may be a group including at least one fluoro group (—F).

In one or more embodiments, at least one of R$_1$ to R$_8$ in Formula 1 may each independently be:
a fluoro group (—F); or
a fluorinated C$_1$-C$_{20}$ alkyl group, a fluorinated C$_3$-C$_{10}$ cycloalkyl group, or a fluorinated C$_2$-C$_{10}$ heterocycloalkyl group, each unsubstituted or substituted with deuterium, a C$_1$-C$_{20}$ alkyl group, a C$_3$-C$_{10}$ cycloalkyl group, a C$_2$-C$_{10}$ heterocycloalkyl group, or any combination thereof.

R$_{18}$ and R$_{19}$ in Formula 1 may each independently be a substituted or unsubstituted C$_2$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_2$-C$_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, $R_{18}$ and $R_{19}$ in Formula 1 may each independently be:

a $C_2$-$C_{20}$ alkyl group or a $C_1$-$C_{20}$ alkoxy group;

a $C_2$-$C_{20}$ alkyl group or a $C_1$-$C_{20}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a pyridinyl group, a pyrimidinyl group, or any combination thereof; or a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a silolanyl group, a phenyl group, a ($C_1$-$C_{20}$ alkyl)phenyl group, a biphenyl group, a terphenyl group, a naphthyl group, a 1,2,3,4-tetrahydronaphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof.

In one or more embodiments, $R_{18}$ and $R_{19}$ in Formula 1 may each independently be a substituted or unsubstituted $C_2$-$C_{60}$ alkyl group, a substituted or unsubstituted $C_3$-$C_{10}$ cycloalkyl group, or a substituted or unsubstituted $C_2$-$C_{10}$ heterocycloalkyl group.

In one or more embodiments, $R_{18}$ and $R_{19}$ in Formula 1 may each independently be a $C_2$-$C_{20}$ alkyl group, a $C_3$-$C_{10}$ cycloalkyl group, or a $C_2$-$C_{10}$ heterocycloalkyl group, each unsubstituted or substituted with deuterium, —F, $C_1$-$C_{20}$ alkyl group, a $C_3$-$C_{10}$ cycloalkyl group, a $C_2$-$C_{10}$ heterocycloalkyl group, or any combination thereof.

For example, $R_1$ to $R_8$ and $R_{13}$ to $R_{17}$ in Formula 1 may each independently be hydrogen, deuterium, —F, —CH$_3$, —CD$_3$, —CD$_2$H, —CDH$_2$, —CF$_3$, —CF$_2$H, —CFH$_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-201 to 10-343, a group represented by one of Formulae 10-201 to 10-343 in which at least one hydrogen is substituted with deuterium, a group represented by one of Formulae 10-201 to 10-343 in which at least one hydrogen is substituted with —F, —Si(Q$_3$)(Q$_4$)(Q$_5$), or —Ge(Q$_3$)(Q$_4$)(Q$_5$) (herein Q$_3$ to Q$_5$ are the same as described in the present specification), and at least one of $R_1$ to $R_8$ may be —F, —CF$_3$, —CF$_2$H, —CFH$_2$, a group represented by one of Formulae 9-1 to 9-39 in which at least one hydrogen is substituted with —F, a group represented by one of Formulae 9-201 to 9-233 in which at least one hydrogen is substituted with —F, a group represented by one of Formulae 10-1 to 10-126 in which at least one hydrogen is substituted with —F, or a group represented by one of Formulae 10-201 to 10-343 in which at least one hydrogen is substituted with —F.

In one or more embodiments, $R_{20}$ in Formula 1 may be hydrogen, deuterium, —CH$_3$, —CD$_3$, —CD$_2$H, —CDH$_2$, a group represented by one of Formulae 9-1 to 9-39, a group represented by one of Formulae 9-1 to 9-39 in which at least one hydrogen is substituted with deuterium, a group represented by one of Formulae 9-201 to 9-233, a group represented by one of Formulae 9-201 to 9-233 in which at least one hydrogen is substituted with deuterium, a group represented by one of Formulae 10-1 to 10-126, a group represented by one of Formulae 10-1 to 10-126 in which at least one hydrogen is substituted with deuterium, a group represented by one of Formulae 10-201 to 10-343, a group represented by one of Formulae 10-201 to 10-343 in which at least one hydrogen is substituted with deuterium, —Si(Q$_3$)(Q$_4$)(Q$_5$), or —Ge(Q$_3$)(Q$_4$)(Q$_5$) (herein Q$_3$ to Q$_5$ are the same as described in the present specification).

In one or more embodiments, $R_{18}$ and $R_{19}$ in Formula 1 may each independently be a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-233, a group represented by one of Formulae 9-201 to 9-233 in which at least one hydrogen is substituted with deuterium, a group represented by one of Formulae 9-201 to 9-233 in which at least one hydrogen is substituted with —F, a group represented by one of Formulae 10-1 to 10-126, a group represented by one of Formulae 10-1 to 10-126 in which at least one hydrogen is substituted with deuterium, a group represented by one of Formulae 10-1 to 10-126 in which at least one hydrogen is substituted with —F, a group represented by one of Formulae 10-201 to 10-343, a group represented by one of Formulae 10-201 to 10-343 in which at least one hydrogen is substituted with deuterium, or a group represented by one of Formulae 10-201 to 10-343 in which at least one hydrogen is substituted with —F:

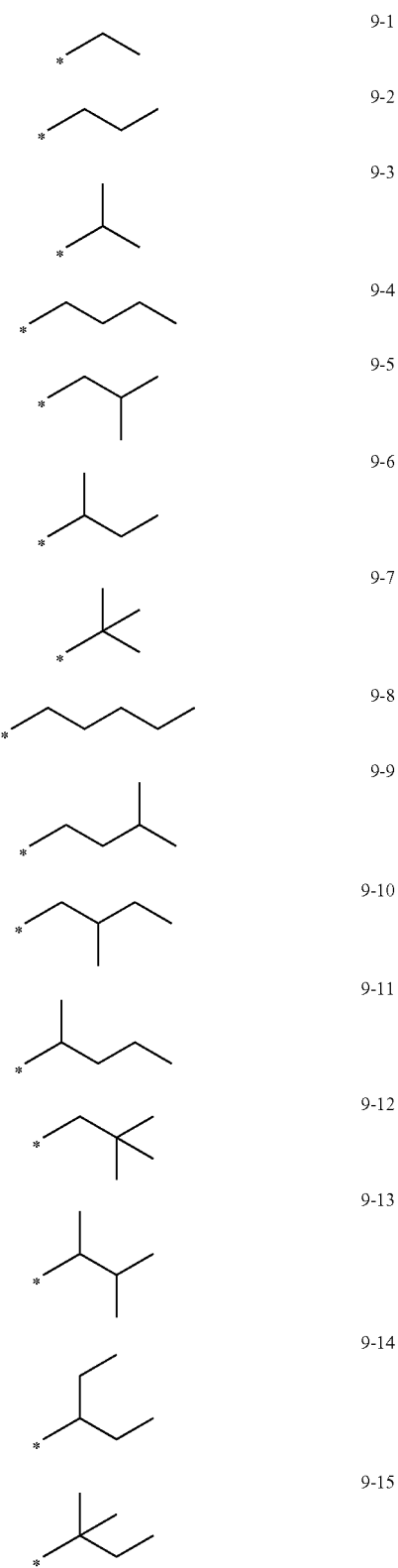

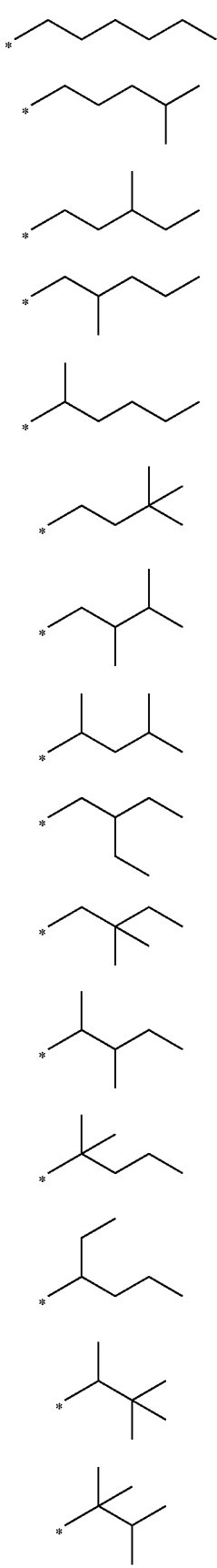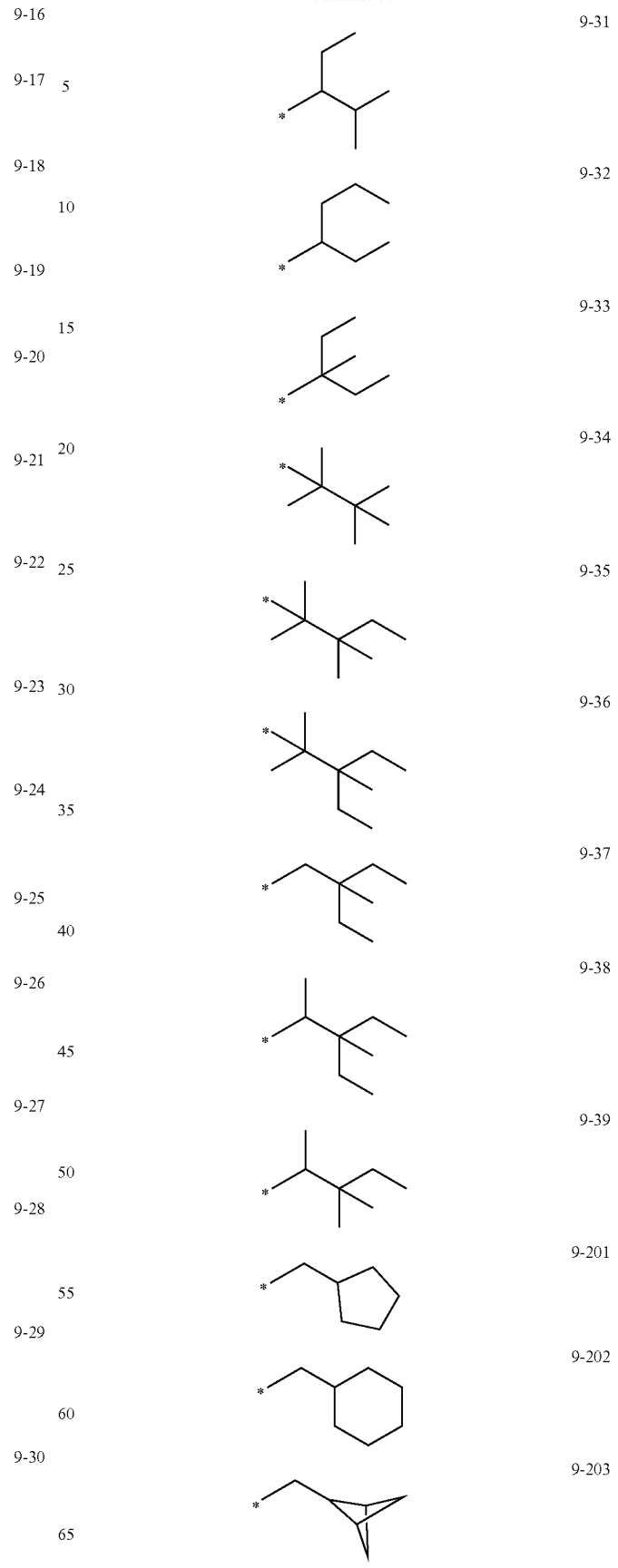

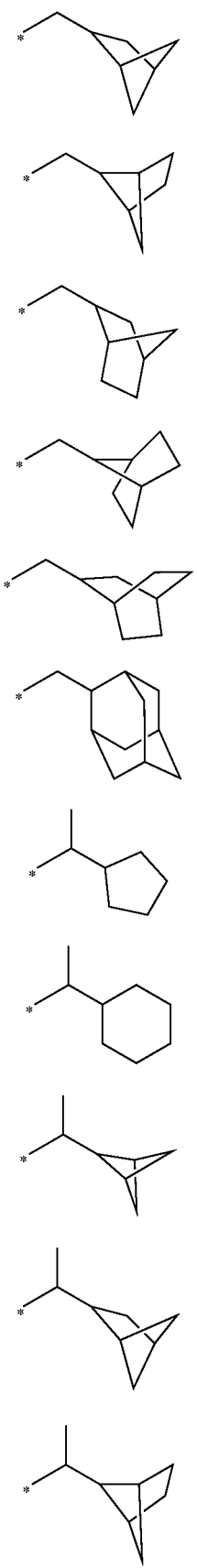
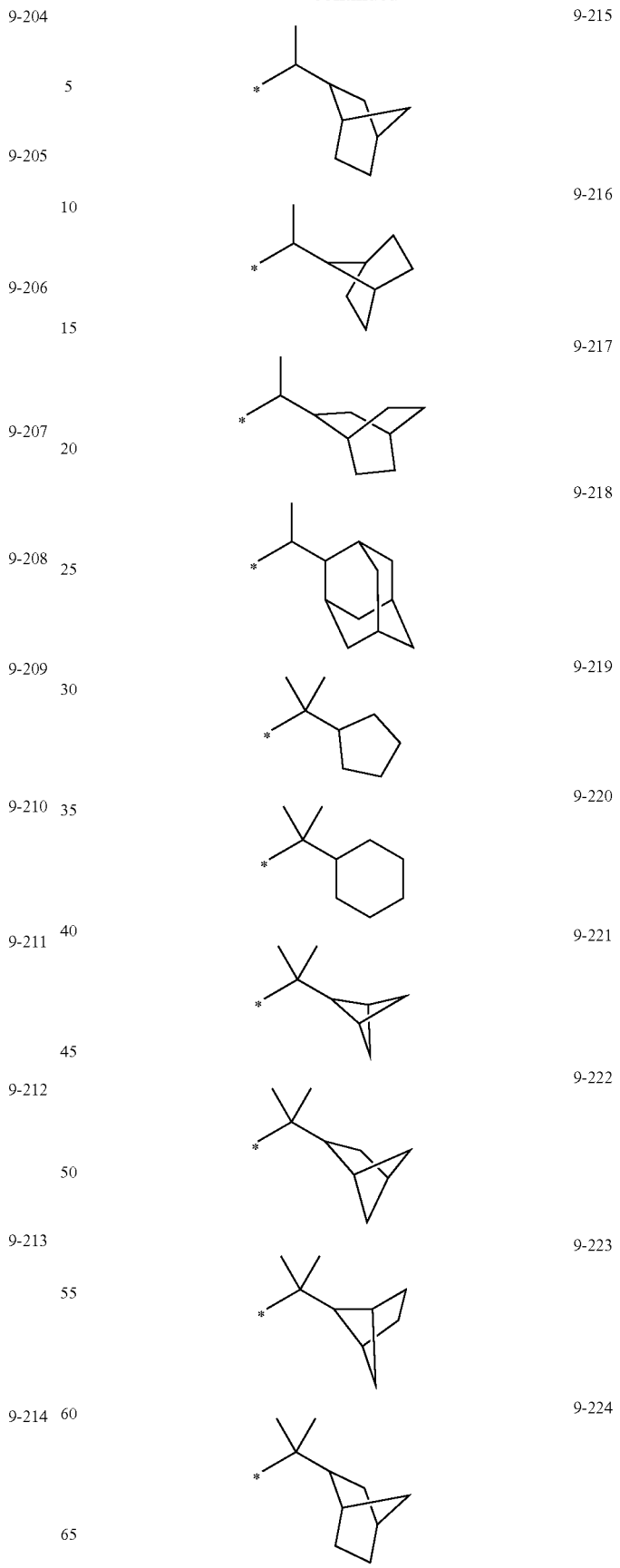

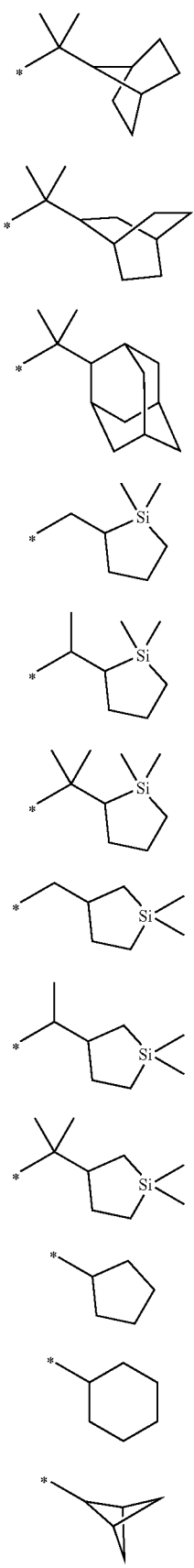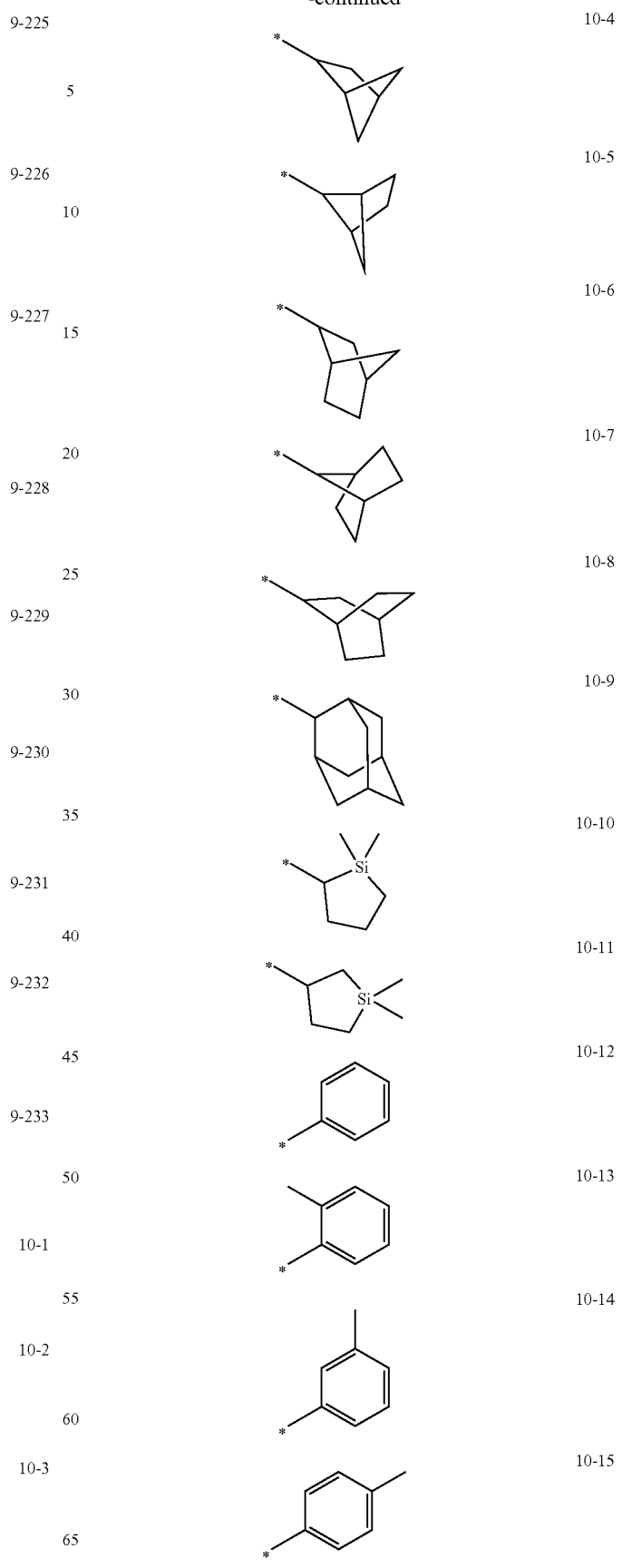

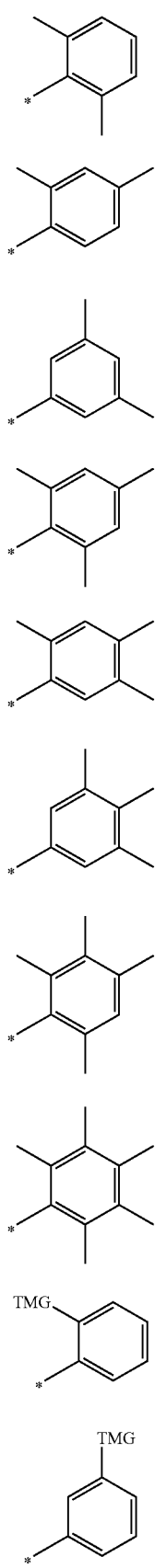
10-16
10-17
10-18
10-19
10-20
10-21
10-22
10-23
10-24
10-25
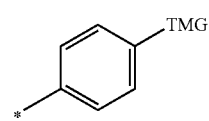
10-26
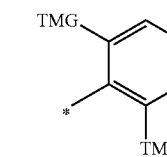
10-27
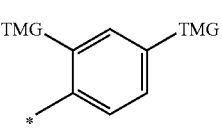
10-28
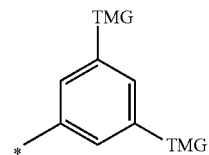
10-29
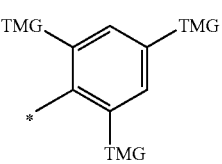
10-30
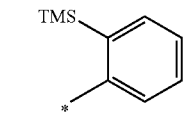
10-31
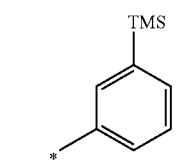
10-32
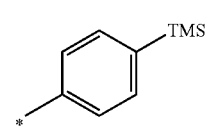
10-33
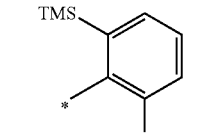
10-34
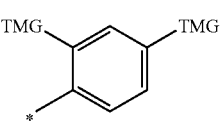
10-35

-continued
| | |
|---|---|
| 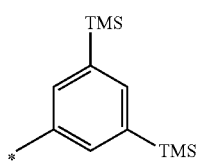 | 10-36 |
| 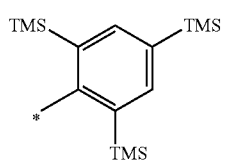 | 10-37 |
| 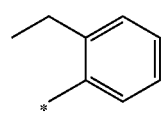 | 10-38 |
| 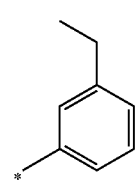 | 10-39 |
| 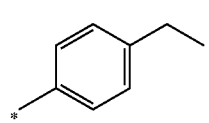 | 10-40 |
| 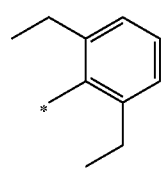 | 10-41 |
| 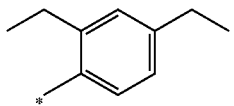 | 10-42 |
| 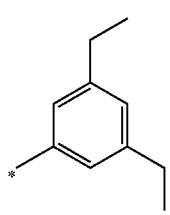 | 10-43 |
| 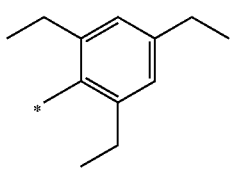 | 10-44 |
-continued
| | |
|---|---|
| 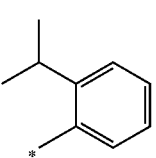 | 10-45 |
| 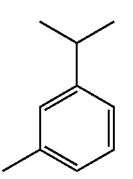 | 10-46 |
| 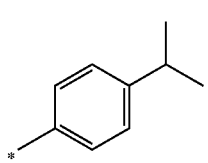 | 10-47 |
| 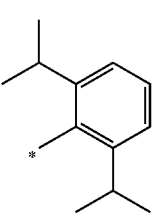 | 10-48 |
| 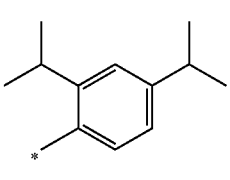 | 10-49 |
| 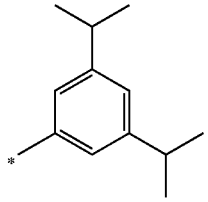 | 10-50 |
| 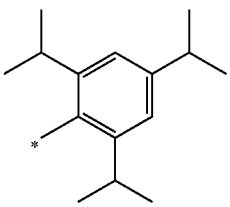 | 10-51 |
| 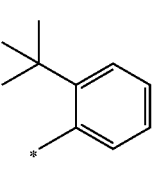 | 10-52 |

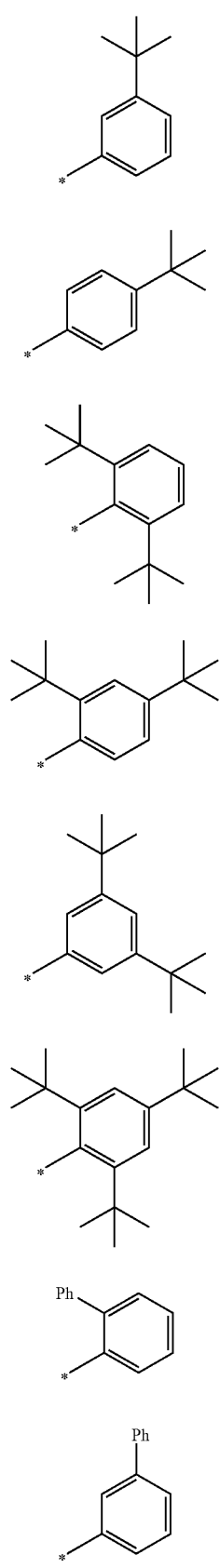
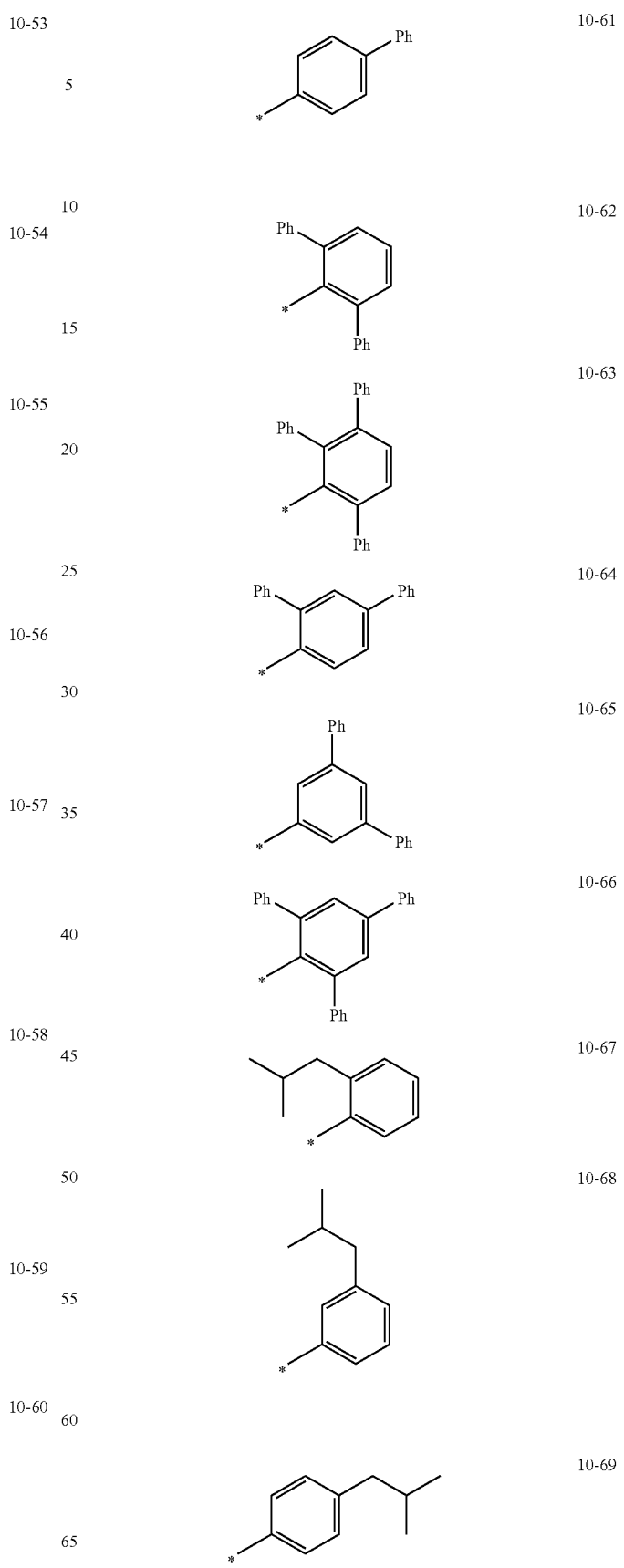

10-70
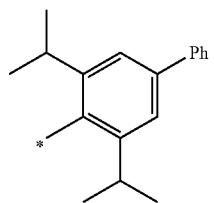
10-71
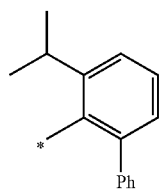
10-72
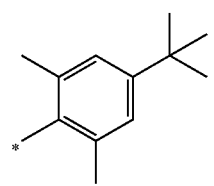
10-73
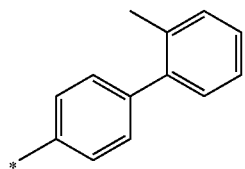
10-74
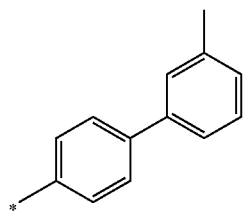
10-75
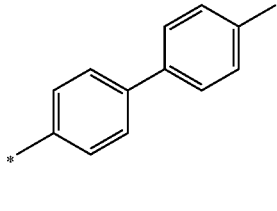
10-76
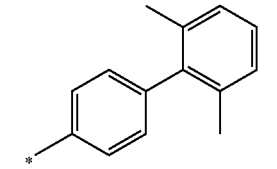
10-77
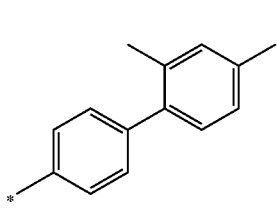
10-78
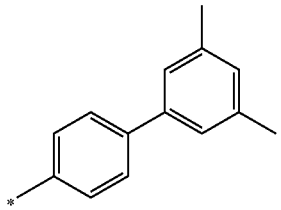
10-79
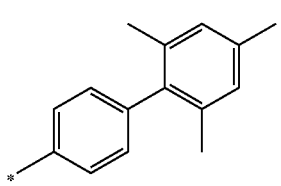
10-80
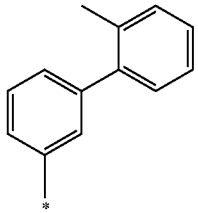
10-81
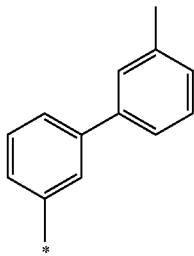
10-82
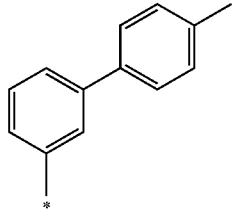
10-83
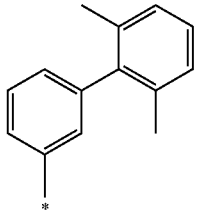
10-84
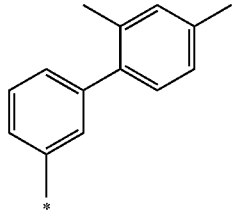

10-85 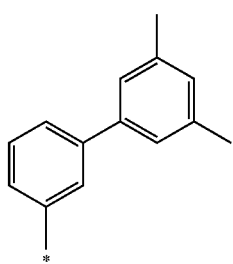
10-86 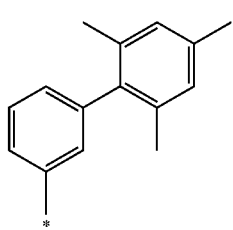
10-87 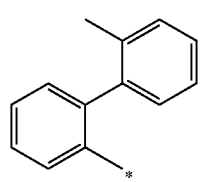
10-88 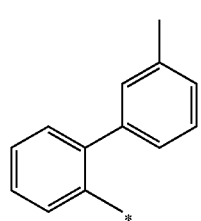
10-89 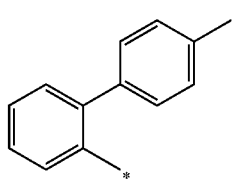
10-90 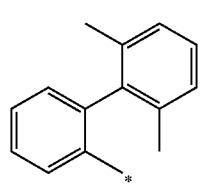
10-91 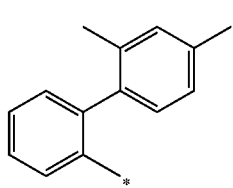
10-92 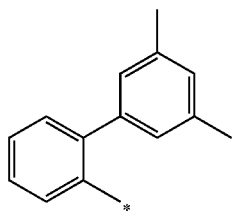
10-93 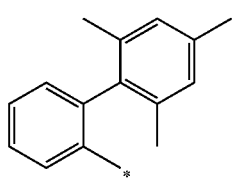
10-94 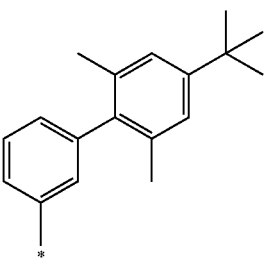
10-95 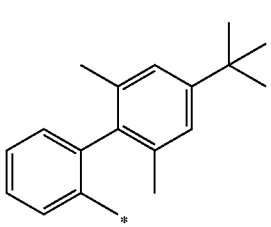
10-96 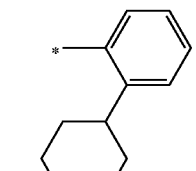
10-97 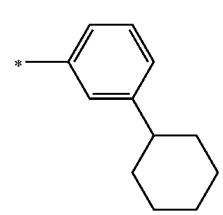
10-98 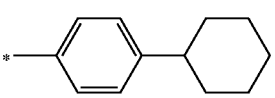
10-99 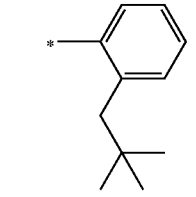

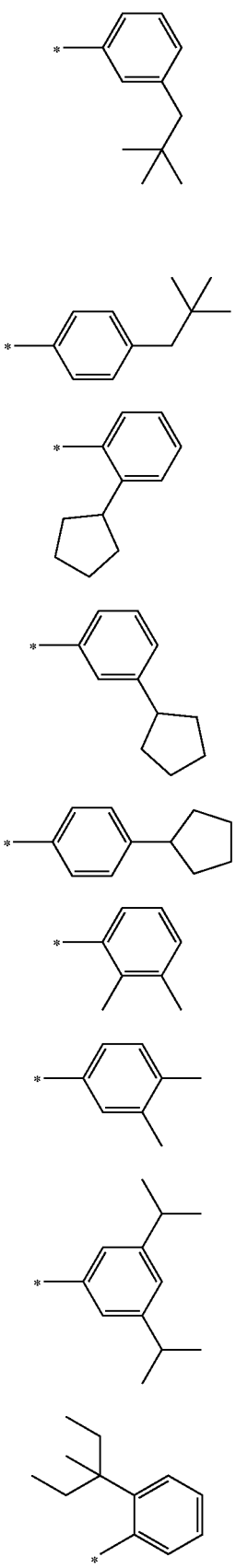
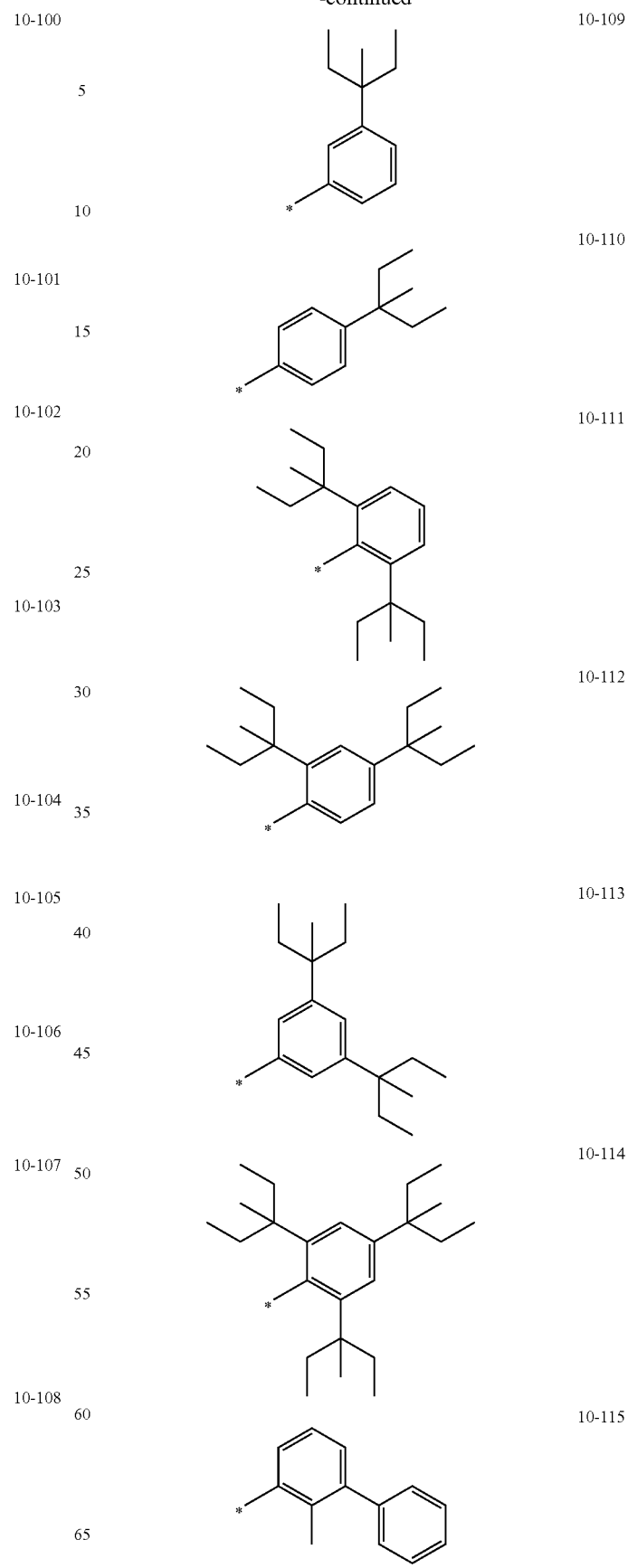

10-116 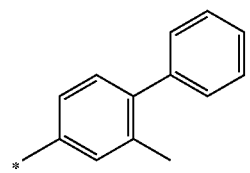
10-117 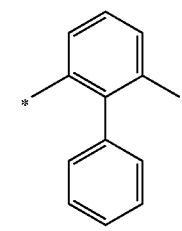
10-118 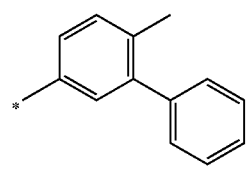
10-119 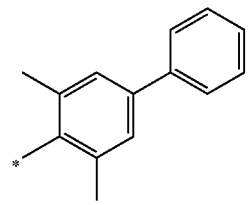
10-120 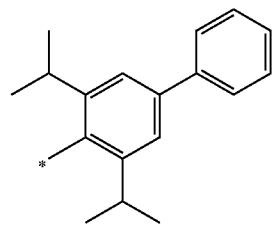
10-121 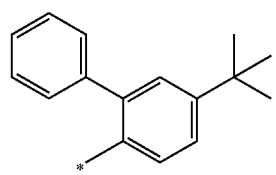
10-122 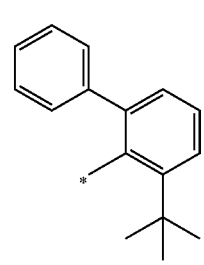
10-123 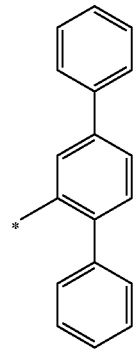
10-124 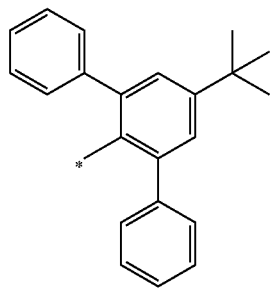
10-125 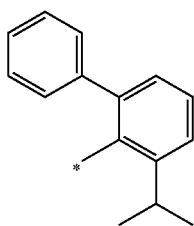
10-126 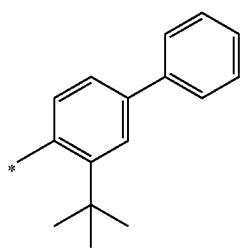
10-201 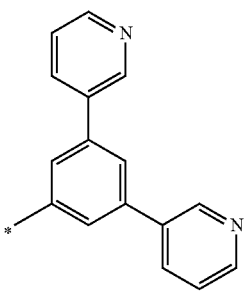

-continued

| | |
|---|---|
| 10-202 | 10-208 |
| 10-203 | 10-209 |
| 10-204 | 10-210 |
| 10-205 | 10-211 |
| | 10-212 |
| | 10-213 |
| | 10-214 |
| | 10-215 |
| 10-206 | 10-216 |
| 10-207 | 10-217 |
| | 10-218 |

10-219 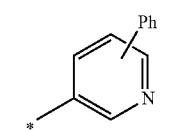
10-220 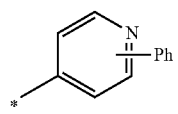
10-221 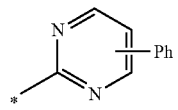
10-222 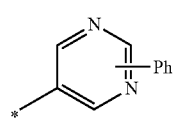
10-223 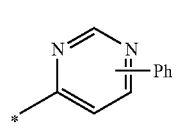
10-224 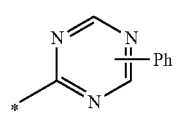
10-225 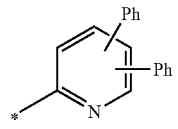
10-226 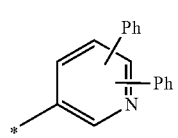
10-227 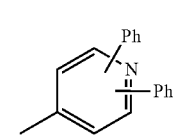
10-228 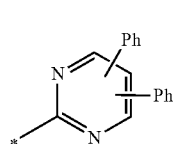
10-229 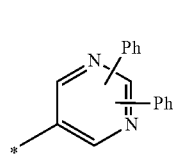
10-230 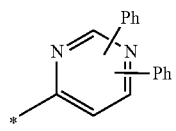
10-231 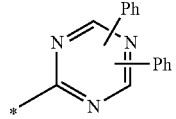
10-232 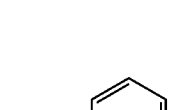
10-233 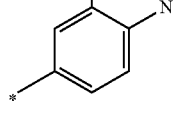
10-234 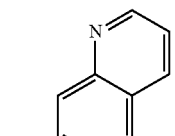
10-235 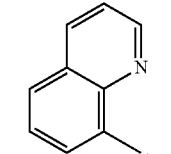
10-236 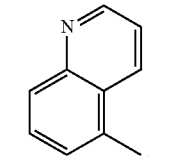
10-237 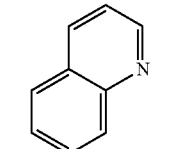
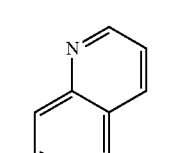

-continued
10-238 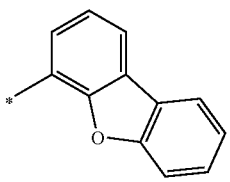
10-239 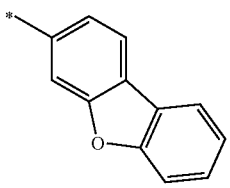
10-240 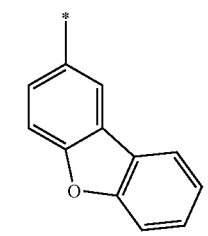
10-241 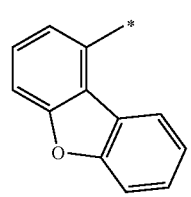
10-242 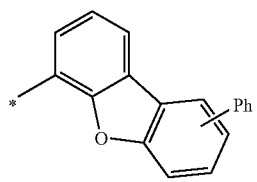
10-243 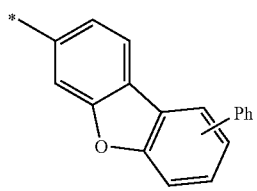
10-244 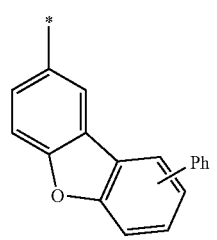
10-245 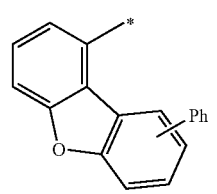
-continued
10-246 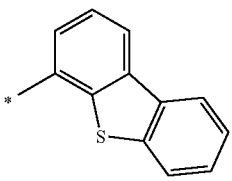
10-247 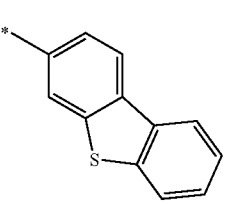
10-248 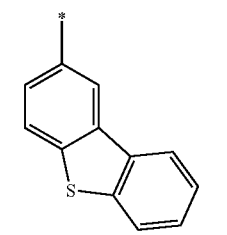
10-249 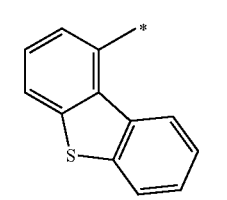
10-250 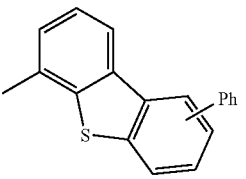
10-251 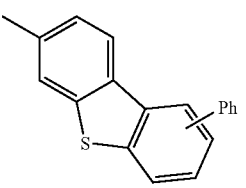
10-252 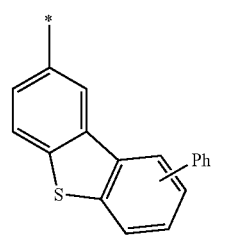
10-253 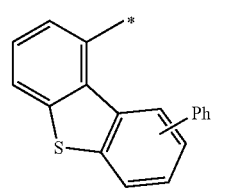

10-254
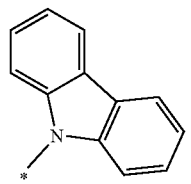
10-255
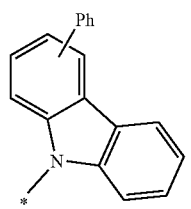
10-256
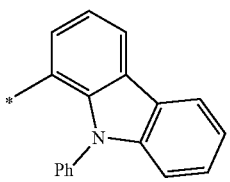
10-257
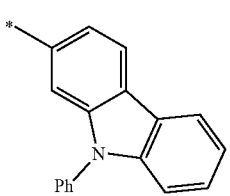
10-258
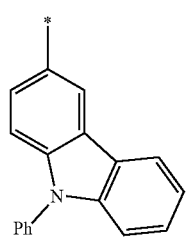
10-259
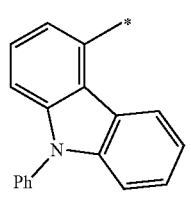
10-260
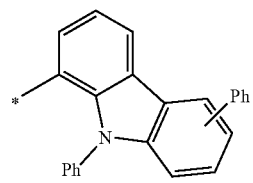
10-261
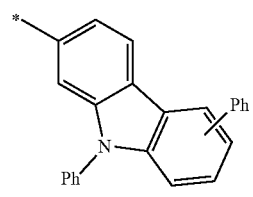
10-262
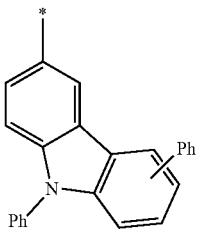
10-263
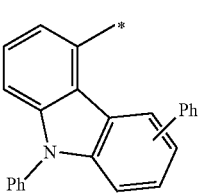
10-264
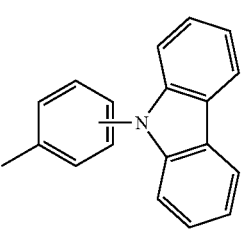
10-265
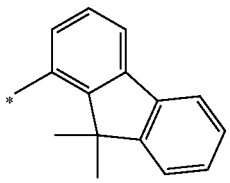
10-266
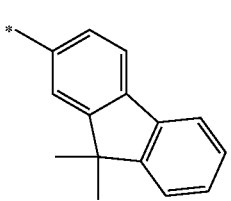
10-267
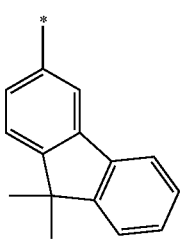
10-268
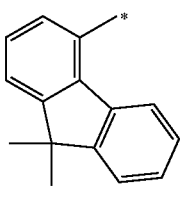

-continued
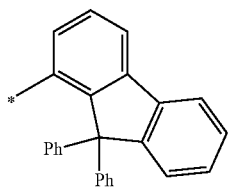
10-269
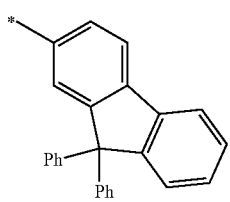
10-270
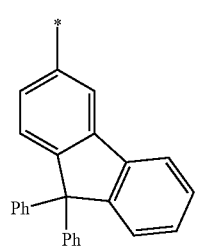
10-271
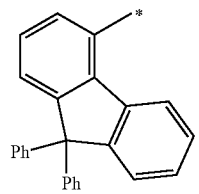
10-272
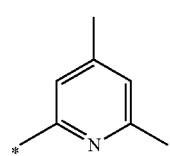
10-273
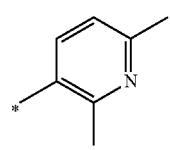
10-274
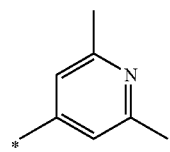
10-275
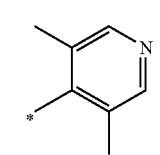
10-276
-continued
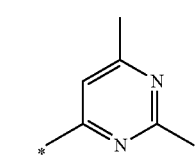
10-277
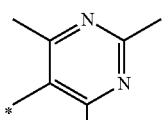
10-278
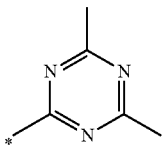
10-279
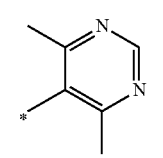
10-280
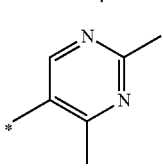
10-281
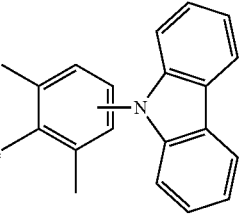
10-282
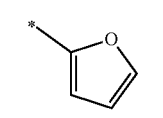
10-283
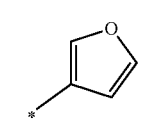
10-284
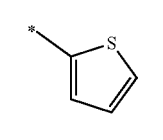
10-285
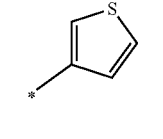
10-286
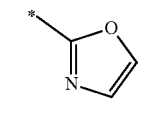
10-287

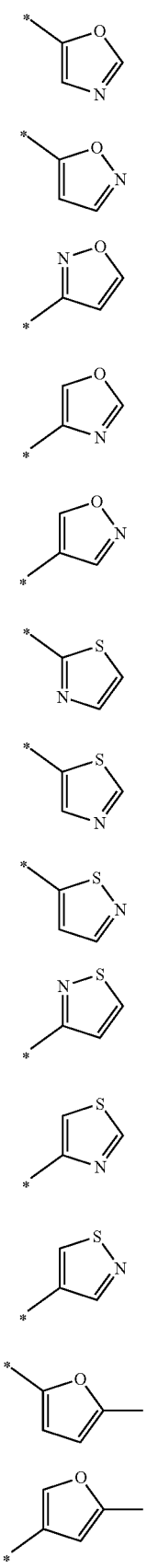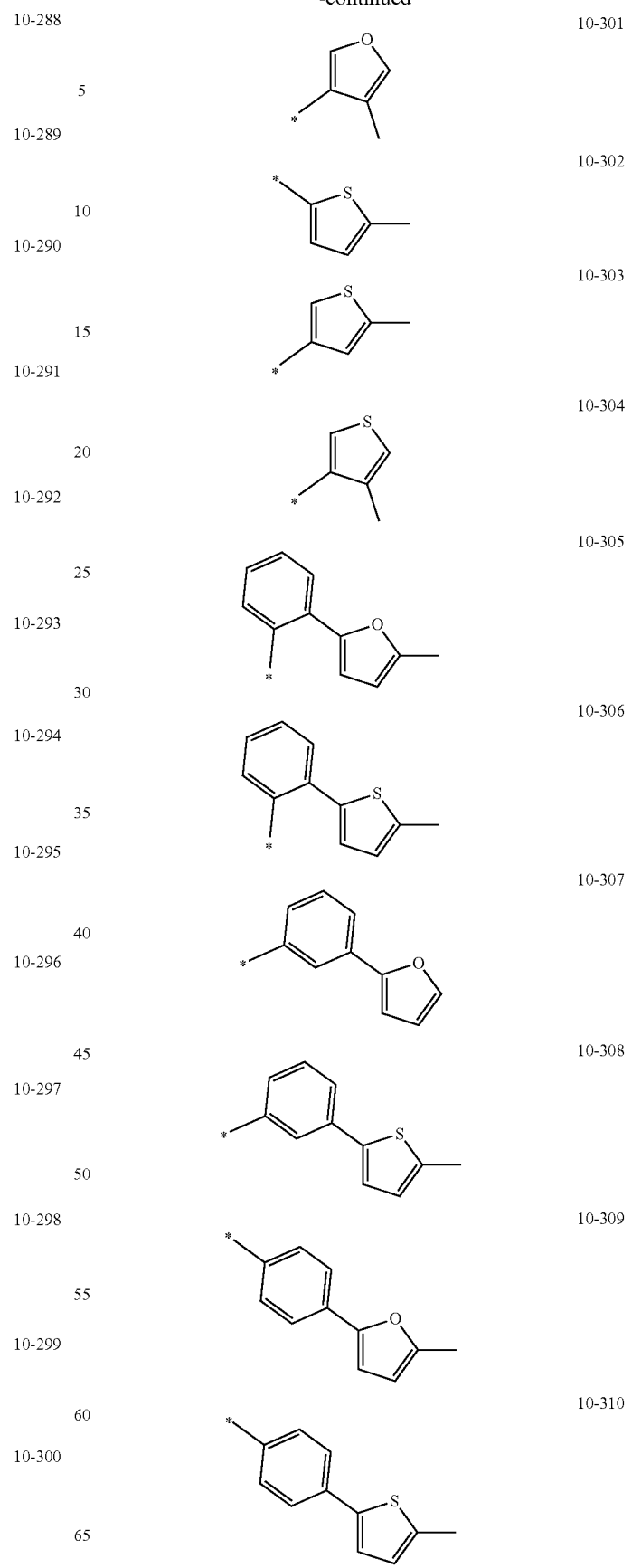

10-311 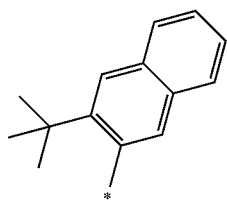
10-312 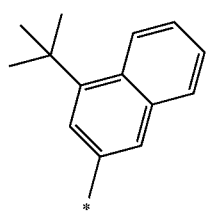
10-313 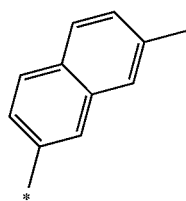
10-314 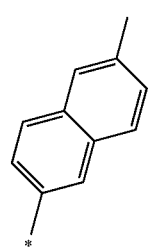
10-315 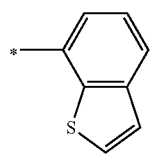
10-316 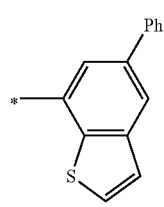
10-317 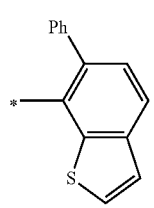
10-318 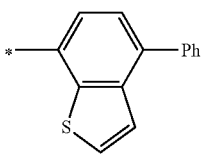
10-319 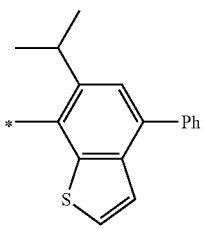
10-320 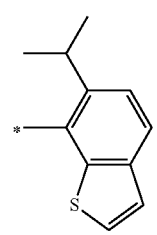
10-321 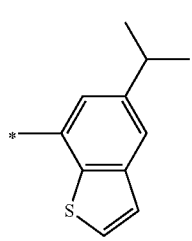
10-322 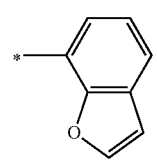
10-323 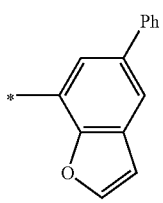
10-324 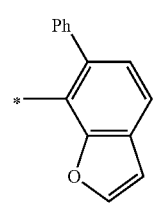
10-325 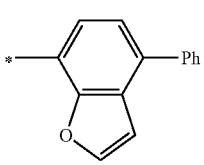

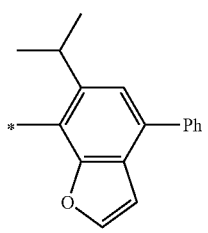
10-326
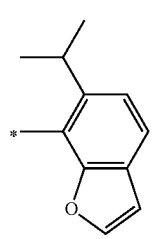
10-327
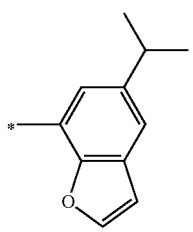
10-328
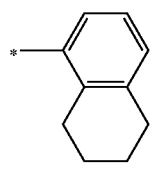
10-329
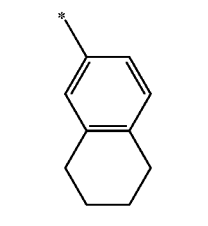
10-330
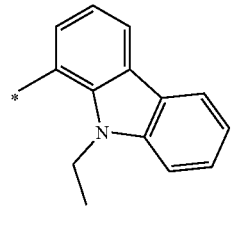
10-331
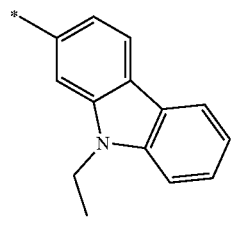
10-332
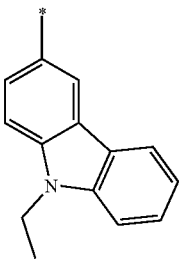
10-333
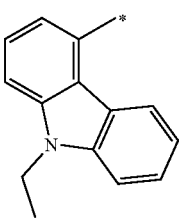
10-334
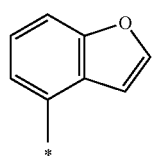
10-335
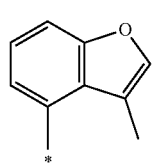
10-336
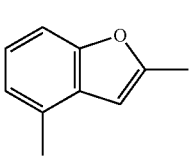
10-337
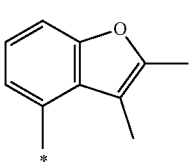
10-338
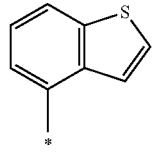
10-339
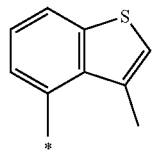
10-340

-continued

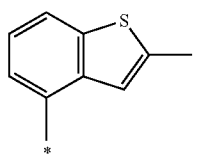
10-341

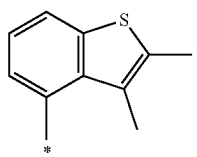
10-342

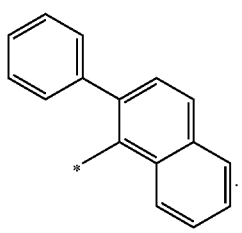
10-343

\* in Formulae 9-1 to 9-39, 9-201 to 9-233, 10-1 to 10-126, and 10-201 to 10-343 indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-233 in which at least one hydrogen is substituted with deuterium" may each be, for example, a group represented by one of Formulae 9-501 to 9-514 and 9-601 to 9-635:

9-501

9-502

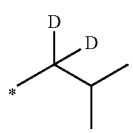
9-503

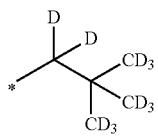
9-504

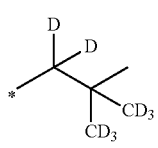
9-505

-continued

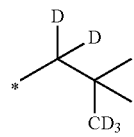
9-506

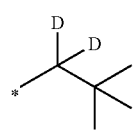
9-507

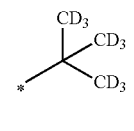
9-508

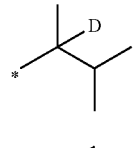
9-509

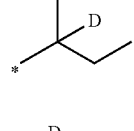
9-510

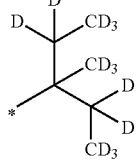
9-511

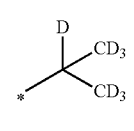
9-512

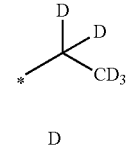
9-513

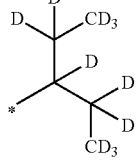
9-514

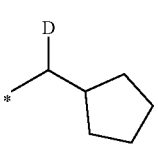
9-601

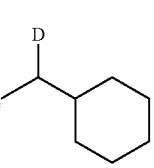
9-602

9-603
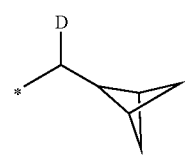
9-604
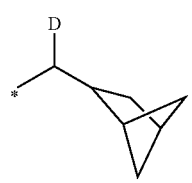
9-605
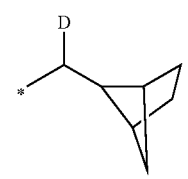
9-606
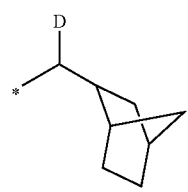
9-607
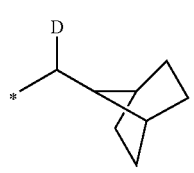
9-608
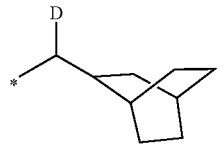
9-609
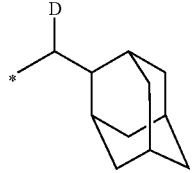
9-610
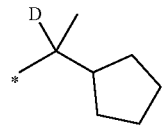
9-611
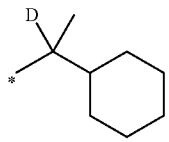
9-612
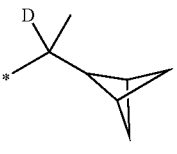
9-613
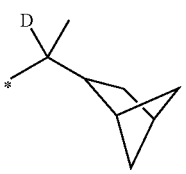
9-614
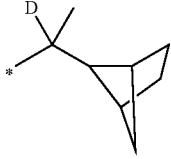
9-615
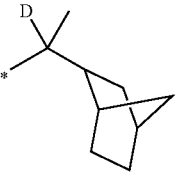
9-616
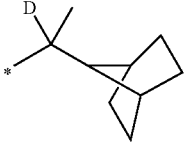
9-617
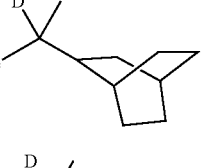
9-618
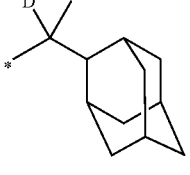
9-619
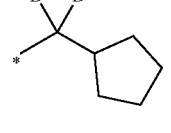
9-620
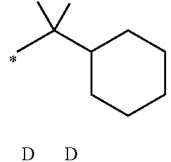
9-621

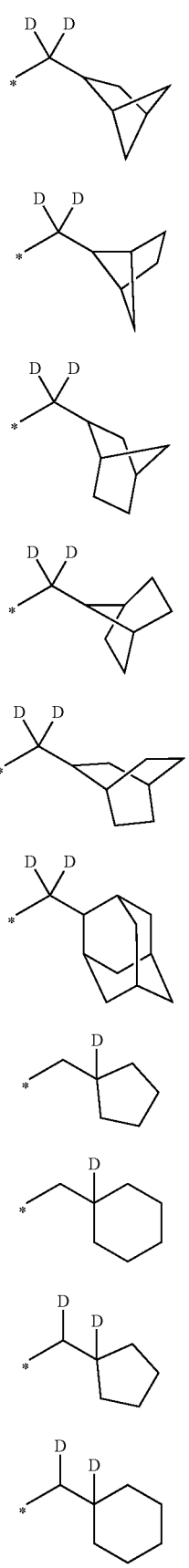
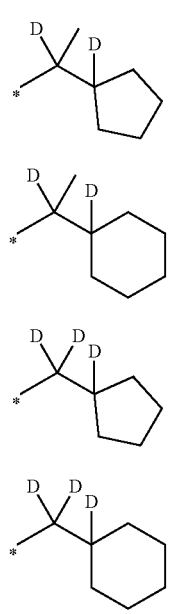
The "group represented by one of Formulae 9-1 to 9-39 in which at least one hydrogen is substituted with —F" and the "group represented by one of Formulae 9-201 to 9-233 in which at least one hydrogen is substituted with —F" may each be, for example, a group represented by one of Formulae 9-701 to 9-710:
9-701
9-702
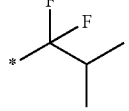
9-703
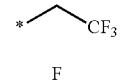
9-704
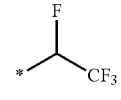
9-705
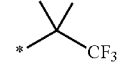
9-706
9-707
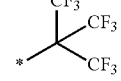
9-708

9-709
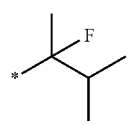
9-710
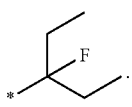.
The "group represented by one of Formulae 10-1 to 10-126 in which at least one hydrogen is substituted with deuterium" and the "group represented by one of Formulae 10-201 to 10-343 in which at least one hydrogen is substituted with deuterium" may each be, for example, a group represented by one of Formulae 10-501 to 10-553:
10-501
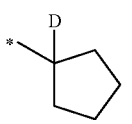
10-502
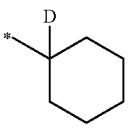
10-503
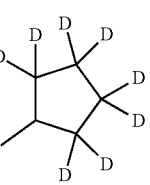
10-504
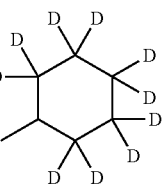
10-505
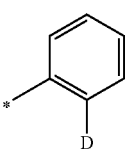
10-506
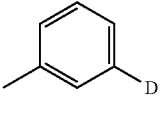
10-507
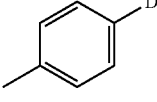
10-508
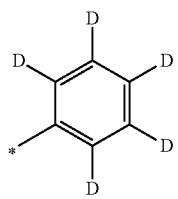
10-509
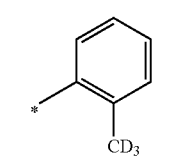
10-510
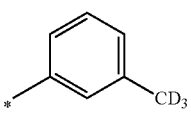
10-511
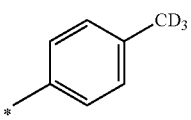
10-512
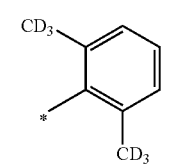
10-513
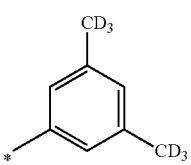
10-514
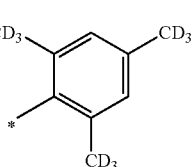
10-515
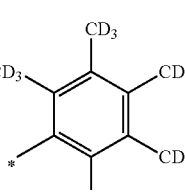
10-516
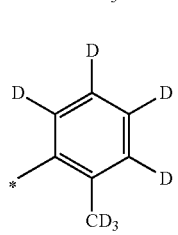

10-517 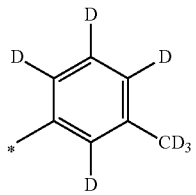
10-518 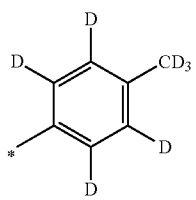
10-519 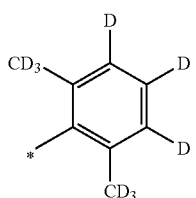
10-520 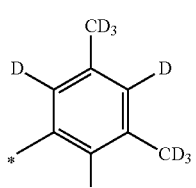
10-521 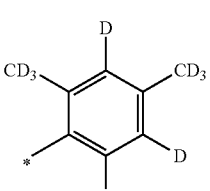
10-522 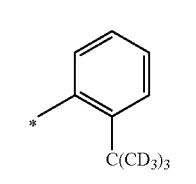
10-523 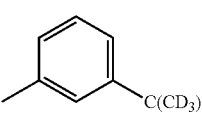
10-524 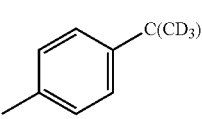
10-525 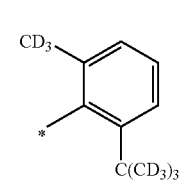
10-526 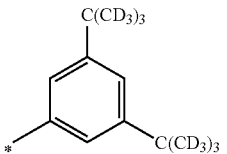
10-527 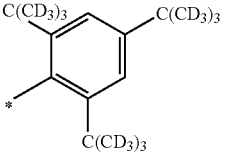
10-528 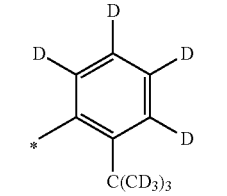
10-529 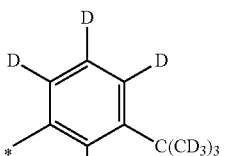
10-530 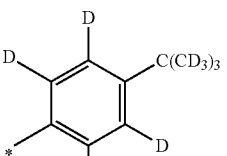
10-531 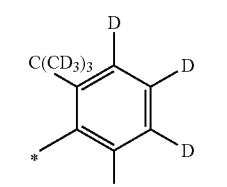
10-532 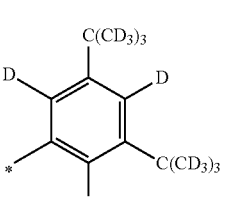
10-533 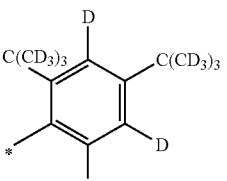

-continued
10-534
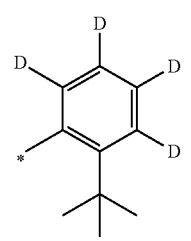
10-535
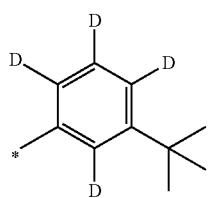
10-536
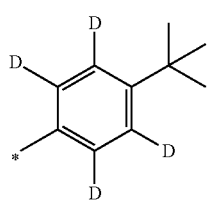
10-537
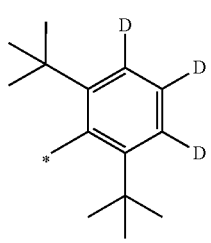
10-538
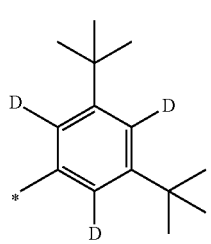
10-540
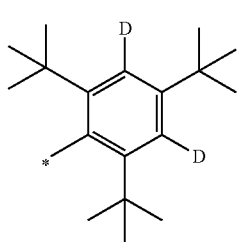
10-541
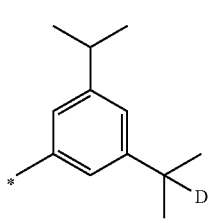
-continued
10-542
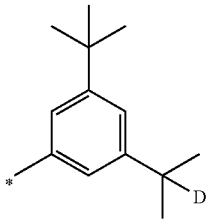
10-543
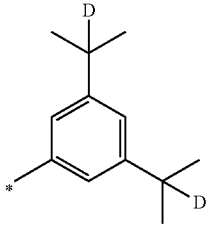
10-544
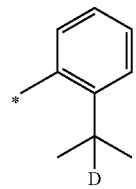
10-545
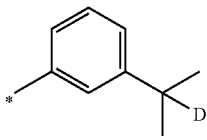
10-546
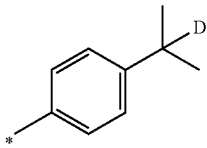
10-547
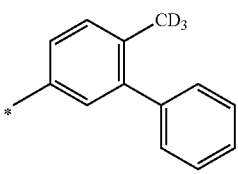
10-548
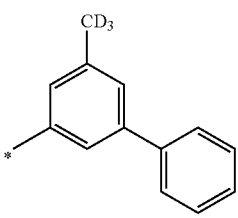
10-549
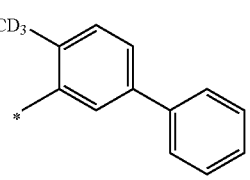

10-550 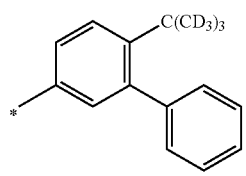
10-551 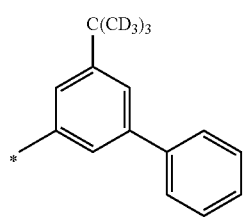
10-552 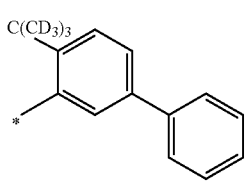
10-553 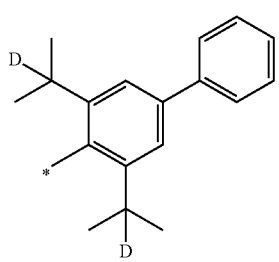
The "group represented by one of Formulae 10-1 to 10-126 in which at least one hydrogen is substituted with —F" and the "group represented by one of Formulae 10-201 to 10-343 in which at least one hydrogen is substituted with —F" may each be, for example, a group represented by one of Formulae 10-601 to 10-615:
10-601 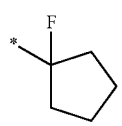
10-602 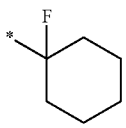
10-603 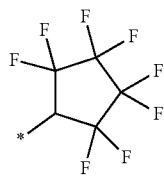
10-604 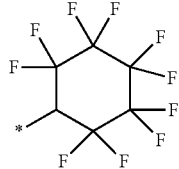
10-605 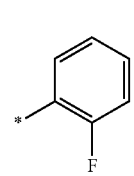
10-606 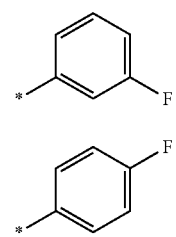
10-607 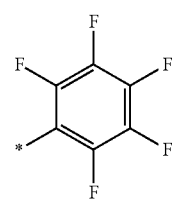
10-608 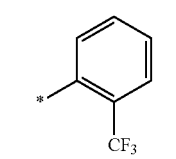
10-609 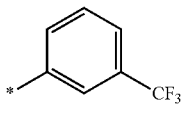
10-610 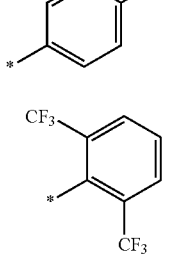
10-611 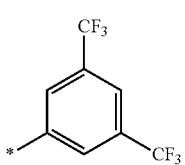
10-612
10-613

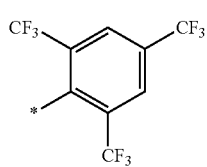

10-614

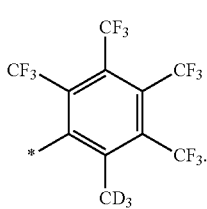

10-615

In one or more embodiments, at least one of $R_4$ to $R_8$ of Formula 1 (for example, one or two of $R_4$ to $R_8$) may include at least one fluoro group (—F).

In one or more embodiments, in Formula 1,
1) $R_4$ may include at least one fluoro group (—F);
2) $R_5$ may include at least one fluoro group (—F);
3) $R_6$ may include at least one fluoro group (—F);
4) $R_7$ may include at least one fluoro group (—F);
5) $R_8$ may include at least one fluoro group (—F);
6) $R_5$ and $R_6$ may each include at least one fluoro group (—F);
7) $R_5$ and $R_7$ may each include at least one fluoro group (—F);
8) $R_5$ and $R_8$ may each include at least one fluoro group (—F);
9) $R_6$ and $R_7$ may each include at least one fluoro group (—F);
10) $R_6$ and $R_8$ may each include at least one fluoro group (—F); or
11) $R_7$ and $R_5$ may each include at least one fluoro group (—F).

In one or more embodiments, regarding Formula 1,
one or two of $R_1$ to $R_8$ may each independently include at least one fluoro group (—F), and
at least one of $R_1$ to $R_8$ i) may not include a fluoro group (—F), and ii) may not be hydrogen.

In one or more embodiments, at least one of $R_1$ and $R_3$ in Formula 1 may not be hydrogen.

In one or more embodiments, $R_{20}$ in Formula 1 may be a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, $R_{20}$ in Formula 1 may be a $C_1$-$C_{20}$ alkyl group, unsubstituted or substituted with deuterium, a $C_1$-$C_{20}$ alkyl group, or any combination thereof.

In one or more embodiments, d2 in Formula 1 may be 2.

In one or more embodiments, $R_{20}$ in Formula 1 may be a $C_1$-$C_{20}$ alkyl group, unsubstituted or substituted with deuterium, a $C_1$-$C_{20}$ alkyl group, or any combination thereof, and d2 may be 2.

In one or more embodiments, the organometallic compound represented by Formula 1 may have at least one deuterium.

In one or more embodiments, at least one of $R_1$ to $R_8$ of Formula 1 may have at least one deuterium.

In one or more embodiments, at least one of $R_{20}$ in number of d2 may have at least one deuterium.

In one or more embodiments, at least one of $R_{20}$ in number of d2 may be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In Formula 1, 1) two or more of $R_1$ to $R_8$ may be optionally linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, 2) two or more of $R_{20}$(s) in the number of d2 may be optionally linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$, and 3) two or more of $R_{13}$ to $R_{19}$ may be optionally linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$. Herein, $R_{1a}$ may be understood by referring to the description of $R_2$.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. The term "$C_5$-$C_{30}$ carbocyclic group (which is unsubstituted or substituted with at least one $R_{1a}$)" may include, for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, cyclopentadiene group, and a fluorene group, each being unsubstituted or substituted with at least one $R_{1a}$.

The term "$C_1$-$C_{30}$ heterocyclic group" as used herein refers to a saturated or unsaturated cyclic group having, as a ring forming atom, at least one heteroatom selected from N, O, Si, P, and S other than 1 to 30 carbon atoms, The $C_1$-$C_{30}$ heterocyclic group may be a monocyclic group or a polycyclic group. The $C_1$-$C_{30}$ heterocyclic group (which is unsubstituted or substituted with at least one $R_{1a}$)" may include, for example, a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, each being unsubstituted or substituted with at least one $R_{1a}$.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group.

The term "$C_1$-$C_{60}$ alkylene group" used herein refers to a divalent group having the same structure as that of the $C_1$-$C_{60}$ alkyl group.

Non-limiting examples of the $C_1$-$C_{60}$ alkyl group, the $C_1$-$C_{20}$ alkyl group, and/or the $C_1$-$C_{10}$ alkyl group are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 may be a branched $C_6$ alkyl group, and may be a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group. Non-limiting examples of the $C_1$-$C_{60}$ alkoxy group, the $C_1$-$C_{20}$ alkoxy group, or the $C_1$-$C_{10}$ alkoxy group are a methoxy group, an ethoxy group, a propoxy group, a butoxy group, and a pentoxy group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as that of the $C_3$-$C_{10}$ cycloalkyl group. Non-limiting examples of the $C_3$-$C_{10}$ cycloalkyl group are a cyclopropyl group, a cyclobutyl group, a cyclopentyl group, a cyclohexyl group, a cycloheptyl group, a cyclooctyl group, an adamantyl group, a bicyclo[1.1.1]pentyl group (bicyclo[1.1.1]pentyl), a bicyclo[2.1.1]hexyl group (bicyclo[2.1.1]hexyl), a bicyclo[2.2.1]heptyl group (bicyclo[2.2.1]heptyl)(a norbornyl group), and a bicyclo[2.2.2]octyl group.

The term "$C_2$-$C_{10}$ heterocycloalkyl group" as used herein refers to a monovalent saturated monocyclic group having at least one heteroatom of N, O, P, Si, Se, Ge, or S as a ring-forming atom and 1 to 10 carbon atoms, and non-limiting examples thereof include a tetrahydrofuranyl group, and a tetrahydrothiophenyl group. The term "$C_2$-$C_{10}$ heterocycloalkylene group" as used herein refers to a divalent group having the same structure as the $C_2$-$C_{10}$ heterocycloalkyl group. Non-limiting examples of the $C_2$-$C_{10}$ heterocycloalkyl group are a silolanyl group, a silinanyl group, a tetrahydrofuranyl group, a tetrahydro-2H-pyranyl group, and a tetrahydrothiophenyl group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as that of the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as that of the $C_2$-$C_{60}$ alkynyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one heteroatom selected from N, O, P, Si, Se, Ge, B, or S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" used herein refers to a $C_6$-$C_{59}$ aryl group substituted with at least one $C_1$-$C_{54}$ alkyl group.

The term "$C_1$-$C_{60}$ heteroaryl group" as used herein refers to a monovalent group having a cyclic aromatic system that has at least one heteroatom selected from N, O, P, Si, Se, Ge, B, or S as a ring-forming atom, and 1 to 60 carbon atoms. The term "$C_1$-$C_{60}$ heteroarylene group" as used herein refers to a divalent group having a cyclic aromatic system that has at least one heteroatom selected from N, O, P, Si, Se, Ge, B, or S as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the rings may be fused to each other.

The term "$C_2$-$C_{60}$ alkylheteroaryl group" used herein refers to a $C_1$-$C_{59}$ heteroaryl group substituted with at least one $C_1$-$C_{59}$ alkyl group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, Se, Ge, B, or S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

A substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, in the present specification, $Q_1$ to $Q_9$, $Q_{11}$ to $Q_{19}$, $Q_{21}$ to $Q_{29}$, and $Q_{31}$ to $Q_{39}$ may each independently be —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

The term "deuterium-containing $C_1$-$C_{60}$ alkyl group (or, deuterium-containing $C_1$-$C_{20}$ alkyl group, a deuterium-containing $C_2$-$C_{20}$ alkyl group, or the like)" as used herein refers to a $C_1$-$C_{60}$ alkyl group substituted with at least one deuterium (or a $C_1$-$C_{20}$ alkyl group substituted with at least one deuterium, a $C_2$-$C_{20}$ alkyl group substituted with at least one deuterium, or the like). For example, the term "the deuterium-containing $C_1$ alkyl group (that is, a deuterium-containing methyl group)" as used herein includes —$CD_3$, —$CD_2H$, and —$CDH_2$.

The term "deuterium-containing $C_3$-$C_{10}$ cycloalkyl group" as used herein refers to a $C_3$-$C_{10}$ cycloalkyl group substituted with at least one deuterium. Examples of the "deuterium-containing $C_3$-$C_{10}$ cycloalkyl group" are provided in connection with, for example, Formula 10-501.

The terms "fluorinated $C_1$-$C_{60}$ alkyl group (or a fluorinated $C_1$-$C_{20}$ alkyl group, or the like)", "fluorinated $C_3$-$C_{10}$ cycloalkyl group", or "fluorinated $C_2$-$C_{10}$ heterocycloalkyl group" as used herein refer to a $C_1$-$C_{60}$ alkyl group (or, $C_1$-$C_{20}$ alkyl group, or the like) substituted with at least one a fluoro group (—F), a $C_3$-$C_{10}$ cycloalkyl group substituted with at least one a fluoro group (—F), and a $C_2$-$C_{10}$ heterocycloalkyl group substituted with at least one a fluoro group (—F), respectively. For example, the term "the fluorinated $C_1$ alkyl group (that is, the fluorinated methyl group)" includes —$CF_3$, —$CF_2H$, and —$CFH_2$. The "fluorinated $C_1$-$C_{60}$ alkyl group (or the fluorinated $C_1$-$C_{20}$ alkyl group, or the like)", "the fluorinated $C_3$-$C_{10}$ cycloalkyl group", or "the fluorinated $C_2$-$C_{10}$ heterocycloalkyl group" may be i) a fully fluorinated $C_1$-$C_{60}$ alkyl group (or, fully fluorinated $C_1$-$C_{20}$ alkyl group, or the like), a fully fluorinated $C_3$-$C_{10}$ cycloalkyl group, or a fully fluorinated $C_2$-$C_{10}$ heterocycloalkyl group, each group in which all hydrogen are substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, or a partially fluorinated $C_2$-$C_{10}$ heterocycloalkyl group, each group in which some hydrogen are substituted with a fluoro group.

The term "($C_1$-$C_{20}$ alkyl)'X' group" as used herein refers to a 'X' group substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group and the term "($C_1$-$C_{20}$ alkyl)phenyl group" as used herein refers to a phenyl group substituted with at least one $C_1$-$C_{20}$ alkyl group. An example of a ($C_1$ alkyl)phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" respectively refer to a heterocyclic group having the same backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, and a dibenzothiophene 5,5-dioxide group" in which at least one of the carbon atoms constituting the cyclic groups is substituted with a nitrogen.

In one or more embodiments, a group represented by

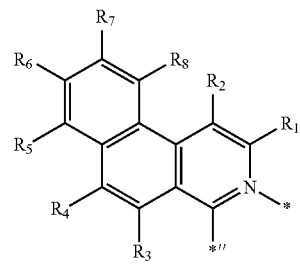

in Formula 1 may be a group represented by one of Formulae CY1 to CY88:

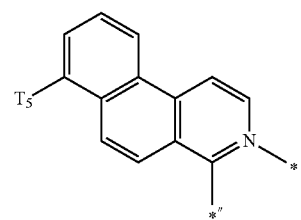

CY1

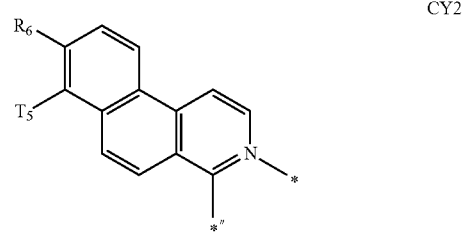

CY2

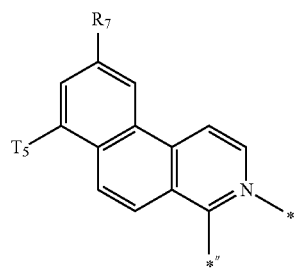
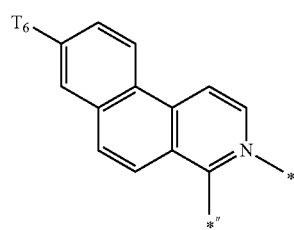

CY15
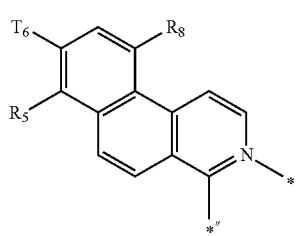
CY16
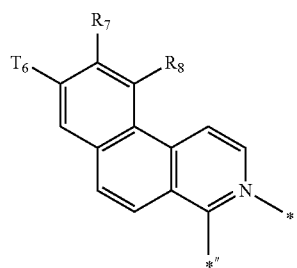
CY17
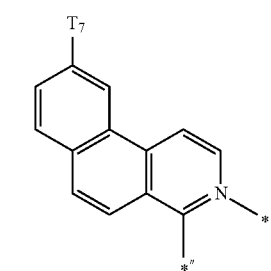
CY18
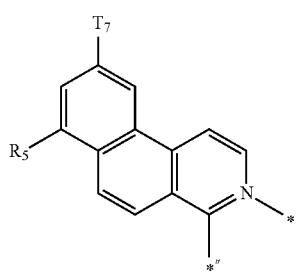
CY19
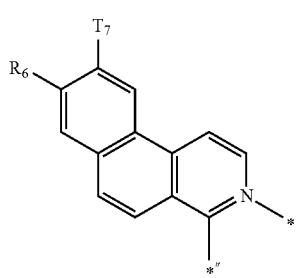
CY20
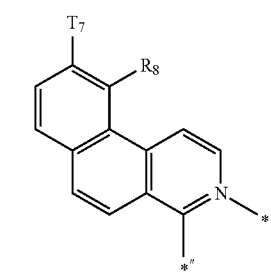
CY21
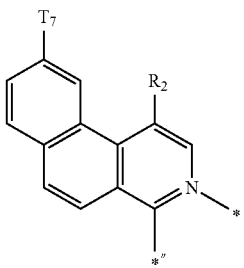
CY22
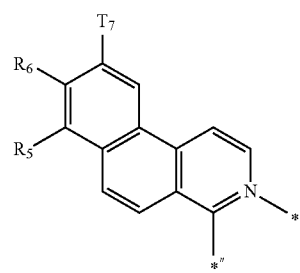
CY23
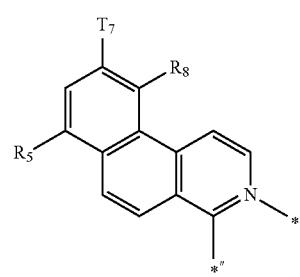
CY24
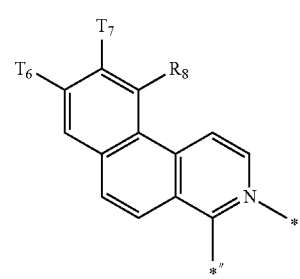
CY25
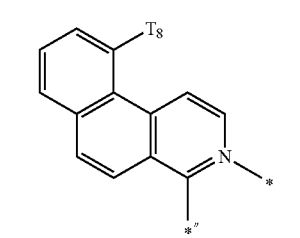
CY26
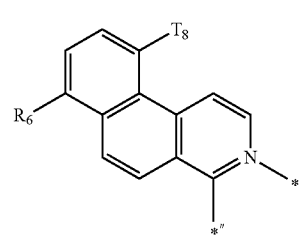

-continued
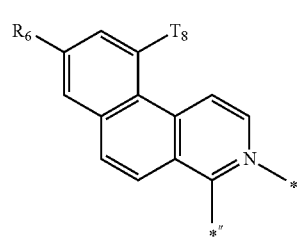
CY27
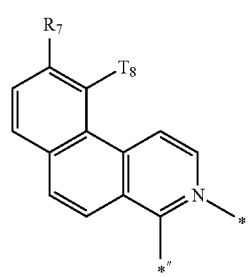
CY28
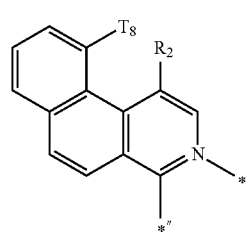
CY29
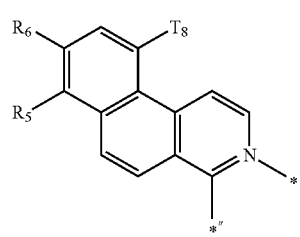
CY30
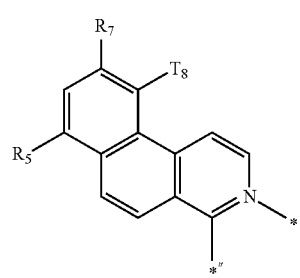
CY31
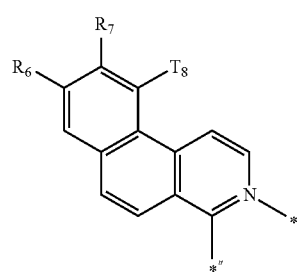
CY32
-continued
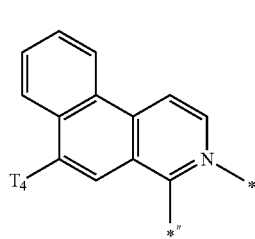
CY33
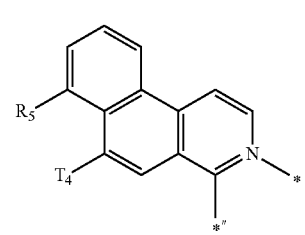
CY34
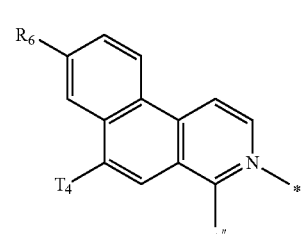
CY35
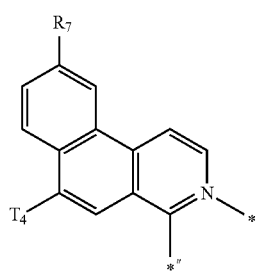
CY36
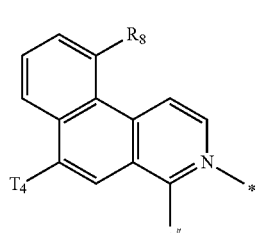
CY37
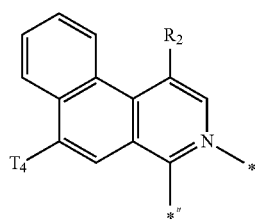
CY38

-continued
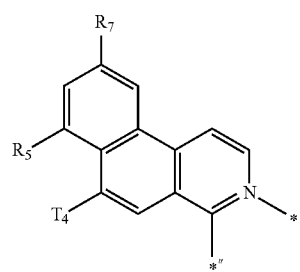
CY39
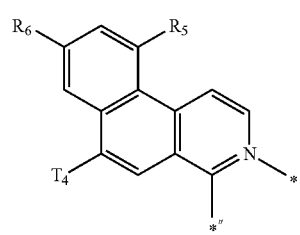
CY40
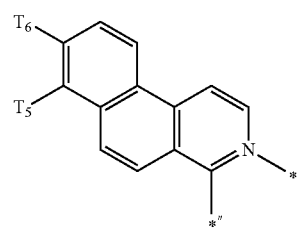
CY41
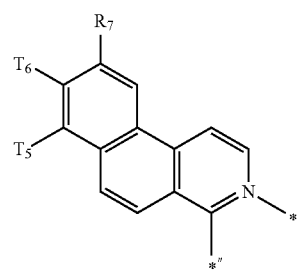
CY42
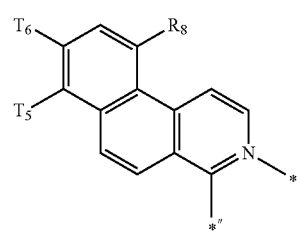
CY43
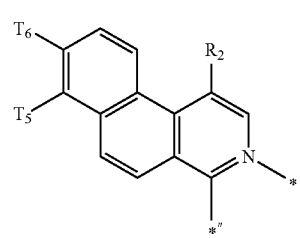
CY44
-continued
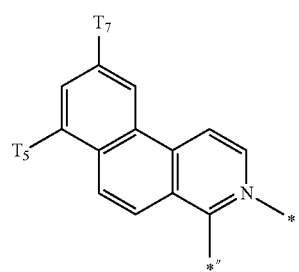
CY45
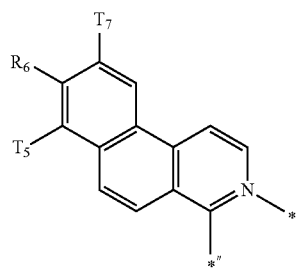
CY46
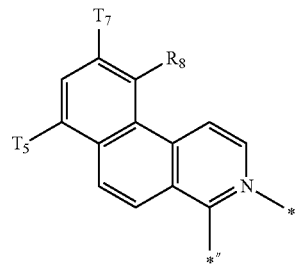
CY47
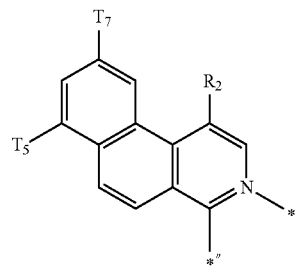
CY48
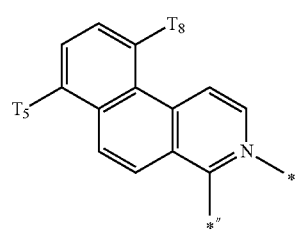
CY49
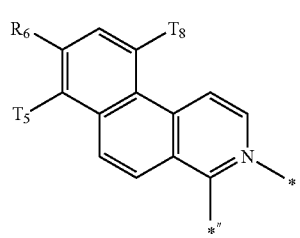
CY50

CY51 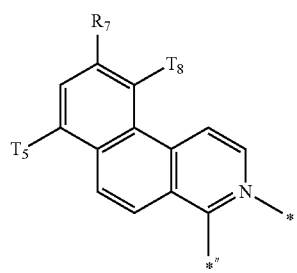
CY52 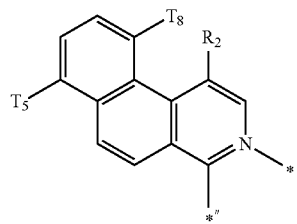
CY53 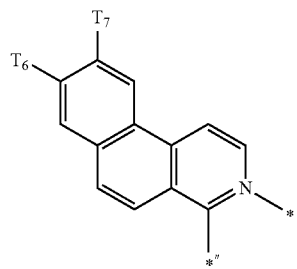
CY54 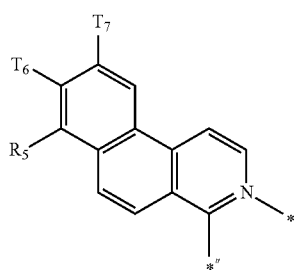
CY55 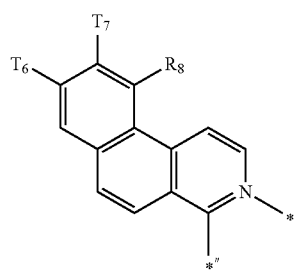
CY56 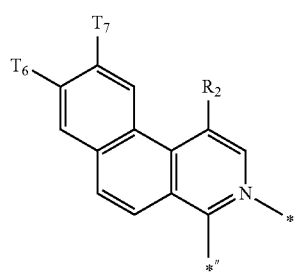
CY57 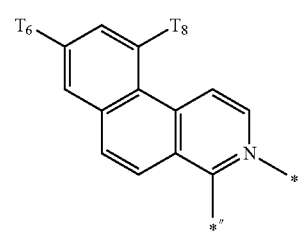
CY58 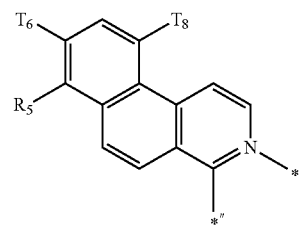
CY59 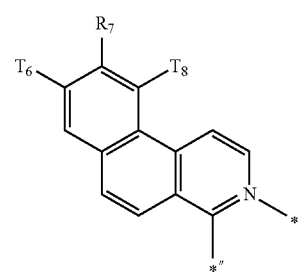
CY60 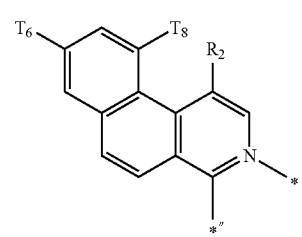
CY61 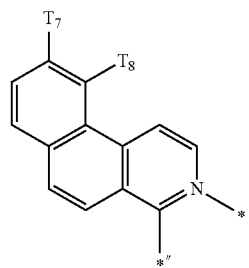
CY62 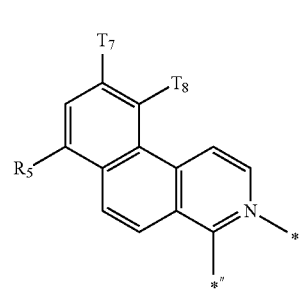

CY63
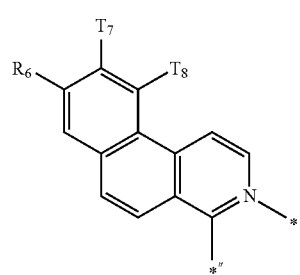
CY64
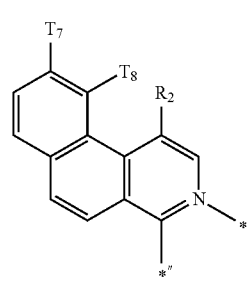
CY65
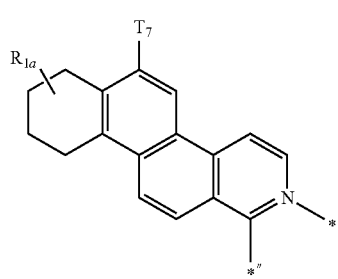
CY66
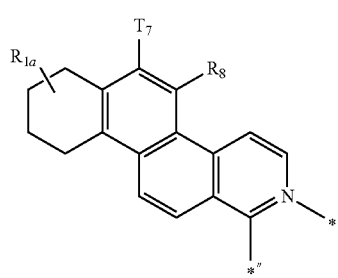
CY67
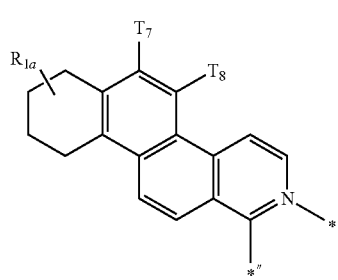
CY68
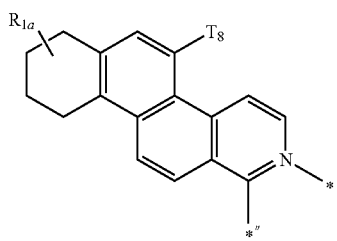
CY69
CY70
CY71
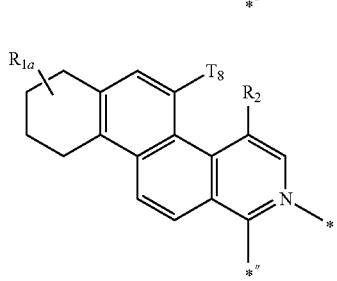
CY72

CY73 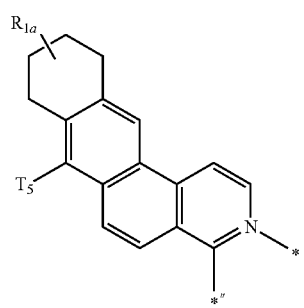
CY74 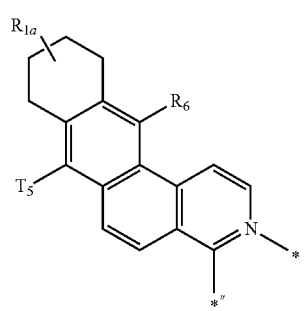
CY75 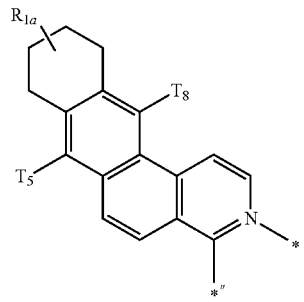
CY76 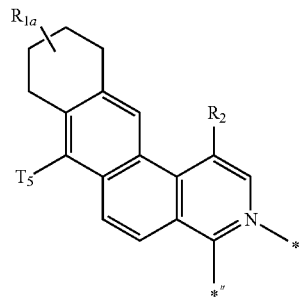
CY77 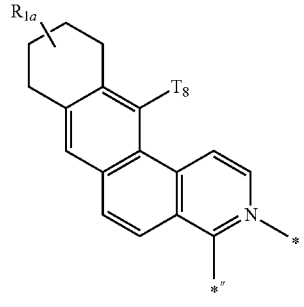
CY78 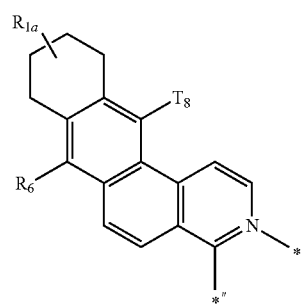
CY79 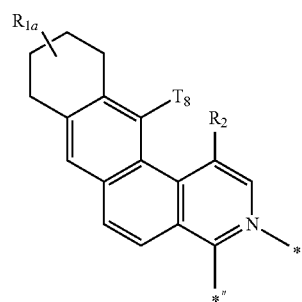
CY80 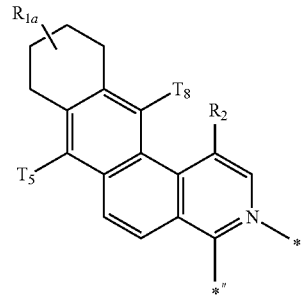
CY81 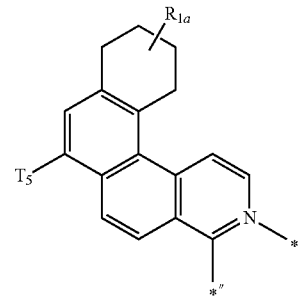
CY82 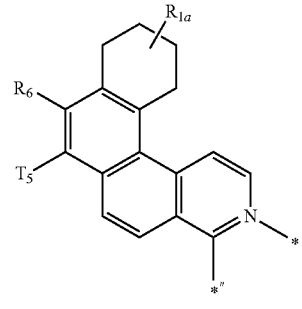

CY83 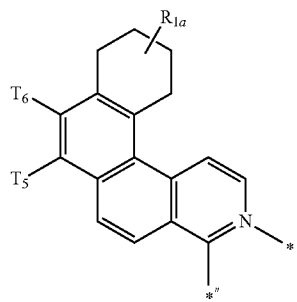

CY84 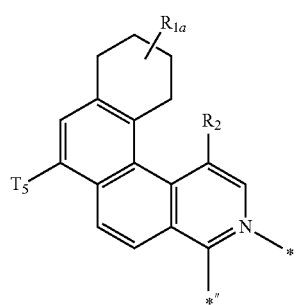

CY85 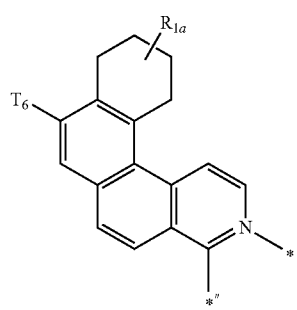

CY86 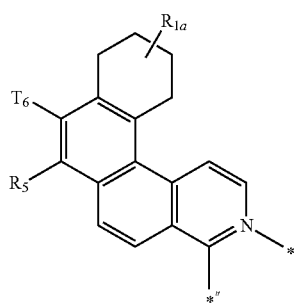

CY87 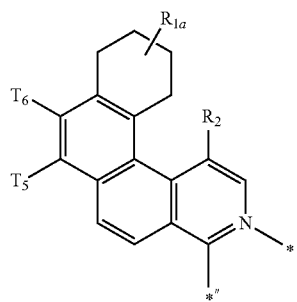

CY88 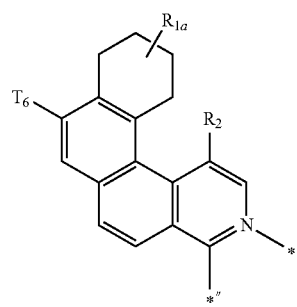

In Formulae CY1 to CY88, $T_4$ to $T_8$ may each independently be:

a fluoro group (—F); or a fluorinated $C_1$-$C_{20}$ alkyl group, a fluorinated $C_3$-$C_{10}$ cycloalkyl group, or a fluorinated $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof;

each of $R_2$, $R_4$ to $R_8$ and $R_{1a}$ are the same as described above, and $R_2$ and $R_4$ to $R_8$ may not be hydrogen,

* indicates a binding site to Ir in Formula 1,

*″ indicates a binding site to a neighboring atom in Formula 1.

For example, $R_2$, and $R_4$ to $R_8$ in Formulae CY1 to CY88 may each independently be:

deuterium; or a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, the group represented by

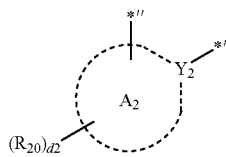

in Formula 1 may be a group represented by one of Formulae A(1) to A(7):

A(1)

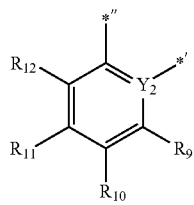

A(2) 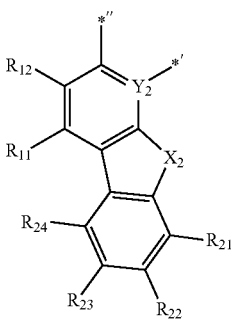

A(3) 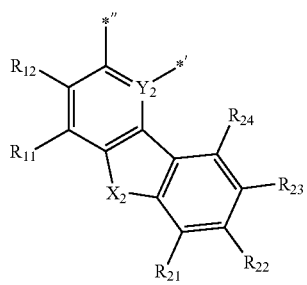

A(4) 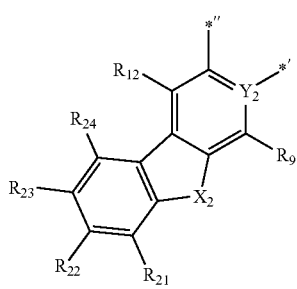

A(5) 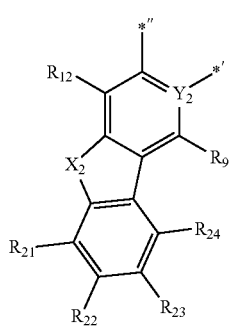

A(6) 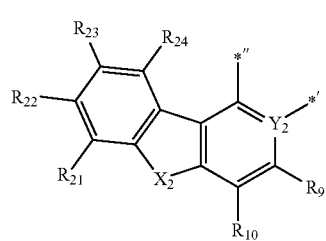

A(7) 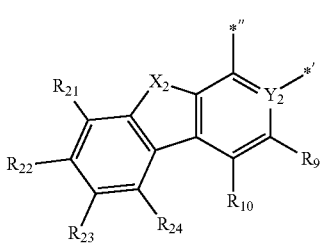

In Formulae A(1) to A(7), $Y_2$ is C, $X_2$ is O, S, $N(R_{25})$, $C(R_{25})(R_{26})$, or $Si(R_{25})(R_{26})$, each of $R_9$ to $R_{12}$ and $R_{21}$ to $R_{26}$ are the same as described in connection with $R_{20}$,

*' indicates a binding site to Ir in Formula 1, and

*" indicates a binding site to a neighboring atom in Formula 1.

For example, $R_9$ and $R_{11}$ in Formula A(1) may each independently be a $C_1$-$C_{20}$ alkyl group, a $C_3$-$C_{10}$ cycloalkyl group, or a $C_2$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

In one or more embodiments, $R_9$ and $R_1$, in Formula A(1) may each independently be a $C_1$-$C_{20}$ alkyl group, unsubstituted or substituted with deuterium, a $C_1$-$C_{20}$ alkyl group, or any combination thereof.

In one or more embodiments, $R_{10}$ and $R_{12}$ in Formula A(1) may each independently be hydrogen or deuterium.

In one or more embodiments, $R_9$ and $R_{11}$ in Formula A(1) may be identical to each other.

In one or more embodiments, $R_9$ and $R_{11}$ in Formula A(1) may be different from each other.

In one or more embodiments, $R_9$ and $R_{11}$ in Formula A(1) may be different from each other, and the number of carbons included in $R_{11}$ may be greater than the number of carbons included in $R_9$.

In one or more embodiments, i) at least one of $R_9$ to $R_{12}$ in Formula A(1), ii) $R_{11}$, $R_{12}$, one of $R_{21}$ to $R_{26}$, or any combination thereof in Formulae A(2) and A(3), iii) $R_9$, $R_{12}$, one of $R_{21}$ to $R_{26}$, or any combination thereof in Formulae A(4) and A(5), and iv) $R_9$, $R_{10}$, one of $R_{21}$ to $R_{26}$, or any combination thereof in Formulae A(6) and A(7), may each independently be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In one or more embodiments, at least one of $R_9$ and $R_{11}$ in Formula A(1) (for example, $R_9$ and $R_{11}$ in Formula A(1)) may each independently be a deuterium-containing $C_1$-$C_{20}$ alkyl group, a deuterium-containing $C_3$-$C_{10}$ cycloalkyl group, or a deuterium-containing $C_2$-$C_{10}$ heterocycloalkyl group, each unsubstituted or substituted with a $C_1$-$C_{20}$ alkyl group, a $C_3$-$C_{10}$ cycloalkyl group, a $C_2$-$C_{10}$ heterocycloalkyl group, or any combination thereof.

In one or more embodiments, the group represented by

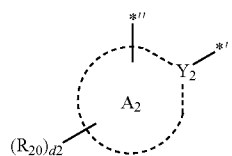

in Formula 1 may be a group represented by Formula A(1) or A(5).

In one or more embodiments, $R_{14}$ and $R_{16}$ in Formula 1 may not be hydrogen.

For example, $R_{13}$, $R_{14}$, $R_{16}$, and $R_{17}$ in Formula 1 may not be hydrogen.

In one or more embodiments, each of $R_{13}$, $R_{14}$, $R_{16}$ and $R_{17}$ in Formula 1 may include at least one carbon.

In one or more embodiments, in Formula 1, i) $R_{13}$ and $R_{17}$ may each independently be hydrogen or deuterium, and $R_{14}$ and $R_{16}$ may each independently be a $C_1$-$C_{20}$ alkyl group, unsubstituted or substituted with at least one deuterium.

In one or more embodiments, in Formula 1, i) $R_{13}$ and $R_{17}$ may each independently be hydrogen or deuterium, and $R_{14}$ and $R_{16}$ may each independently a $C_2$-$C_{20}$ alkyl group, unsubstituted or substituted with at least one deuterium.

In one or more embodiments, $R_{13}$, $R_{14}$, $R_{16}$ and $R_{17}$ in Formula 1 may each independently be a $C_1$-$C_{20}$ alkyl group, unsubstituted or substituted with at least one deuterium.

In one or more embodiments, $R_{13}$, $R_{14}$, $R_{16}$ and $R_{17}$ in Formula 1 may each independently a $C_2$-$C_{20}$ alkyl group, unsubstituted or substituted with at least one deuterium.

In one or more embodiments, the number of carbons included in the group represented by *—C($R_{13}$)($R_{14}$)($R_{19}$) in Formula 1 may be 5 or more, and/or the number of carbons included in the group represented by *—C($R_{16}$)($R_{17}$)($R_{18}$) in Formula 1 may be 5 or more.

In one or more embodiments, $R_{13}$, $R_{14}$, and $R_{19}$ of the group represented by *—C($R_{13}$)($R_{14}$)($R_{19}$) in Formula 1 may be linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$. That is, the group represented by *—C($R_{13}$)($R_{14}$)($R_{19}$) in Formula 1 may be a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, or a cyclohexene group, each unsubstituted or substituted with at least one $R_{1a}$).

In one or more embodiments, $R_{16}$, $R_{17}$ and $R_{18}$ of the group represented by *—C($R_{16}$)($R_{17}$)($R_{18}$) in Formula 1 may be linked to each other to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$. That is, the group represented by *—C($R_{16}$)($R_{17}$)($R_{18}$) in Formula 1 may be a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$ (for example, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, or a cyclohexene group, each unsubstituted or substituted with at least one $R_{1a}$).

For example, the organometallic compound may be at least one of Compounds 1 to 38 below, but embodiments of the present disclosure are not limited thereto.

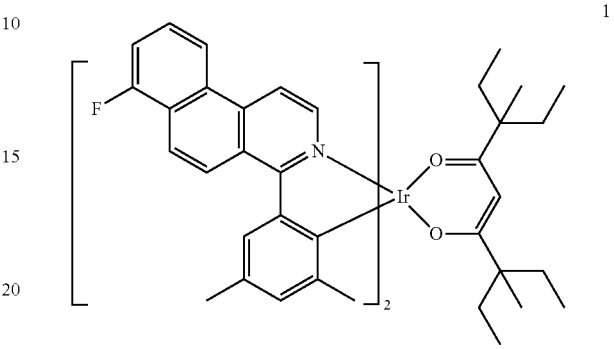

1

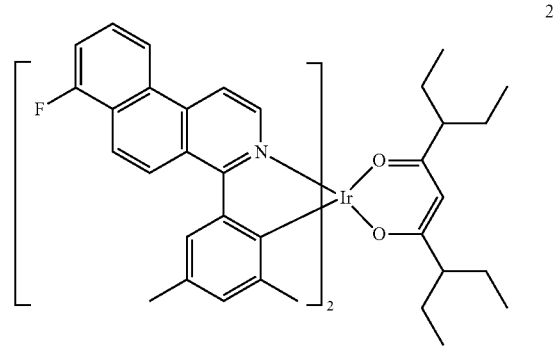

2

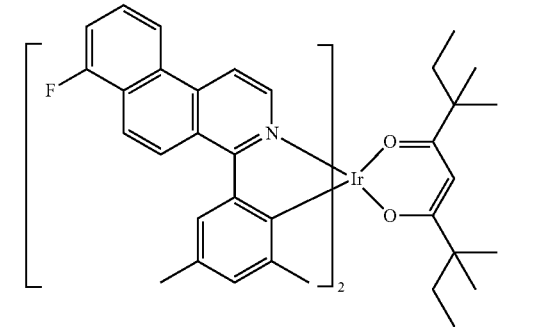

3

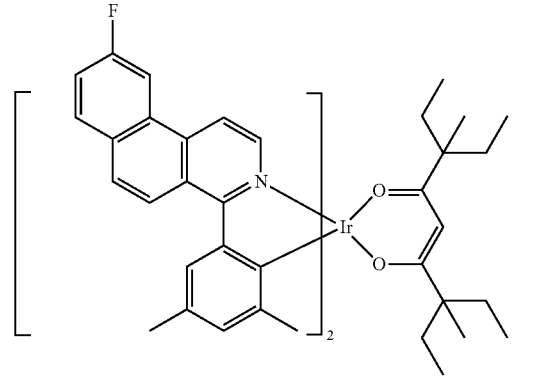

4

5
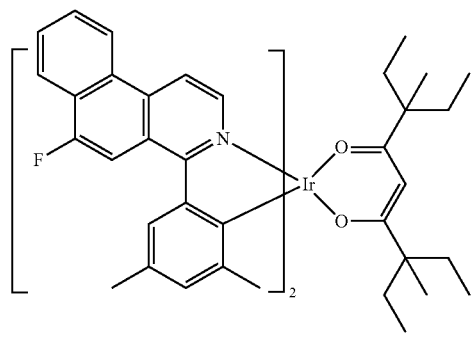
6
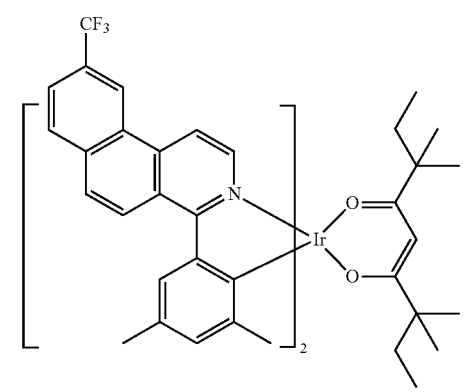
7
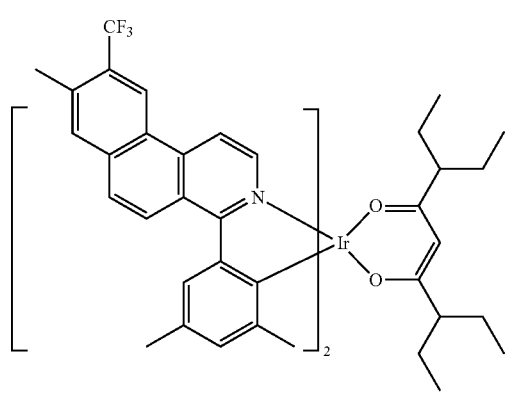
8
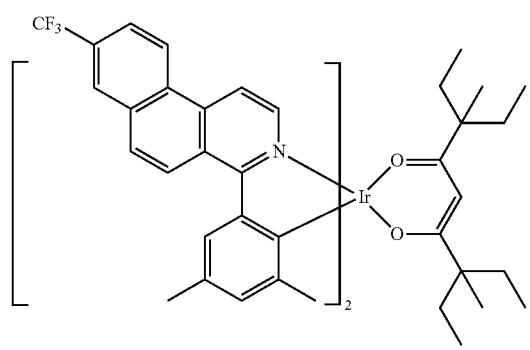
9
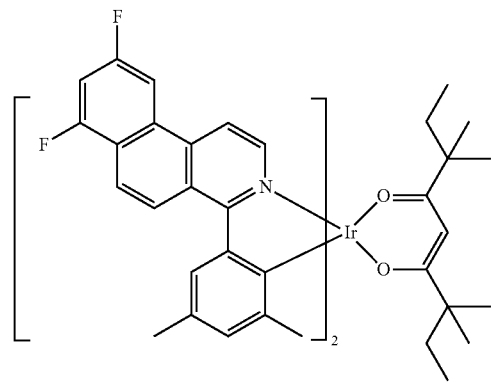
10
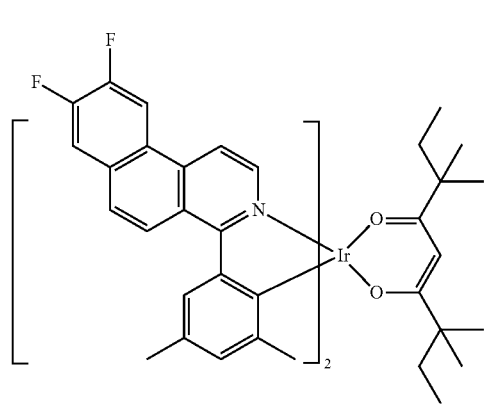
11
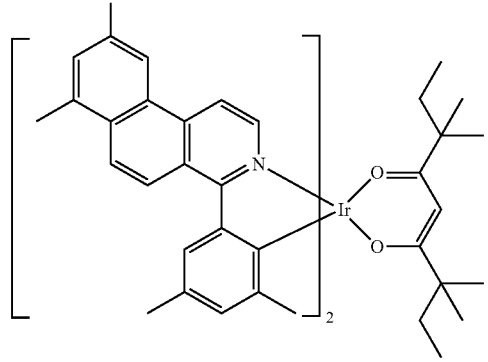
12
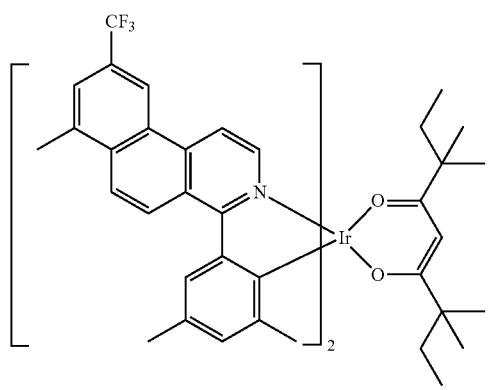

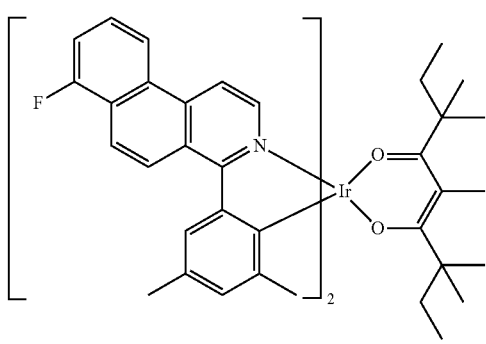
13
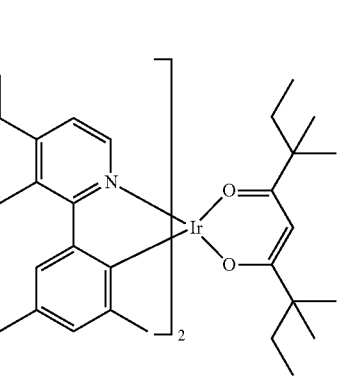
17
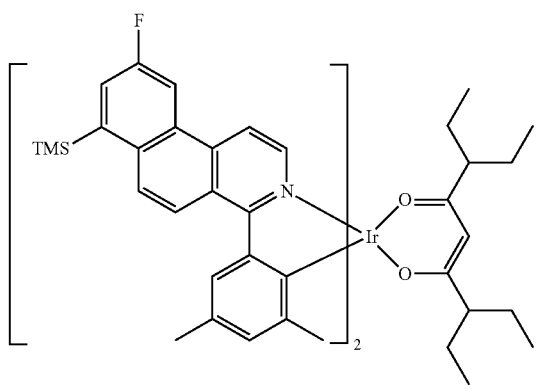
14
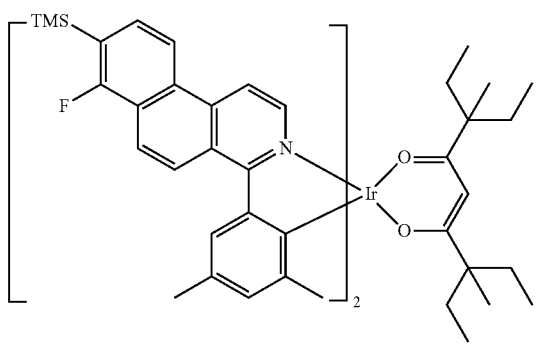
18
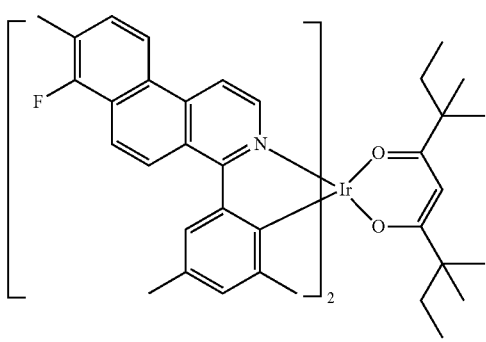
15
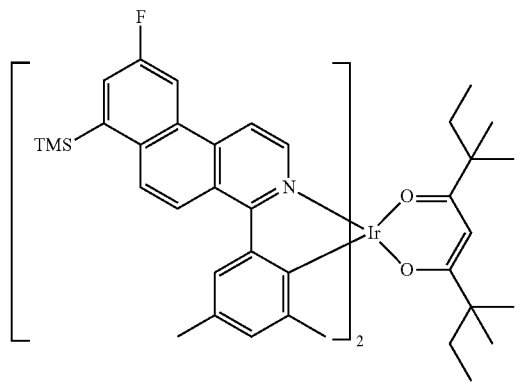
19
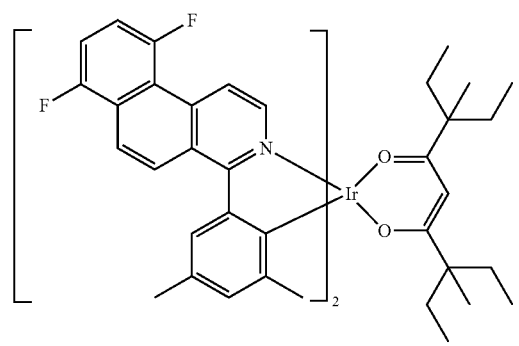
16
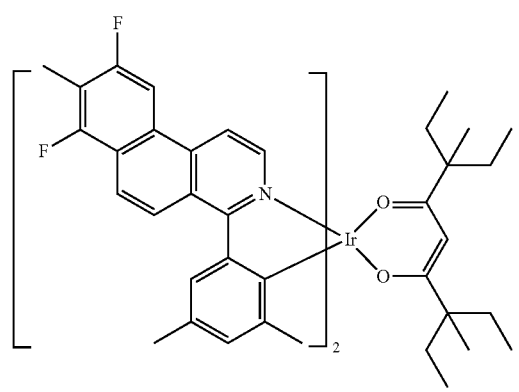
20

21
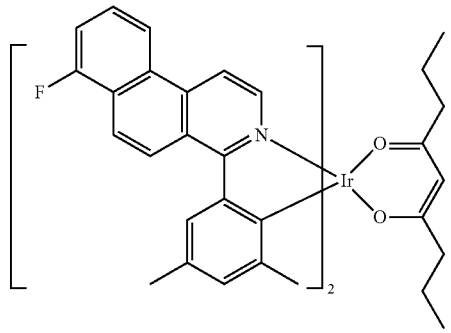
22
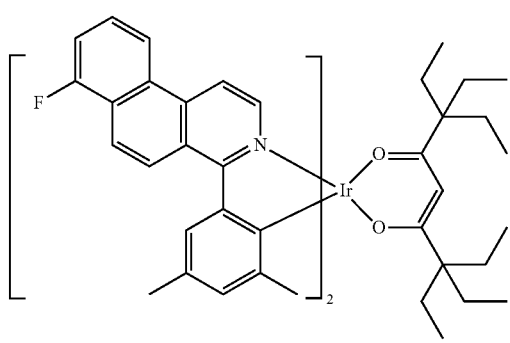
23
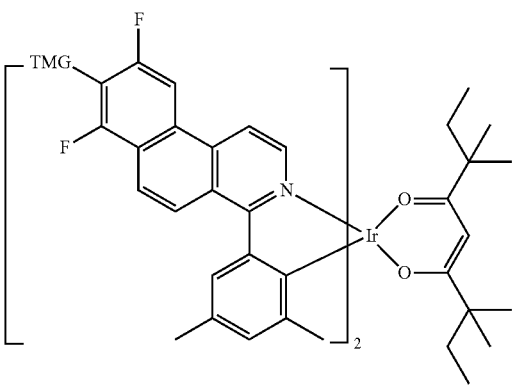
24
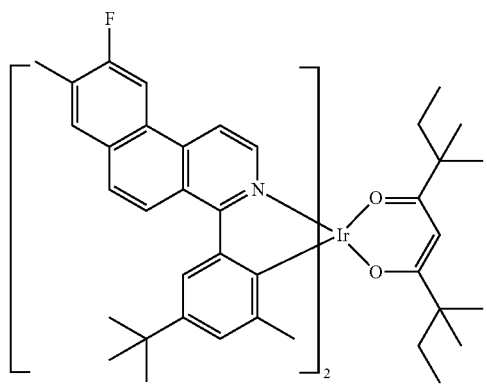
25
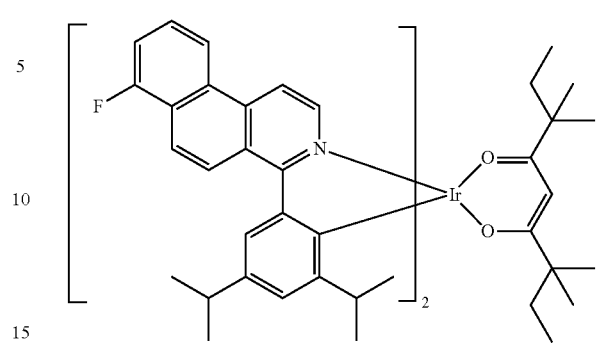
26
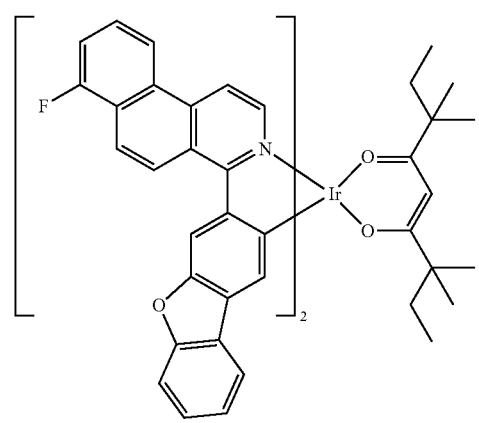
27
28
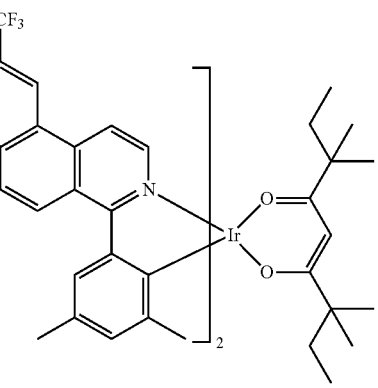

-continued
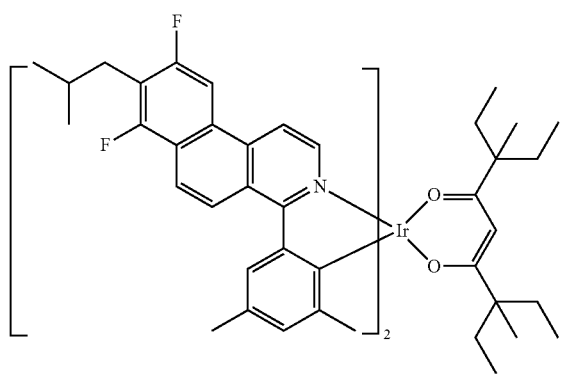
29
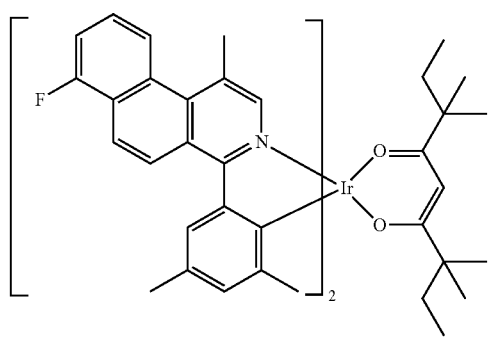
30
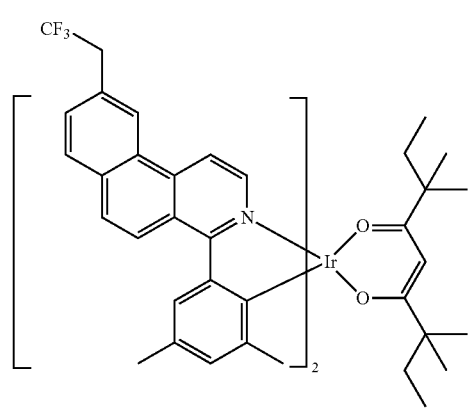
31
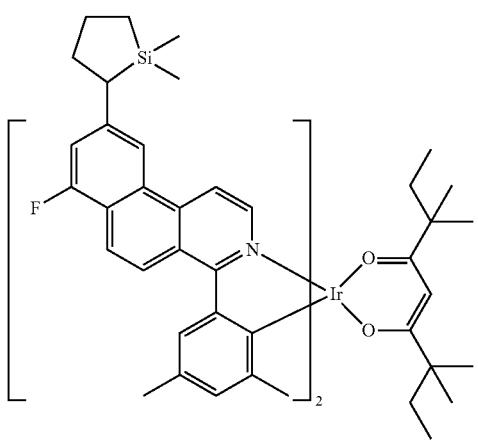
32
-continued
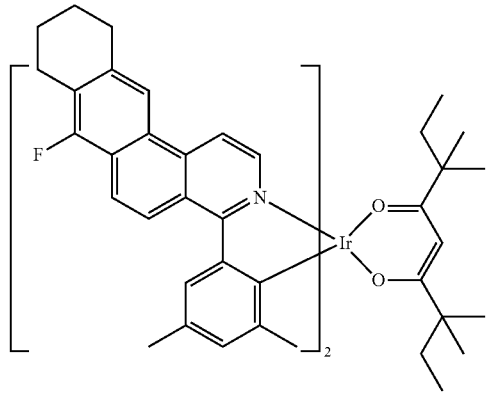
33
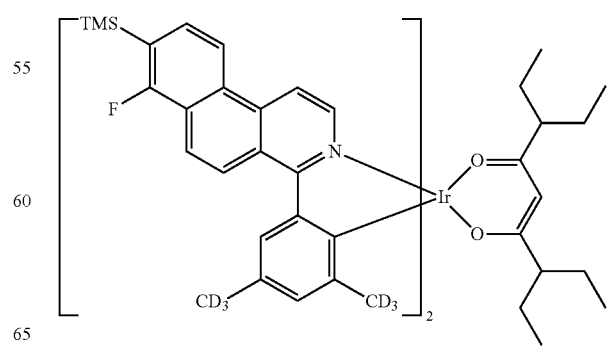
34
35

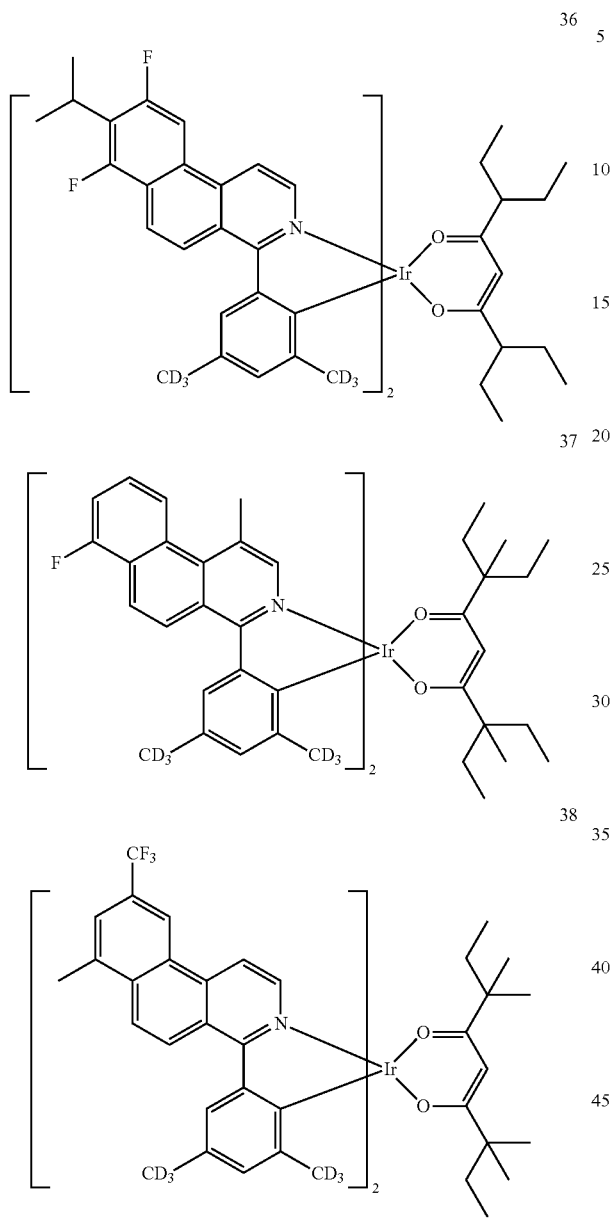

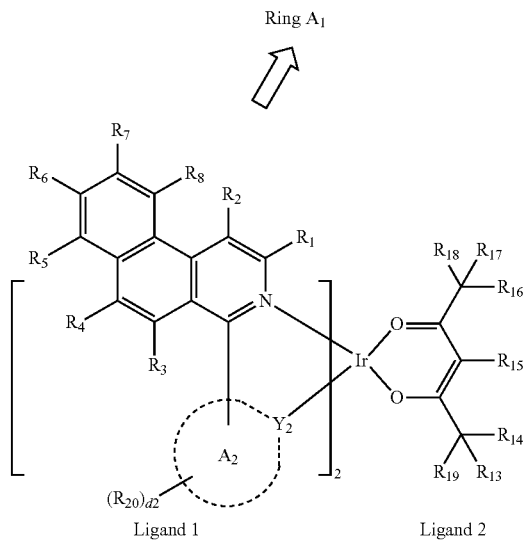

Ligand 1   Ligand 2

Formula 1'

TMS in Compound 1 to 38 is a trimethylsilyl group, and TMG is a trimethylgermyl group.

In an organometallic compound represented by Formula 1, 1) ring $A_1$ (see Formula 1') is, as illustrated in Formula 1, a condensed cyclic group in which two benzene groups are condensed with one pyridine group, and 2) at least one of $R_1$ to $R_8$ includes at least one a fluoro group (—F). Accordingly, the transition dipole moment of the organometallic compounds may be increased, and the conjugation length of the organometallic compounds is relatively increased and structural rigidity thereof is increased, leading to a decrease in non-radiative transition. Thus, an electronic device, for example, an organic light-emitting device, including the organometallic compound represented by Formula 1 may have high quantum efficiency (EQE), and thus, may have high luminescence efficiency.

In one or more embodiments, $R_{18}$ and $R_{19}$ in Formula 1 may each independently be a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group. That is, $R_{18}$ and $R_{19}$ in Formula 1 may each have two or more carbons. Therefore, an electron donating capability of Ligand 2 (see Formula 1') in Formula 1 is improved, and thus, an interaction between Ligand 1 and Ligand 2 in Formula 1 may be enhanced. Thus, the organometallic compound represented by Formula 1 may have improved luminescent transition characteristics, improved optical orientation characteristics, and improved structural rigidity. Accordingly, an electronic device, for example, an organic light-emitting device, including the organometallic compound represented by Formula 1 may have high luminescence efficiency and a long lifespan.

Furthermore, since $R_{20}$ in the organometallic compound represented by Formula 1 includes neither a fluoro group (—F) nor a cyano group, the organometallic compound represented by Formula 1 may emit light having high color purity (for example, light having a relatively narrow full width at half maximum (FWHM) in the photoluminescent spectrum or electroluminescent spectrum).

In one or more embodiments, the FWHM of the emission peak of the photoluminescent spectrum or electroluminescent spectrum of the organometallic compound may be 64 nm or less. For example, the FWHM of the emission peak of the photoluminescent spectrum or electroluminescent spectrum of the organometallic compound may be from about 45 nm to about 64 nm, about 45 nm to about 59 nm, about 45 nm to about 55 nm or about 50 nm to about 55 nm.

In one or more embodiments, the maximum emission wavelength (emission peak wavelength, λmax) of the emission peak of the photoluminescent spectrum or electroluminescent spectrum of the organometallic compound may be from about 615 nm to about 640 nm. In one or more embodiments, the maximum emission wavelength (emission peak wavelength, λmax) of the emission peak of the photoluminescent spectrum or electroluminescent spectrum of the organometallic compound may be from about 615 nm to about 630 nm or about 620 nm to about 630 nm.

The horizontal orientation ratio of the transition dipole moment of the organometallic compound represented by Formula 1 may be from about 90% to about 100%.

For example, the horizontal orientation ratio of the transition dipole moment of the organometallic compound may be, for example, from about 90% to about 100%, from about 91% to about 100%, from about 92% to about 100%, from about 93% to about 100%, from about 94% to about 100%, from about 95% to about 100%, from about 96% to about 100%, from about 97% to about 100%, from about 98% to about 100%, from about 99% to about 100%, or about 100%.

The horizontal orientation ratio of the transition dipole moment may be evaluated by using an angle-dependent photoluminescence (PL) measurement apparatus. The angle-dependent PL measurement apparatus may be understood by referring to, for example, the description of the angle-dependent PL measurement apparatus disclosed in Korean application No. 2013-0150834. Korean application No. 2013-0150834 is incorporated herein.

As described above, since the horizontal orientation ratio of the transition dipole moment of the organometallic compound is high, when an organic light-emitting device including the organometallic compound is driven, an electric field may be emitted in a substantially parallel to a film including the organometallic compound, and thus, optical loss caused by a waveguide mode and/or a surface plasmon polariton mode may be reduced. Due to an external extraction efficiency of the electronic device emitting light (that is, an efficiency of light extracted to the outside from the electronic device (for example, an organic light-emitting device) including a film including the organometallic compound (for example, an emission layer to be described)) by such a mechanism, an electronic device, for example, an organic light-emitting device, including the organometallic compound may have high luminescence efficiency.

The photoluminescence quantum yield of the organometallic compound represented by Formula 1 in film may be from about 90% to about 100%. For example, the PLQY of the organometallic compound in a film may be from about 91% to about 100%, from about 92% to about 100%, from about 93% to about 100%, from about 94% to about 100%, from about 95% to about 100%, from about 96% to about 100%, from about 97% to about 100%, from about 98% to about 100%, or from about 99% to about 100%, or about 100%.

In one or more embodiments, the PLQY of the organometallic compound in a film may be from about 95% to about 99%, from about 96% to about 99%, from about 97% to about 99%, or from about 98% to about 99%.

The method of measuring the PLQY in film may be understood by referring to Evaluation Example 1.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer disposed between the first electrode and the second electrode and including an emission layer, and the organic layer includes at least one organometallic compounds represented by Formula 1.

Since the organic light-emitting device includes an organic layer including the organometallic compound represented by Formula 1 described above, excellent characteristics may be obtained in terms of the driving voltage, the external quantum efficiency, a relatively narrow FWHM of an electroluminescence (EL) spectrum emission peak and a lifespan.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 in the emission layer is smaller than an amount of the host).

In one or more embodiments, the emission layer may emit red light.

The expression "(an organic layer) includes at least one organometallic compound" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode, or the first electrode may be a cathode, which is an electron injection electrode, and the second electrode may be an anode, which is a hole injection electrode.

In one or more embodiments, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. 1 is a schematic view of an organic light-emitting device 10 according to one embodiment. Hereinafter, the structure of an organic light-emitting device according to an embodiment and a method of manufacturing an organic light-emitting device according to an embodiment will be described in connection with FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may include a material with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 is located on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201 below, a compound represented by Formula 202 below, or any combination thereof:

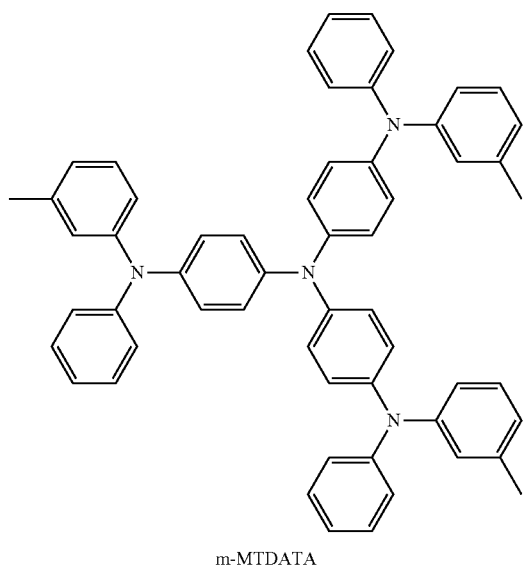

m-MTDATA

-continued
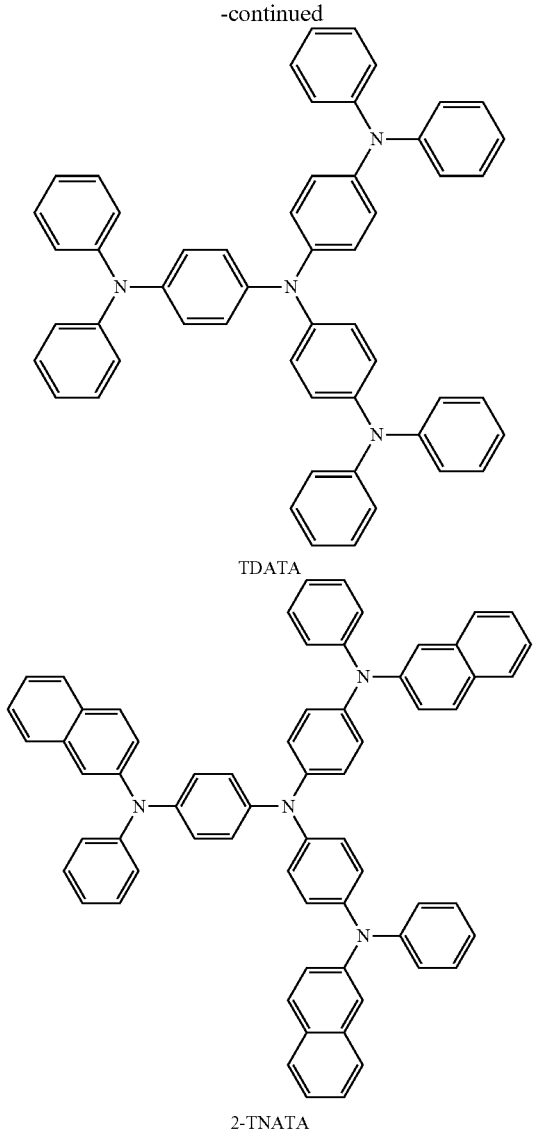
TDATA
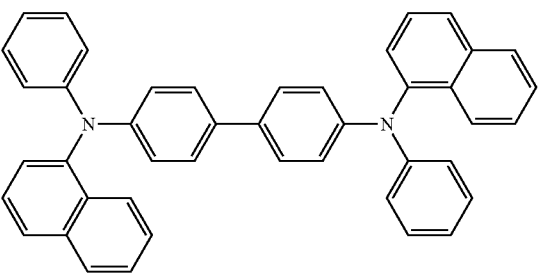
2-TNATA
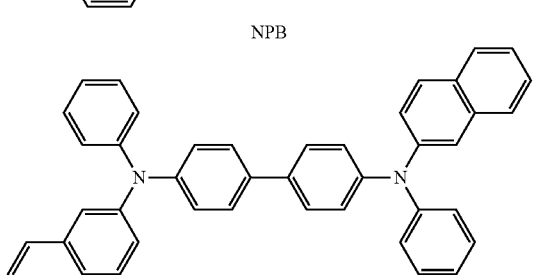
NPB
β-NPB
-continued
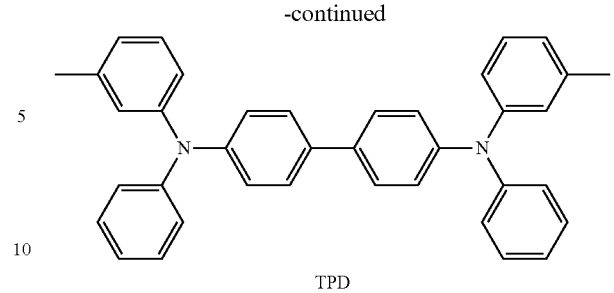
TPD
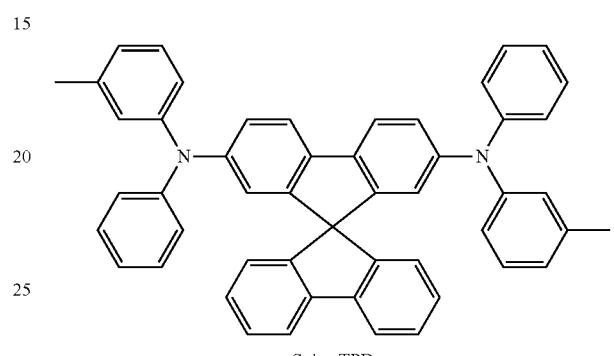
Spiro-TPD
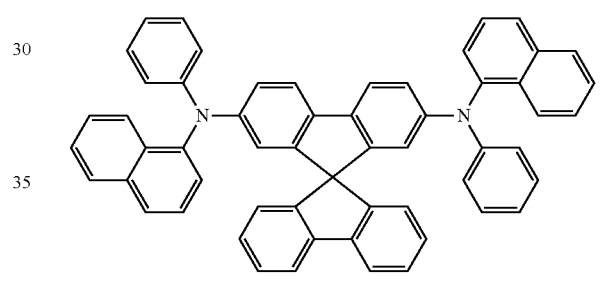
Spiro-NPB
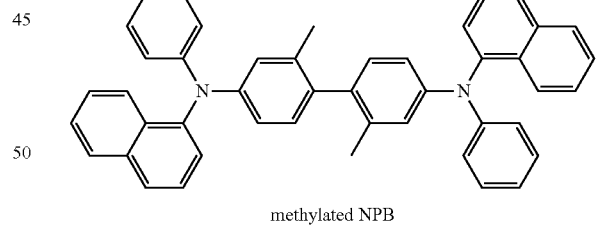
methylated NPB
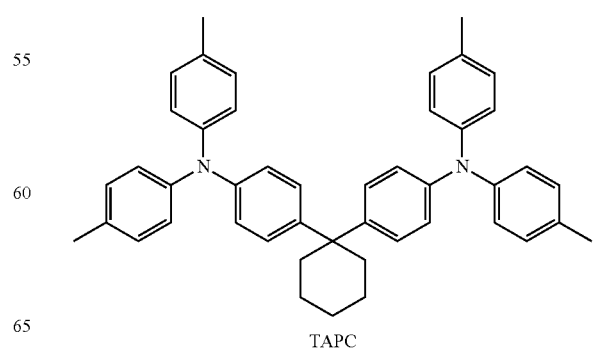
TAPC

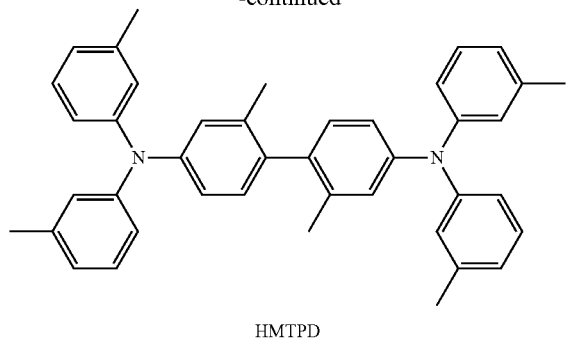

HMTPD

Formula 201

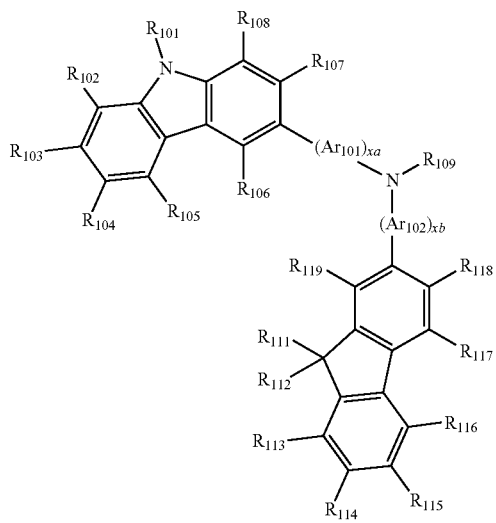

Formula 202

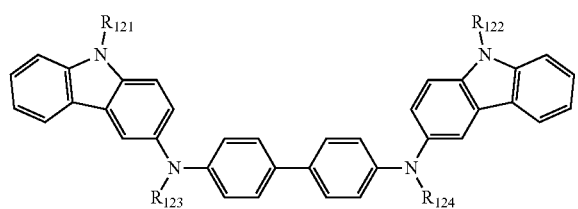

Ar$_{101}$ and Ar$_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or 0, 1 or 2. For example, xa may be 1 and xb may be 0, but xa and xb are not limited thereto.

$R_{101}$ to $R_{105}$, $R_{111}$ to $R_{119}$ and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, or a hexyl group), or a $C_1$-$C_{10}$ alkoxy group (for example, a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, or a $C_1$-$C_{10}$ alkoxy group, or any combination thereof.

$R_{109}$ in Formula 201 may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A:
Formula 201A
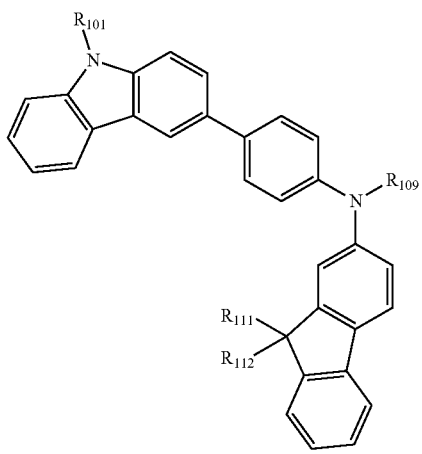
$R_{101}$, $R_{111}$, $R_{112}$, and $R_{109}$ in Formula 201A may be understood by referring to the description provided herein.
For example, the hole transport region may include one of Compounds HT1 to HT21 or any combination thereof:
HT1
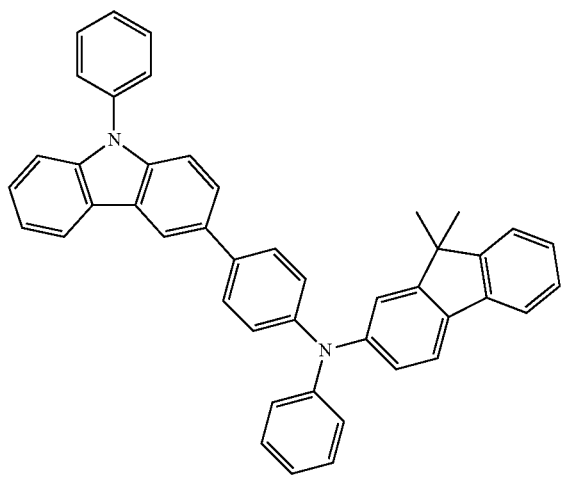
HT2
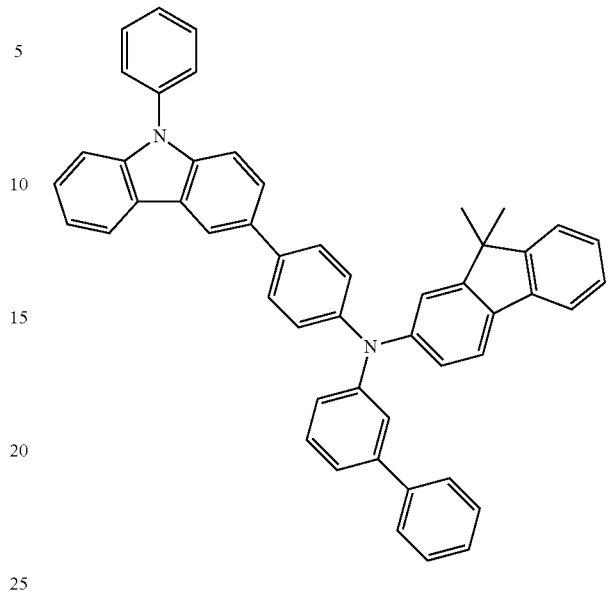
HT3
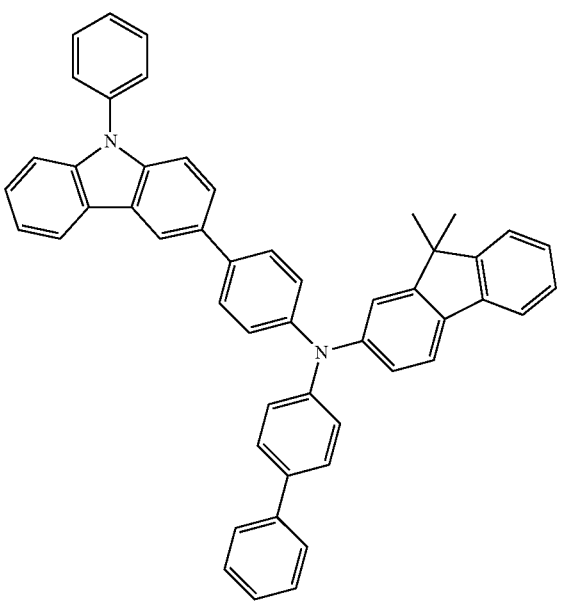

HT4
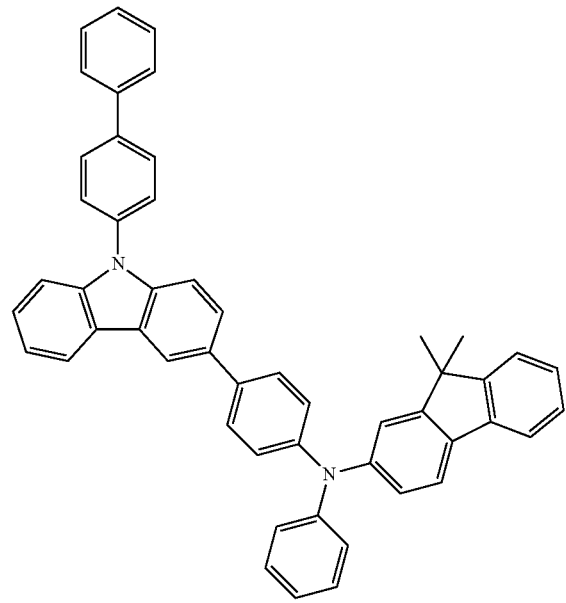
HT5
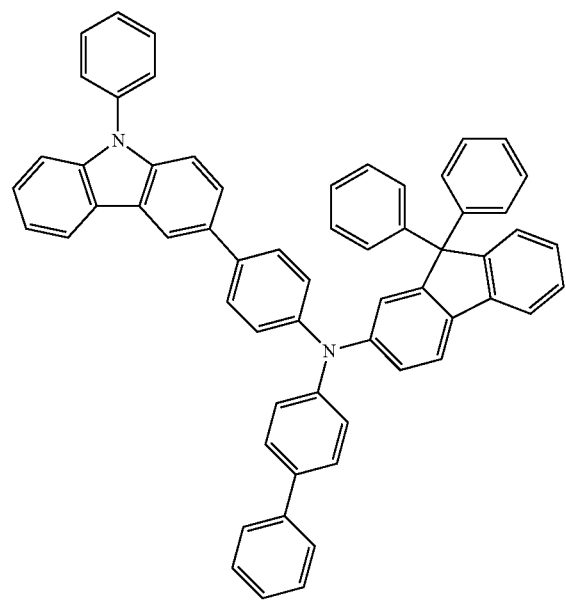
HT6
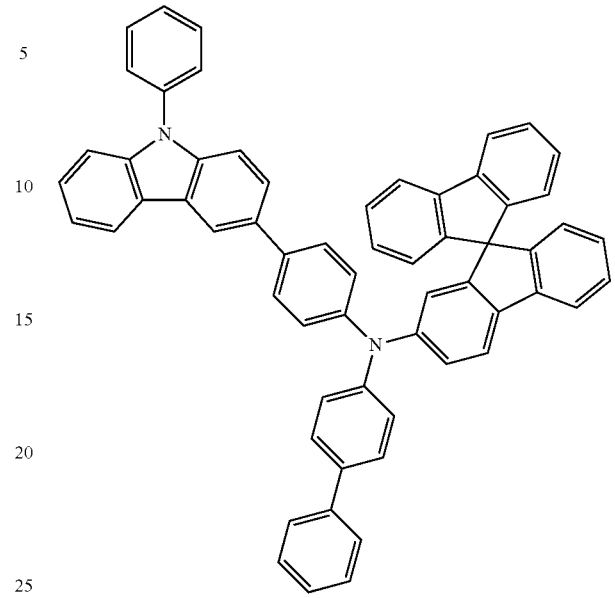
HT7
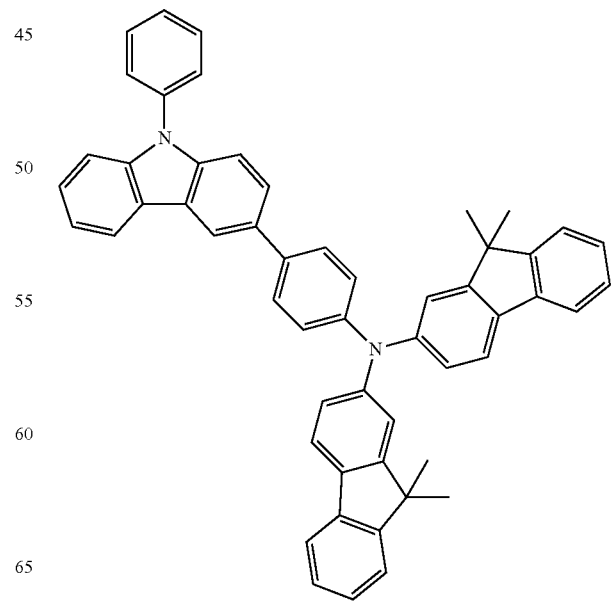

HT8
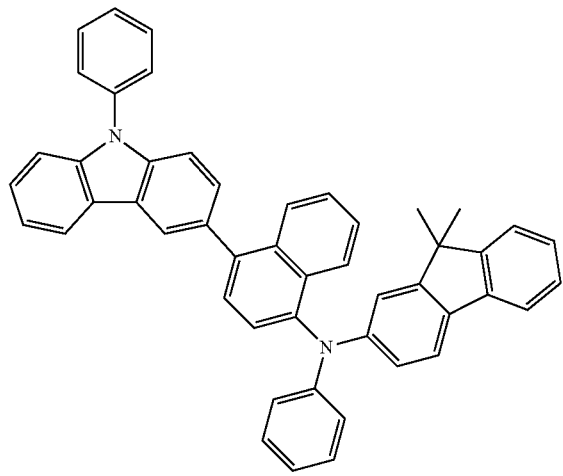
HT9
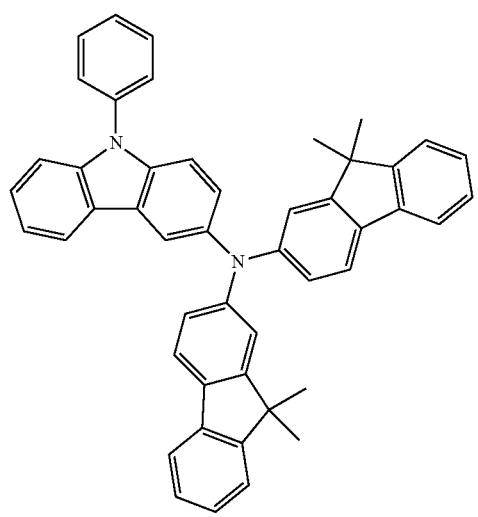
HT10
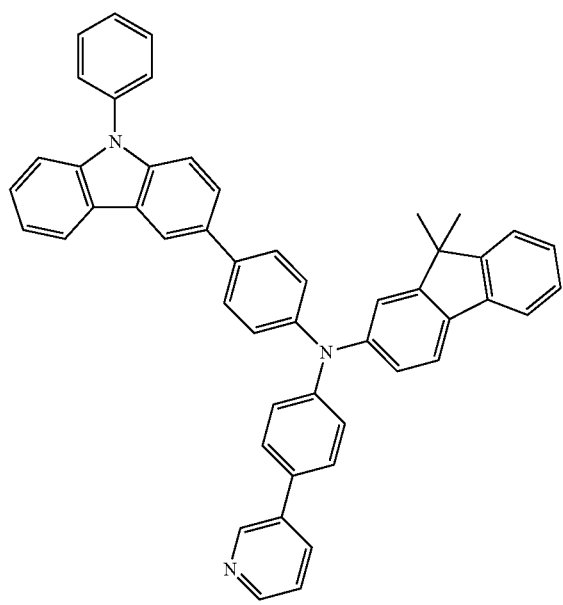
HT11
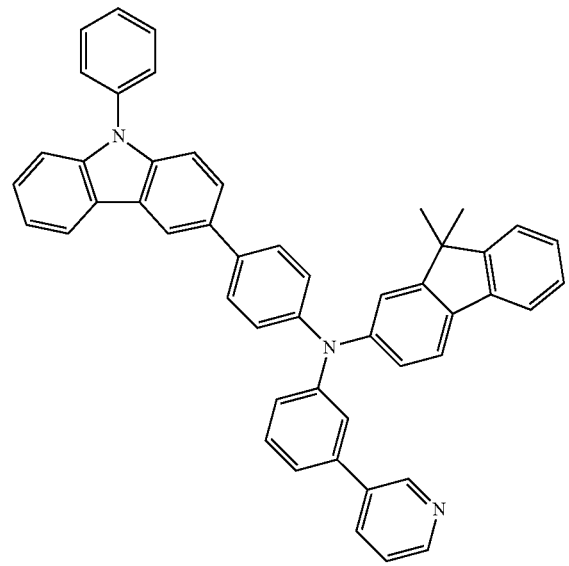
HT12
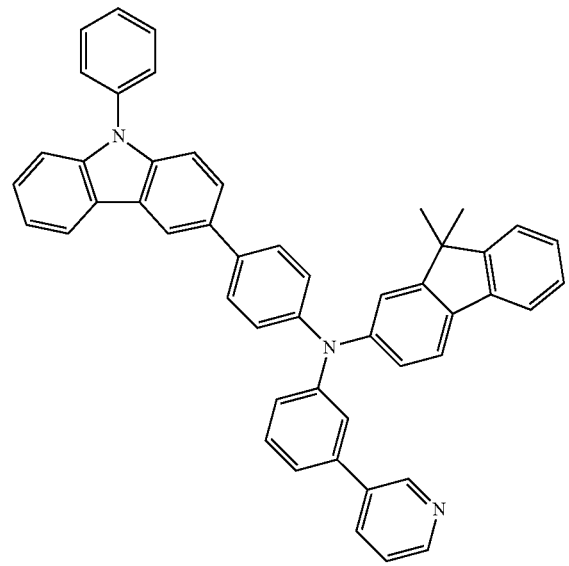
HT13
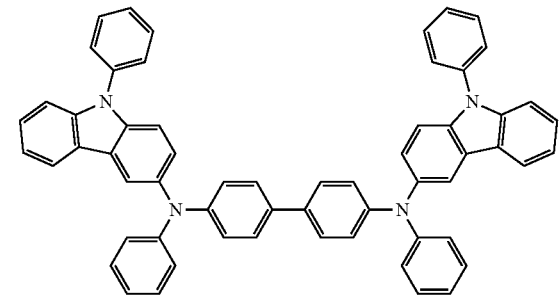

HT14
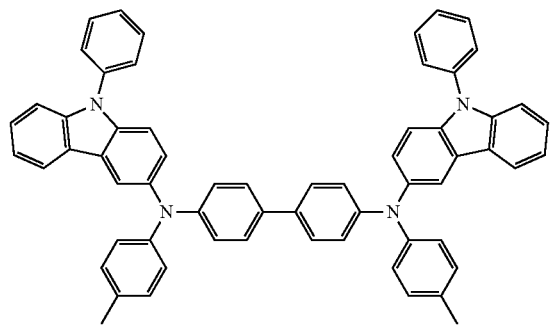
HT15
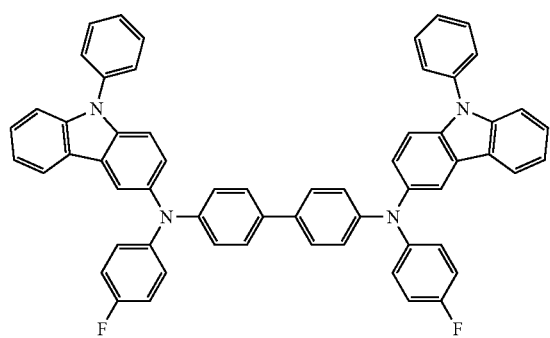
HT16
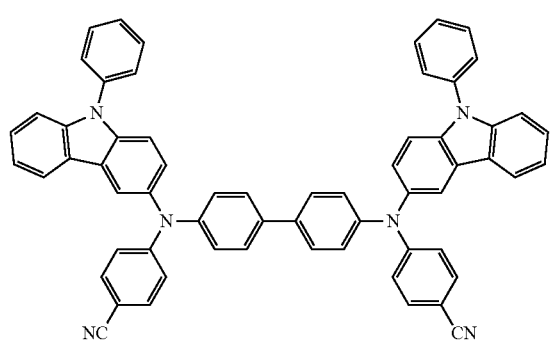
HT17
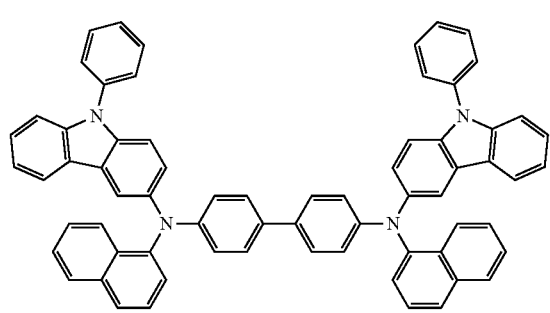
HT18
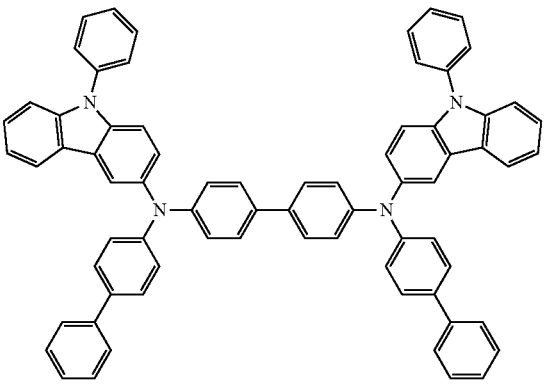
HT19
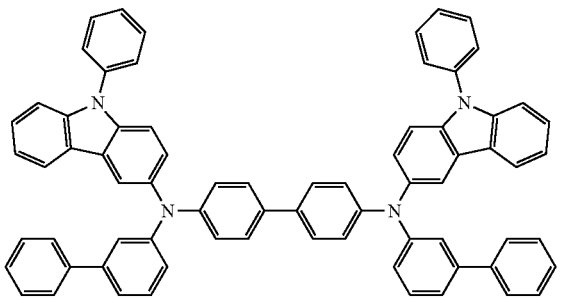
HT20
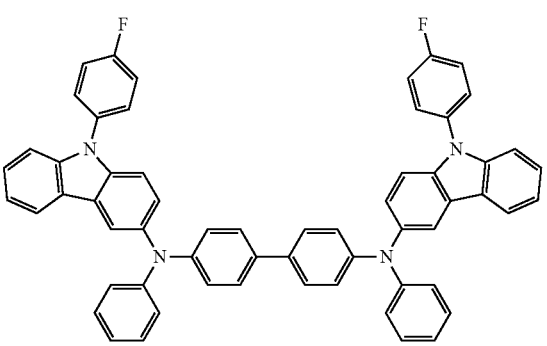
HT21
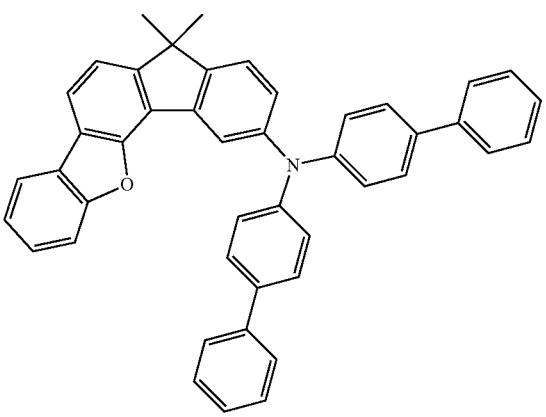
The thickness of the hole transport region may be in a range of about 100 Å to about 10,000 Å, for example, about 100 Å to about 1,000 Å. When the hole transport region includes a hole injection layer, a hole transport layer, an electron blocking layer, or any combination thereof, the thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. Examples of the p-dopant are a quinone derivative, such as tetracyanoquinodimethane (TCNQ), 2,3,5,6-tetrafluoro-tetracyano-1,4-benzoquinone dimethane (F4-TCNQ), or F6-TCNNQ; a metal oxide, such as a tungsten oxide or a molybdenum oxide; a cyano group-containing compound, such as Compound HT-D1 below; or any combination thereof.

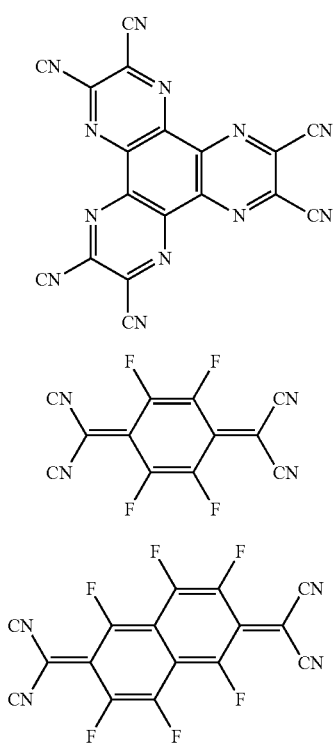

HT-D1

F4-TCNQ

F6-TCNNQ

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be a material for the hole transport region described above, a material for a host to be explained later, or any combination thereof. For example, when the hole transport region includes an electron blocking layer, a material for the electron blocking layer may be mCP, which will be explained later, Compound H21, or any combination thereof.

Then, an emission layer (EML) may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

The emission layer may include a host and a dopant, and the dopant may include an organometallic compound represented by Formula 1 described herein.

The host may include TPBi, TBADN, ADN (also referred to as "DNA"), CBP, CDBP, TCP, mCP, Compound H50, Compound H51, Compound 52, or any combination thereof:

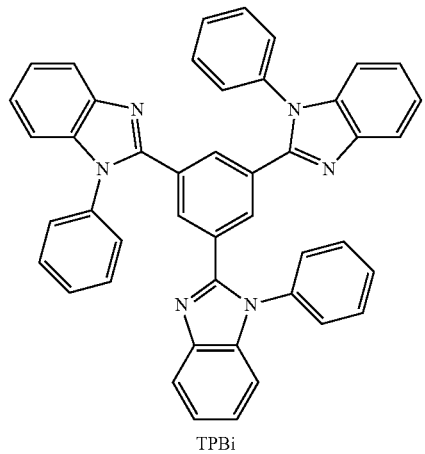

TPBi

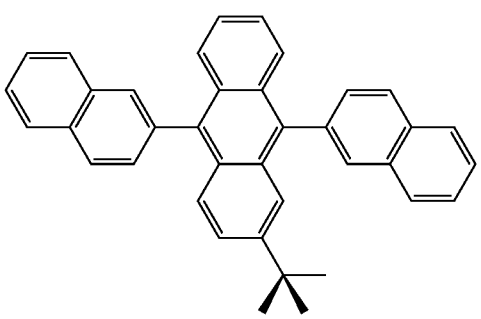

TBADN

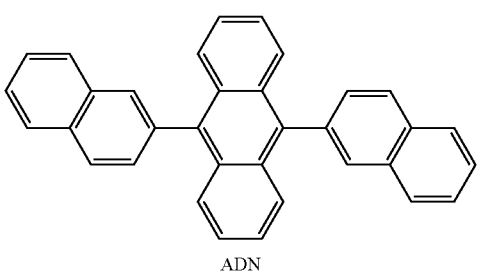

ADN

-continued

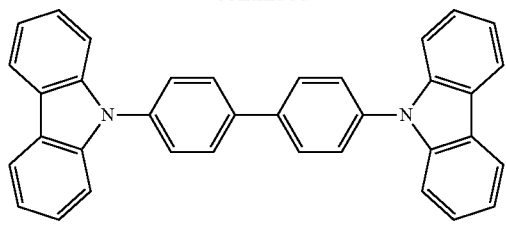
CBP

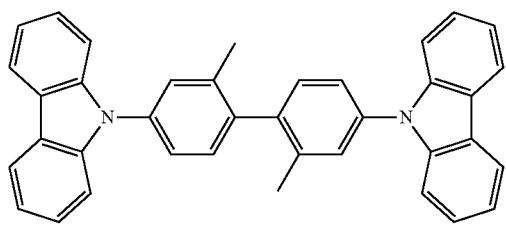
CDBP

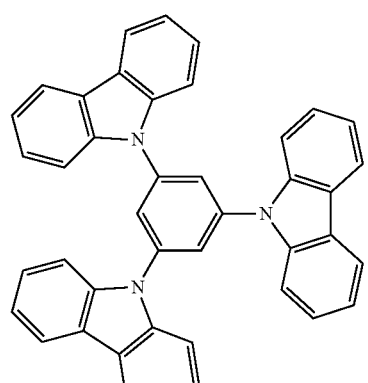
TCP

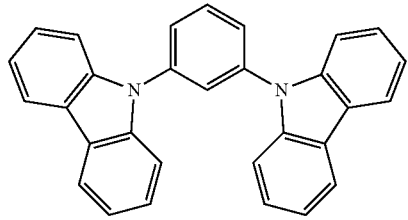
mCP

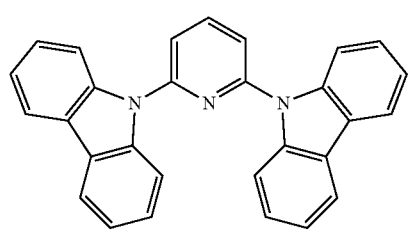
H50

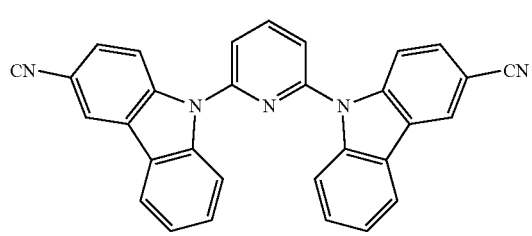
H51

-continued

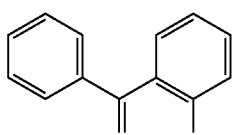
H52

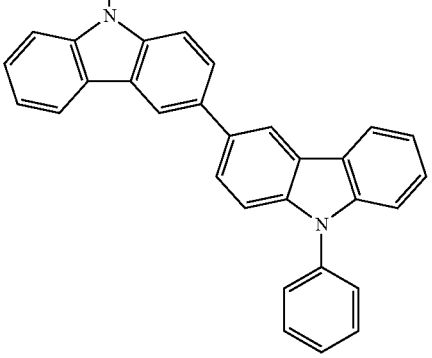

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq.

BCP

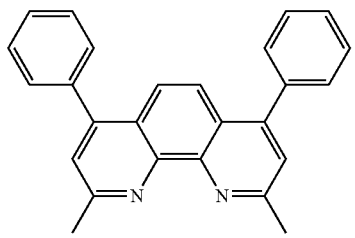

Bphen

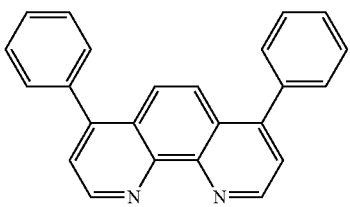

TAZ

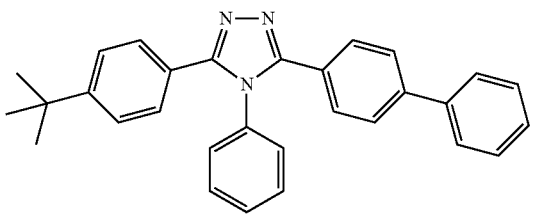

NTAZ

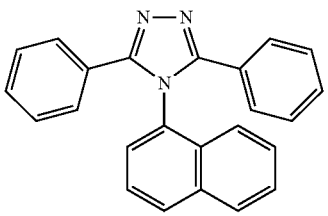

In one or more embodiments, the hole blocking layer may include the host, a material for forming an electron transport layer to be described later, a material for forming an electron injection layer to be described later, or any combination thereof.

The thickness of the hole blocking layer may be in a range of about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, $Alq_3$, BAlq, TAZ, NTAZ, or any combination thereof:

In one or more embodiments, the electron transport layer may include one of Compounds ET1 to ET25 or any combination thereof:

Alq3

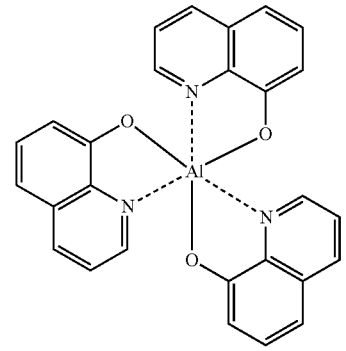

ET1

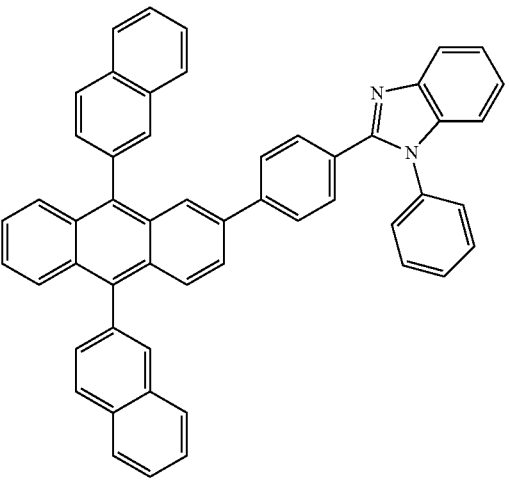

BAlq

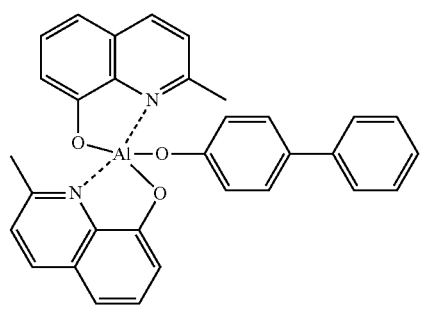

ET2

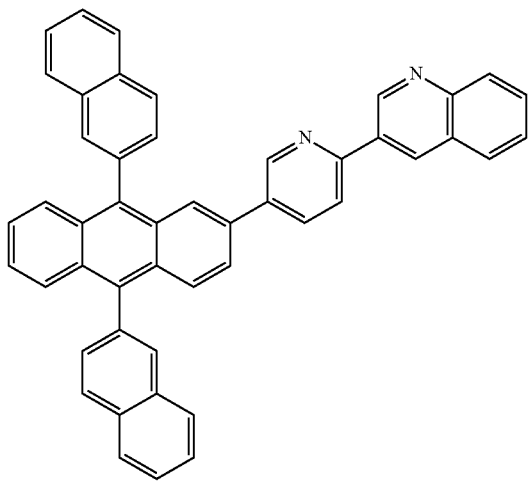

ET3
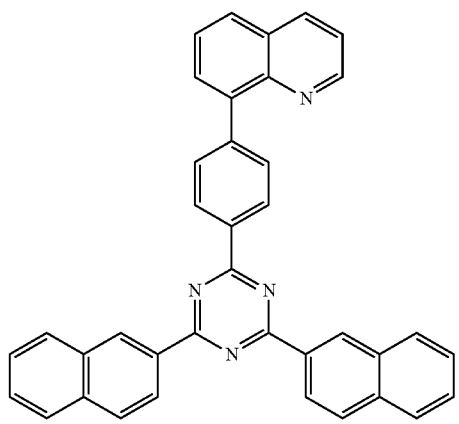
ET6
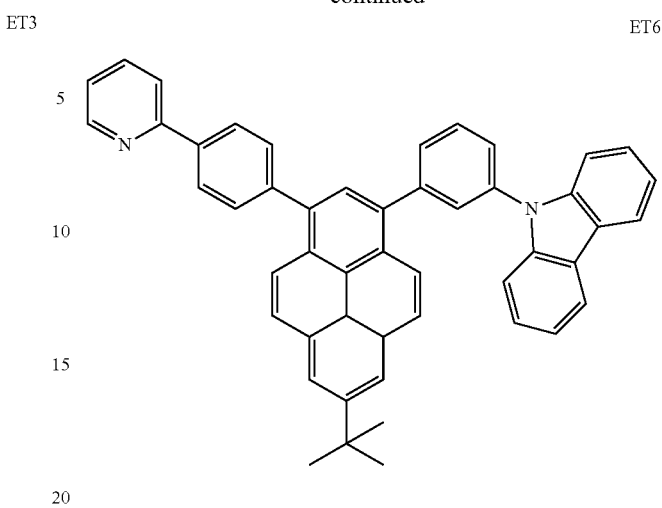
ET4
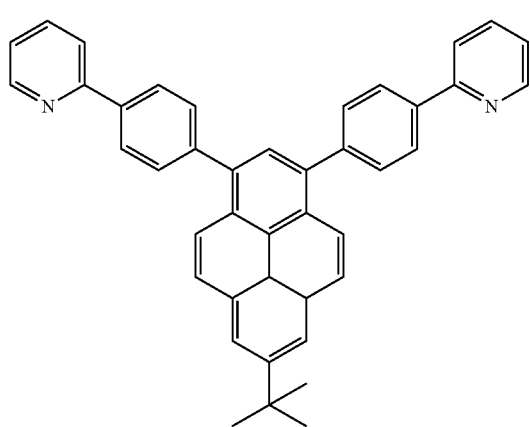
ET7
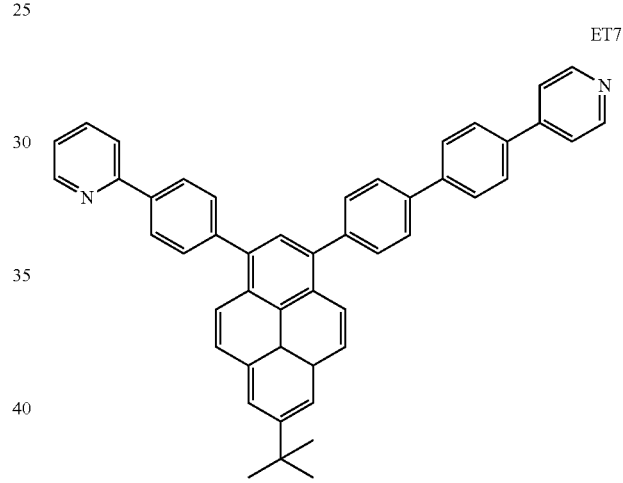
ET5
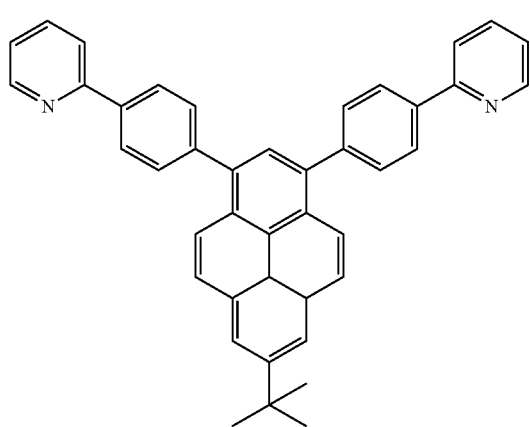
ET8
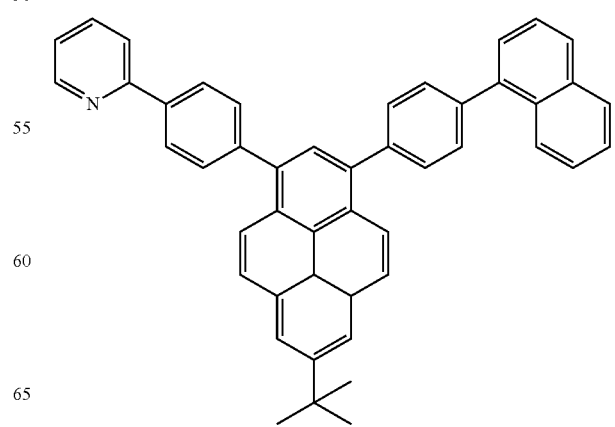

ET9
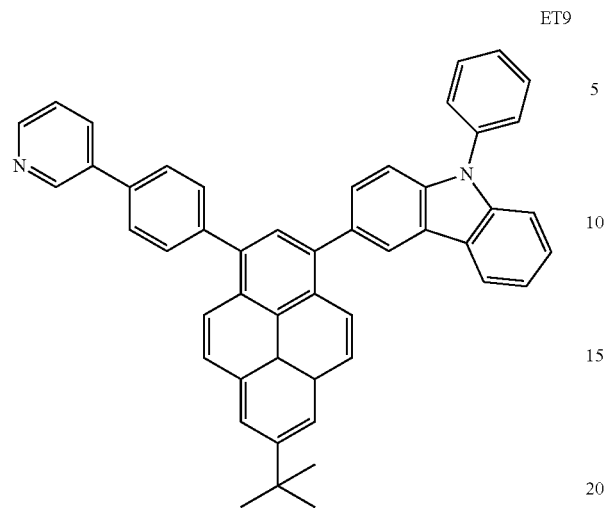
ET13
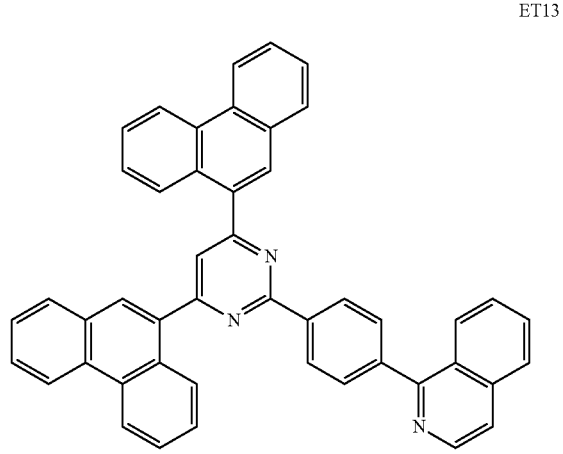
ET10
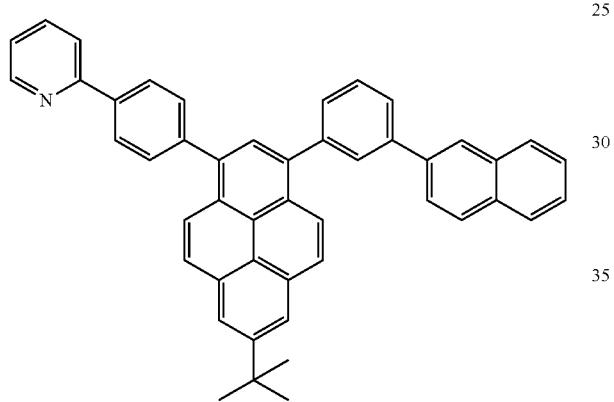
ET14
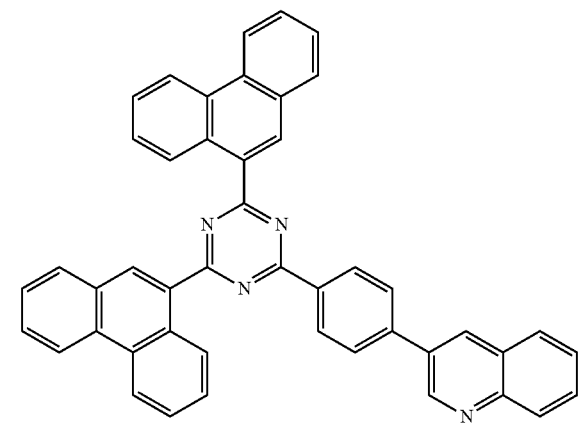
ET11
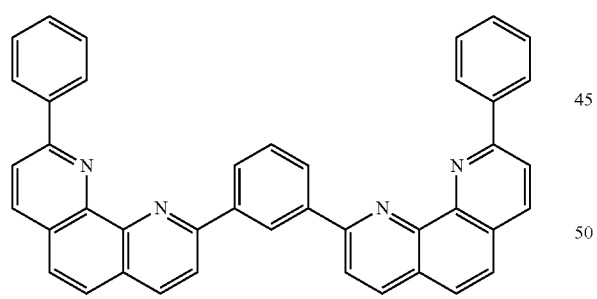
ET12
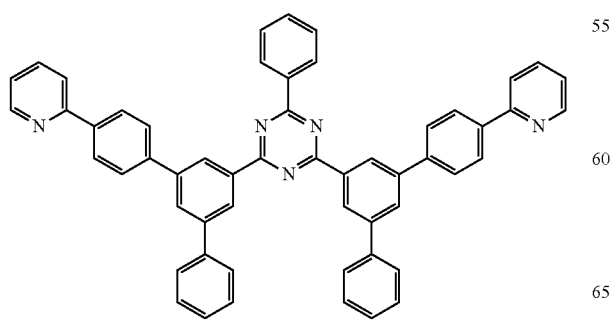
ET15
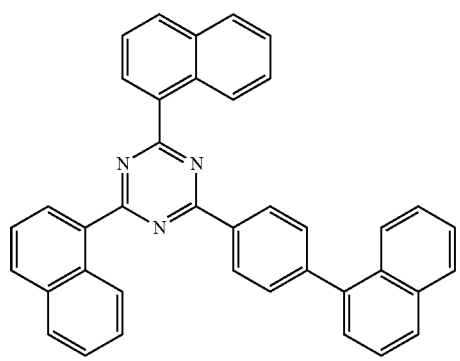

ET16
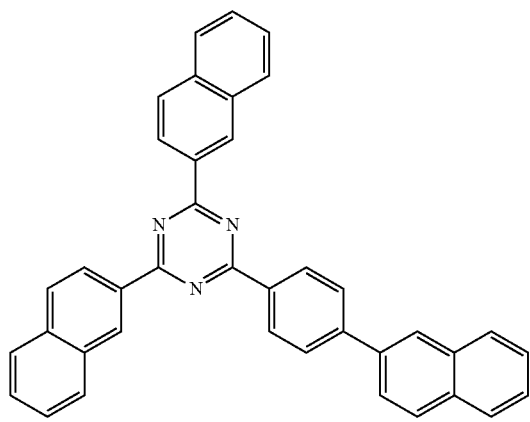
ET17
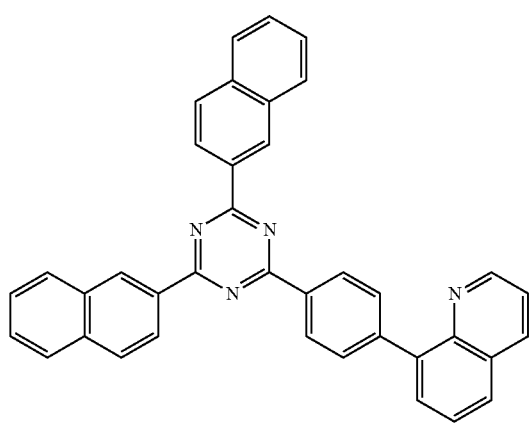
ET18
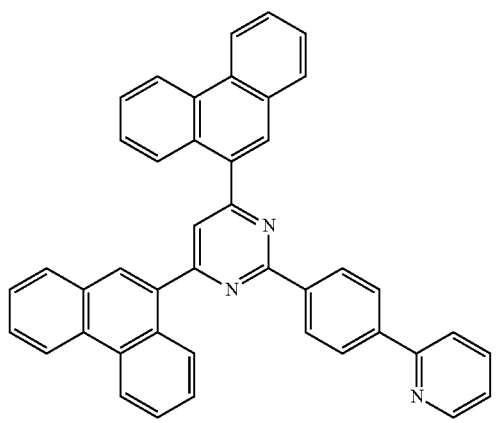
ET19
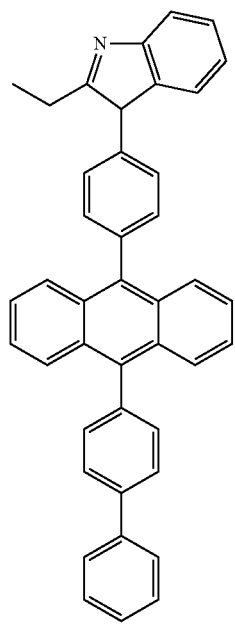
ET20
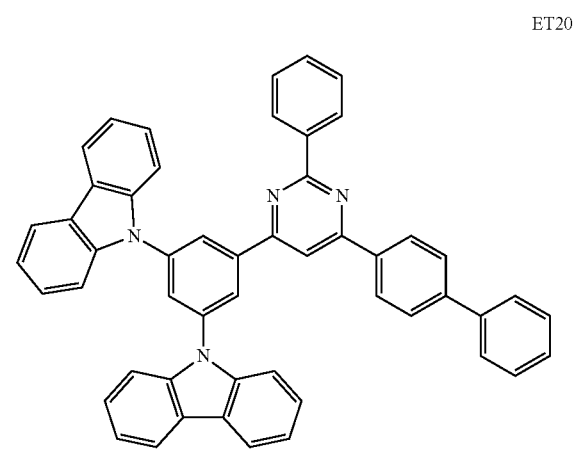
ET21
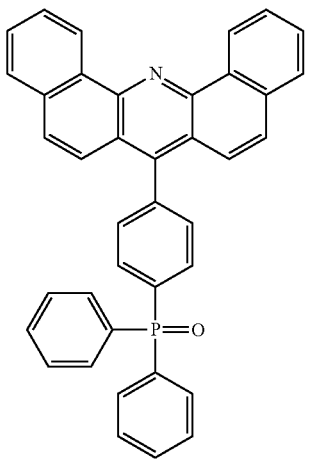

ET22

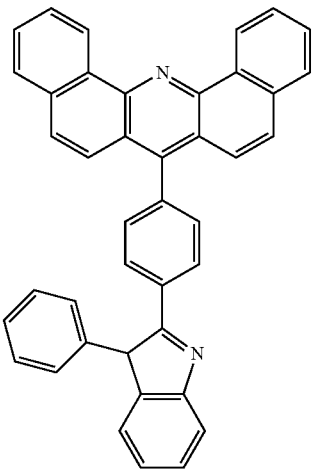

ET23

ET24

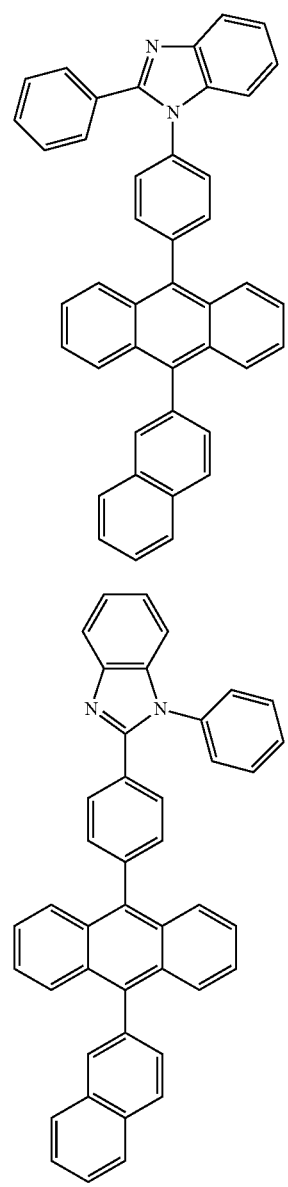

ET25

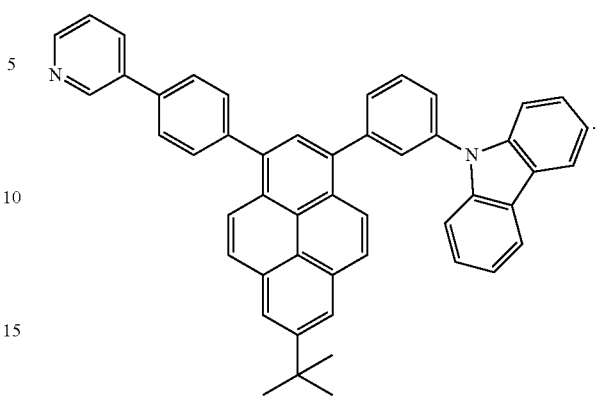

The thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 or ET-D2.

ET-D1

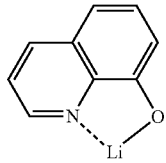

ET-D2

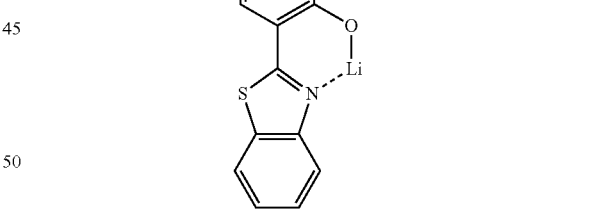

The electron transport region may include an electron injection layer (EIL) that promotes flow of electrons from the second electrode 19 thereinto.

The electron injection layer may include LiF, NaCl, CsF, $Li_2O$, BaO, or any combination thereof.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

The second electrode 19 may be located on the organic layer 15. The second electrode 19 may be a cathode. A material for forming the second electrode 19 may be metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIGURE, but embodiments of the present disclosure are not limited thereto.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 4)

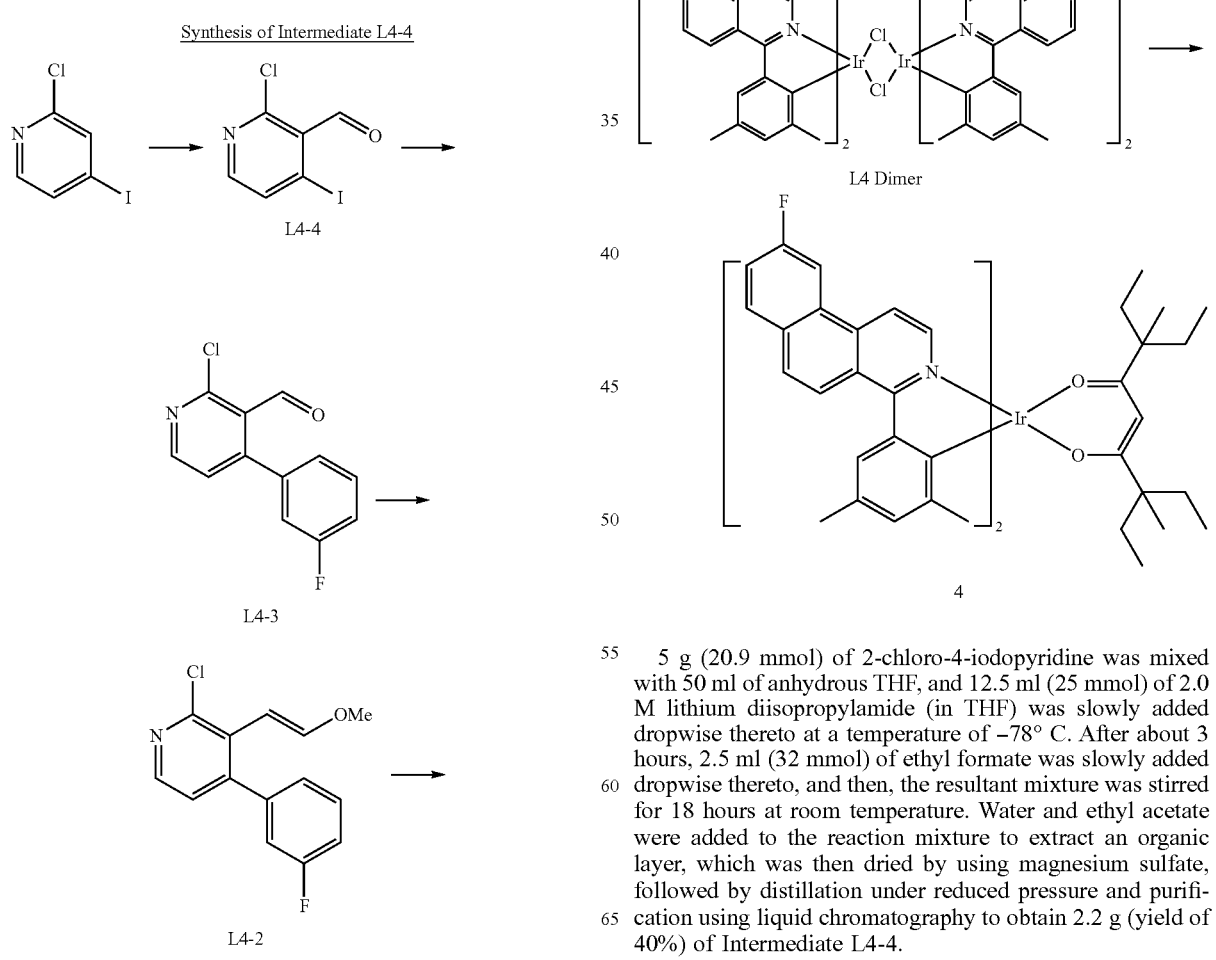

5 g (20.9 mmol) of 2-chloro-4-iodopyridine was mixed with 50 ml of anhydrous THF, and 12.5 ml (25 mmol) of 2.0 M lithium diisopropylamide (in THF) was slowly added dropwise thereto at a temperature of −78° C. After about 3 hours, 2.5 ml (32 mmol) of ethyl formate was slowly added dropwise thereto, and then, the resultant mixture was stirred for 18 hours at room temperature. Water and ethyl acetate were added to the reaction mixture to extract an organic layer, which was then dried by using magnesium sulfate, followed by distillation under reduced pressure and purification using liquid chromatography to obtain 2.2 g (yield of 40%) of Intermediate L4-4.

LC-MS m/z=769.48 (M+H)$^+$

Synthesis of Intermediate L4-3

1.9 g (7.2 mmol) of Intermediate L4-4 was mixed with 60 ml of acetonitrile and 15 ml of water, and then, 0.4 g (0.5 mmol) of $PdCl_2(PPh_3)_2$, 1.0 g (7.2 mmol) of 3-fluorophenylboronic acid, and 2.5 g (18.0 mmol) of $K_2CO_3$ were added thereto, and then, the mixture was heated while refluxing at a temperature of 80° C. for 18 hours. The reaction mixture was concentrated under reduced pressure, and dichloromethane and water were added thereto to extract an organic layer, which was then dried by using magnesium sulfate, followed by distillation under reduced pressure and purification using liquid chromatography to obtain 1.4 g (yield 78%) of Intermediate L4-3.

LC-MS m/z=236 $(M+H)^+$

Synthesis of Intermediate L4-2

5.4 g (15.8 mmol) of (methoxymethyl)triphenylphosphonium chloride was mixed with 50 ml of anhydrous ether, and then, 16 ml of 1.0 M potassium tert-butoxide solution (in THF) was added dropwise thereto, and the mixture was stirred at room temperature for about 1 hour. Thereafter, 1.5 g (6.3 mmol) of Intermediate L4-3 mixed with 30 ml of anhydrous THF was slowly added dropwise thereto, and the resultant mixture was stirred at room temperature for 18 hours. Water and ethyl acetate were added to the reaction mixture to extract an organic layer, which was then dried by using magnesium sulfate, followed by distillation under reduced pressure and purification using liquid chromatography to obtain 1.6 g (yield of 95%) of Intermediate L4-2.

LC-MS m/z=264 $(M+H)^+$

Synthesis of Intermediate L4-1

1.4 g (5.1 mmol) of Intermediate L4-2 was mixed with 40 ml of dichloromethane, and 3.0 ml of methanesulfonic acid was slowly added dropwise thereto, and then, the resultant mixture was stirred at room temperature for about 18 hours. A saturated sodium bicarbonate aqueous solution was added to the reaction mixture to extract an organic layer, which was then dried by using magnesium sulfate, followed by distillation under reduced pressure and purification using liquid chromatography to obtain 1.0 g (yield of 90%) of Intermediate L4-1.

LC-MS m/z=232 $(M+H)^+$

Synthesis of Intermediate L4

1.0 g (4.1 mmol) of Intermediate L4-1 was mixed with 40 ml of THF and 10 ml of water, 0.9 g (6.2 mmol) of 3,5-dimethylphenylboronic acid, 0.09 g (0.4 mmol) of $Pd(OAc)_2$, 0.35 g (0.82 mmol) of Sphos, and 1.4 g (10.3 mmol) of $K_2CO_3$ were added thereto, and the mixture was heated while refluxing. Ethyl acetate and water were added to the reaction mixture to extract an organic layer, which was then dried by using magnesium sulfate, followed by distillation under reduced pressure and purification using liquid chromatography to obtain 1.1 g (yield of 85%) of Intermediate L4.

LC-MS m/z=302 $(M+H)^+$

Synthesis of Intermediate L4 Dimer 40 mL of ethoxyethanol and 15 mL of distilled water were mixed with 1.05 g (3.4 mmol) of Intermediate L4 and 0.6 g (1.6 mmol) of iridium chloride, and then, the mixture was heated while refluxing for 24 hours. The temperature of the reaction mixture was decreased to room temperature to obtain a solid product, which was then filtered and washed sequentially by using water, methanol, and hexane in the stated order. The resultant solid dried in a vacuum oven to obtain 1.1 g of Intermediate L4 Dimer.

Synthesis of Compound 4

1.0 g (0.63 mmol) of Intermediate L4 Dimer, 0.9 g (4.5 mmol) of 3,7-diethyl-3,7-dimethylnonane-4,6-dione, and 0.48 g (4.5 mmol) of $Na_2CO_3$ were mixed with 40 mL of ethoxyethanol, and then, the mixture was stirred for 24 hours at a temperature of 90° C. The reaction mixture was cooled to room temperature to obtain a solid product, which was then filtered and purified by liquid chromatography to obtain 1.0 g (yield of 80%) of Compound 4.

LC-MS m/z=1035 $(M+H)^+$

Synthesis Example 2 (Compound 1)

Synthesis of Intermediate L1-2

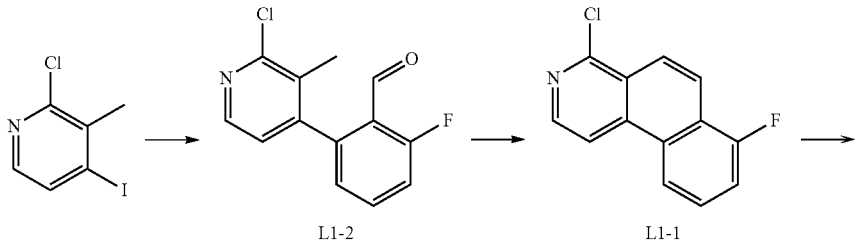

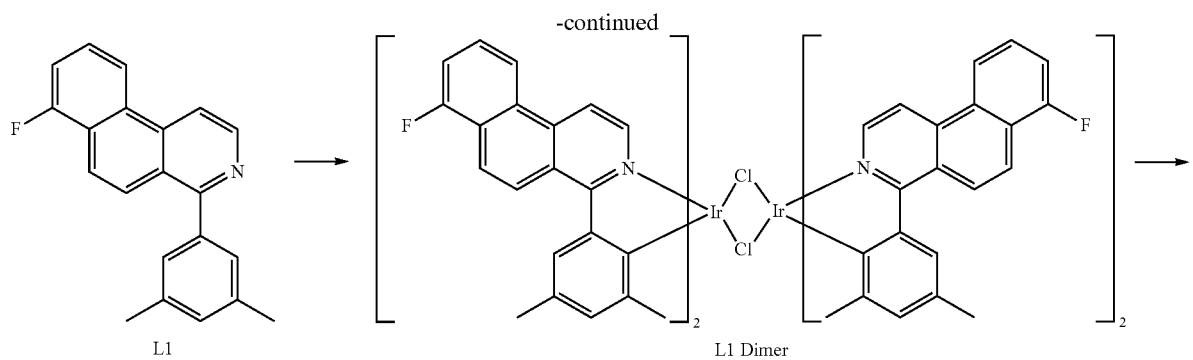

6.0 g (23.7 mmol) of 2-chloro-4-iodo-3-methylpyridine was mixed with 80 ml of acetonitrile and 20 ml of water, and then, 1.2 g (1.6 mmol) of $PdCl_2(PPh_3)_2$, 4.4 g (26.1 mmol) of (3-fluoro-2-formylphenyl)boronic acid, and 8.2 g (59.2 mmol) of $K_2CO_3$ were added thereto, and the resultant mixture was heated while refluxing at a temperature of 80° C. for 18 hours. The reaction mixture was concentrated under reduced pressure, and ethyl acetate and water were added thereto to extract an organic layer, which was then dried by using magnesium sulfate, followed by distillation under reduced pressure and purification using liquid chromatography to obtain 5.0 g (yield of 85%) of Intermediate L1-2.

LC-MS m/z=250 (M+H)$^+$

Synthesis of Intermediate L1-1

4.0 g (16.0 mmol) of Intermediate L1-2 was dissolved in 150 ml of anhydrous N,N-dimethylformamide, and then, 19 ml (19.2 mmol) of 1.0 M potassium tert-butoxide solution in THF was slowly added dropwise thereto at room temperature, and then, the reaction mixture was heated at a temperature of 80° C. for 6 hours. Once the reaction was completed, ethyl acetate and water were added thereto to extract an organic layer, which was then dried by using magnesium sulfate. The reaction mixture was filtered, concentrated under reduced pressure, and then, purified by liquid chromatography to obtain 1.3 g (yield of 35%) of Intermediate L1-1.

LC-MS m/z=232 (M+H)$^+$

Synthesis of Intermediate L1

1.4 g (yield of 85%) of Intermediate L1 was prepared in the same manner as used to synthesize Intermediate L4 of Synthesis Example 1, except that Intermediate L1-1 was used instead of Intermediate L4-1.

LC-MS m/z=303 (M+H)$^+$

Synthesis of Intermediate L1 Dimer

Intermediate L1 Dimer was prepared in the same manner as used to synthesize L4 Dimer of Synthesis Example 1, except that Intermediate L1 was used instead of Intermediate L4.

Synthesis of Compound 1

0.6 g (yield of 47%) of Compound 1 was prepared in the same manner as used to synthesize Compound 4 of Synthesis Example 1, except that Intermediate L1 Dimer was used instead of Intermediate L4 Dimer.

LC-MS m/z=1035 (M+H)$^+$

Synthesis Example 3 (Compound 6)

Synthesis of Intermediate L6-3

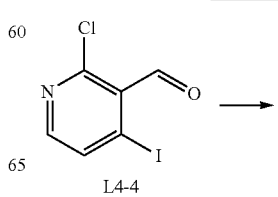

L4-4

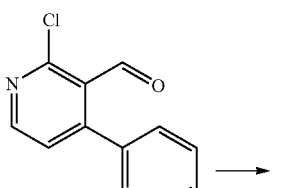

L6-3

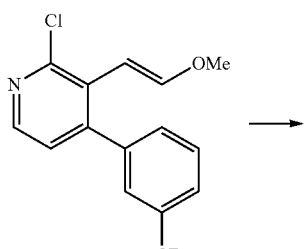

L6-2

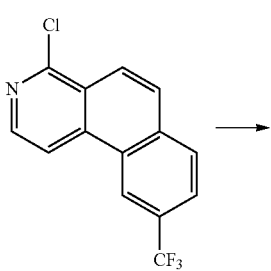

L6-1

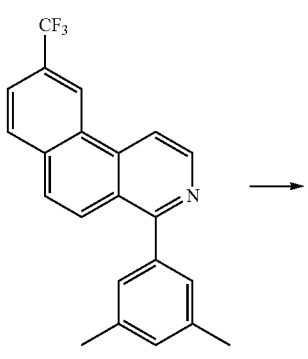

L6

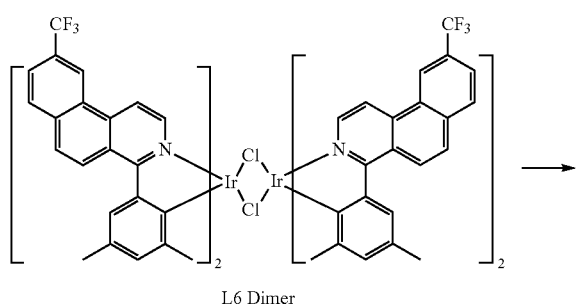

L6 Dimer

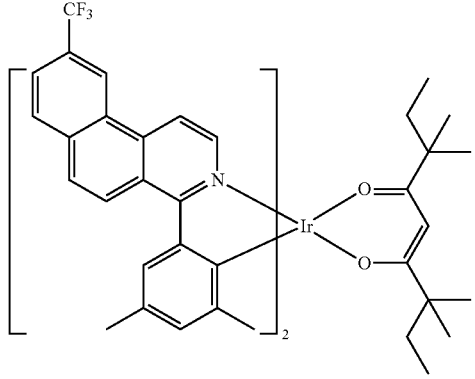

6

2.5 g (yield of 73%) of Intermediate L6-3 was prepared in the same manner as used to synthesize Intermediate L4-3 of Synthesis Example 1, except that 3-(trifluoromethyl)phenylboronic acid was used instead of 3-fluorophenylboronic acid.

LC-MS m/z=286 (M+H)$^+$

Synthesis of Intermediate L6-2

2.7 g (yield of 99%) of Intermediate L6-2 was prepared in the same manner as used to synthesize Intermediate L4-2 of Synthesis Example 1, except that Intermediate L6-3 was used instead of Intermediate L4-3.

LC-MS m/z=314 (M+H)$^+$

Synthesis of Intermediate L6-1

1.1 g (yield of 45%) of Intermediate L6-1 was prepared in the same manner as used to synthesize Intermediate L4-1 of Synthesis Example 1, except that Intermediate L6-2 was used instead of Intermediate L4-2.

LC-MS m/z=282 (M+H)$^+$

Synthesis of Intermediate L6

1.1 g of Intermediate L6 (yield of 80%) was prepared in the same manner as used to synthesize Intermediate L4 of Synthesis Example 1, except that Intermediate L6-1 was used instead of Intermediate L4-1.

LC-MS m/z=352 (M+H)$^+$

Synthesis of Intermediate L6 Dimer

Intermediate L6 Dimer was prepared in the same manner as used to synthesize Intermediate L4 Dimer of Synthesis Example 1, except that Intermediate L6 was used instead of Intermediate L4.

Synthesis of Compound 6

0.7 g (yield of 43%) of Compound 6 was prepared in the same manner as used to synthesize Compound 4 of Synthesis Example 1, except that Intermediate L6 Dimer and 3,3,7,7-tetramethylnonane-4,6-dione were used instead of Intermediate L4 Dimer and 3,7-diethyl-3,7-dimethylnonane-4,6-dione, respectively.

Synthesis Example 4 (Compound 7)
Synthesis of Intermediate L7-3
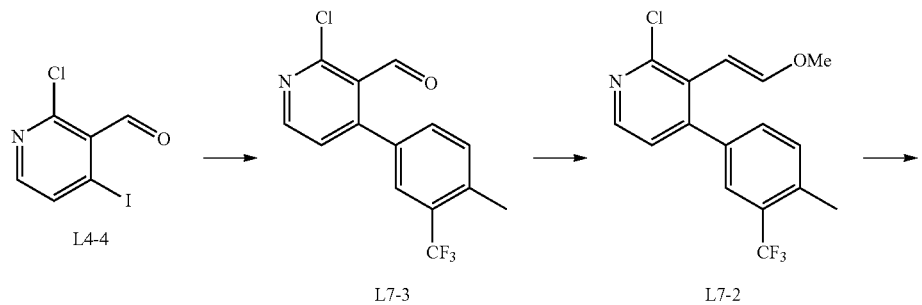
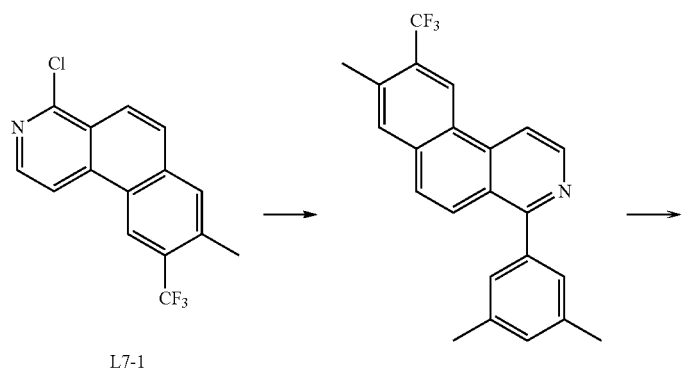
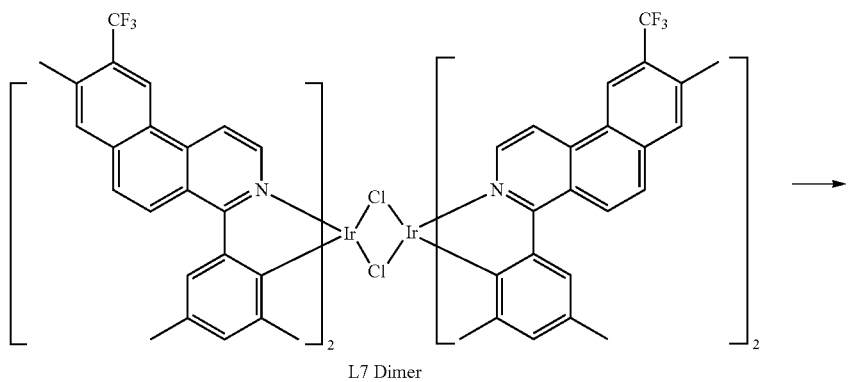
L7 Dimer
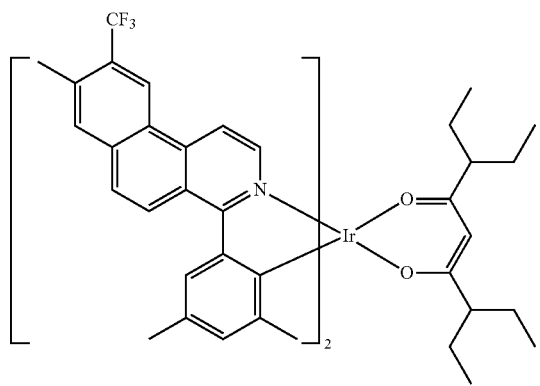
7

1.8 g (yield 70%) of Intermediate L7-3 was prepared in the same manner as used to synthesize Intermediate L4-3 of Synthesis Example 1, except that 3-(trifluoromethyl)-4-methylphenylboronic acid was used instead of 3-fluorophenylboronic acid.

LC-MS m/z=300 (M+H)$^+$

Synthesis of Intermediate L7-2

1.8 g (yield of 95%) of Intermediate L7-2 was prepared in the same manner as used to synthesize Intermediate L4-2 of Synthesis Example 1, except that Intermediate L7-3 was used instead of Intermediate L4-3.

LC-MS m/z=328 (M+H)$^+$

Synthesis of Intermediate L7-1

0.8 g (yield of 40%) of Intermediate L7-1 was prepared in the same manner as used to synthesize Intermediate L7-1 of Synthesis Example 1, except that Intermediate L7-2 was used instead of Intermediate L4-2.

LC-MS m/z=296 (M+H)$^+$

Synthesis of Intermediate L7

0.8 g (yield of 90%) of Intermediate L7 was prepared in the same manner as used to synthesize Intermediate L4 of Synthesis Example 1, except that Intermediate L7-1 was used instead of Intermediate L4-1.

LC-MS m/z=366 (M+H)$^+$

Synthesis of Intermediate L7 Dimer

Intermediate L7 Dimer was prepared in the same manner as used to synthesize Intermediate L4 Dimer of Synthesis Example 1, except that Intermediate L7 was used instead of Intermediate L4.

Synthesis of Compound 7

0.6 g (yield of 46%) of Compound 7 was prepared in the same manner as used to synthesize Compound 4 of Synthesis Example 1, except that Intermediate L7 Dimer and 3,7-diethylnonane-4,6-dione were used instead of Intermediate L4 Dimer and 3,7-diethyl-3,7-dimethylnonane-4,6-dione, respectively.

LC-MS m/z=1135 (M+H)$^+$

Synthesis Example 5 (Compound 9)

Synthesis of Intermediate L9-3

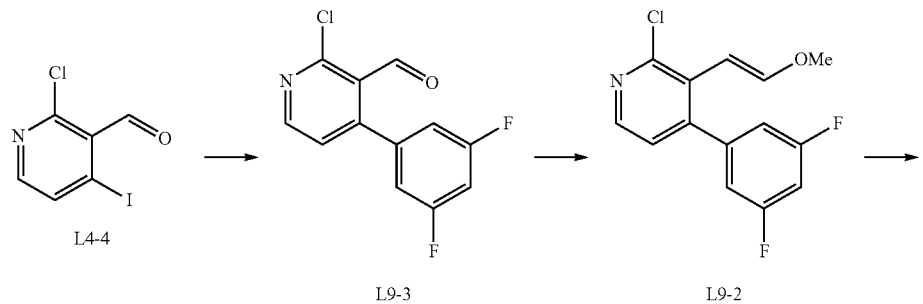

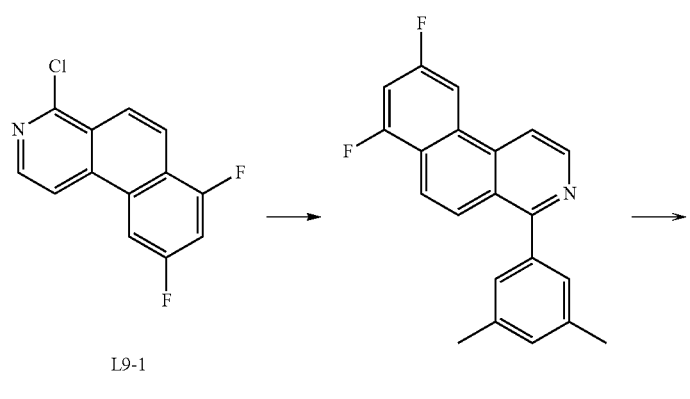

-continued

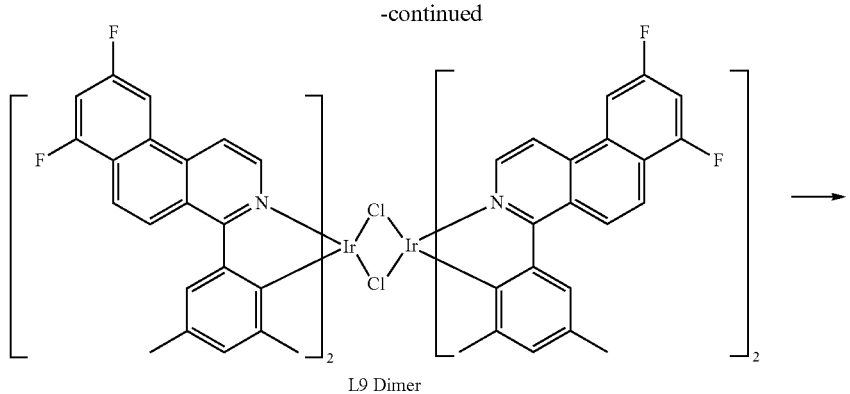

L9 Dimer

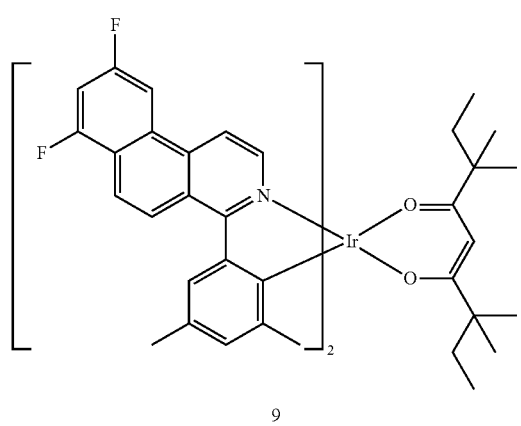

9

2.1 g (yield of 80%) of Intermediate L9-3 was prepared in the same manner as used to synthesize Intermediate L4-3 of Synthesis Example 1, except that 3,5-difluorophenylboronic acid was used instead of 3-fluorophenylboronic acid.

LC-MS m/z=268 (M+H)⁺

Synthesis of Intermediate L9-2

2.2 g (yield of 99%) of Intermediate L9-2 was prepared in the same manner as used to synthesize Intermediate L4-2 of Synthesis Example 1, except that Intermediate L9-3 was used instead of Intermediate L4-3.

LC-MS m/z=282 (M+H)⁺

Synthesis of Intermediate L9-1

0.8 g (yield of 40%) of Intermediate L9-1 was prepared in the same manner as used to synthesize Intermediate L4-1 of Synthesis Example 1, except that Intermediate L9-2 was used instead of Intermediate L4-2.

LC-MS m/z=250 (M+H)⁺

Synthesis of Intermediate L9

0.9 g of Intermediate L9 (yield of 87%) was prepared in the same manner as used to synthesize Intermediate L4 of Synthesis Example 1, except that Intermediate L9-1 was used instead of Intermediate L4-1.

LC-MS m/z=320 (M+H)⁺

Synthesis of Intermediate L9 Dimer

Intermediate L9 Dimer was prepared in the same manner as used to synthesize Intermediate L4 Dimer of Synthesis Example 1, except that Intermediate L9 was used instead of Intermediate L4.

Synthesis of Compound 9

0.7 g (yield of 48%) of Compound 9 was prepared in the same manner as used to synthesize Compound 4 of Synthesis Example 1, except that Intermediate L9 Dimer and 3,3,7,7-tetramethylnonane-4,6-dione were used instead of Intermediate L4 Dimer and 3,7-diethyl-3,7-dimethylnonane-4,6-dione, respectively.

LC-MS m/z=1043 (M+H)⁺

Synthesis Example 6 (Compound 16)

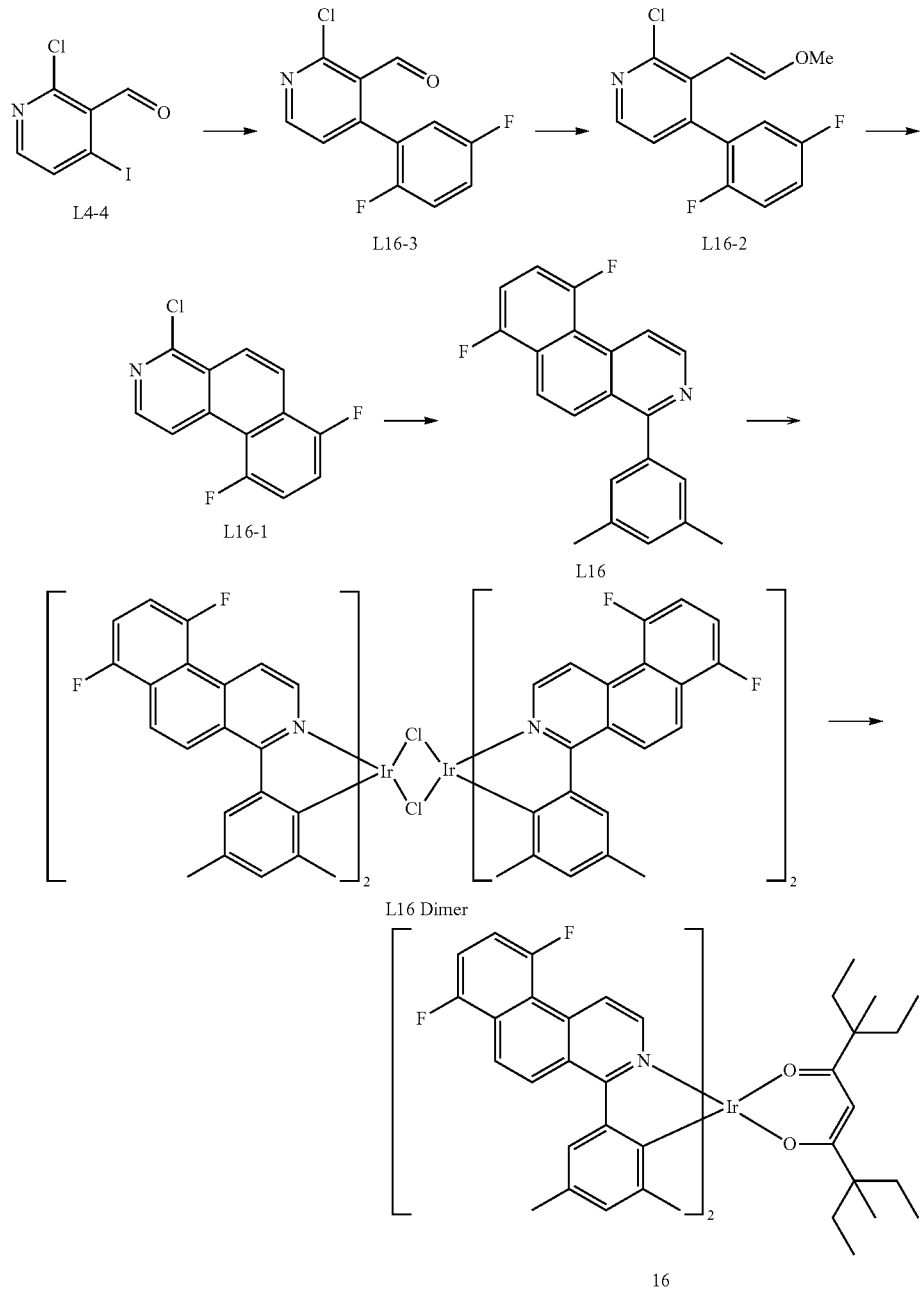

2.5 g (yield of 72%) of Intermediate L16-3 was prepared in the same manner as used to synthesize Intermediate L4-3 of Synthesis Example 1, except that 2,5-difluorophenylboronic acid was used instead of 3-fluorophenylboronic acid.
LC-MS m/z=268 (M+H)$^+$ Synthesis of Intermediate L16-2

2.6 g (yield of 98%) of Intermediate L16-2 was prepared in the same manner as used to synthesize Intermediate L4-2 of Synthesis Example 1, except that Intermediate L16-3 was used instead of Intermediate L4-3.
LC-MS m/z=282 (M+H)$^+$ Synthesis of Intermediate L16-1

0.9 g (yield of 38%) Intermediate L16-1 was prepared in the same manner as used to synthesize Intermediate L4-1 of Synthesis Example 1, except that Intermediate L16-2 was used instead of Intermediate L4-2.
LC-MS m/z=250 (M+H)$^+$ Synthesis of Intermediate L16

0.8 g of Intermediate L16 (yield of 75%) was prepared in the same manner as used to synthesize Intermediate L4 of Synthesis Example 1, except that Intermediate L16-1 was used instead of Intermediate L4-1.
LC-MS m/z=320 (M+H)⁺

Synthesis of Intermediate L16 Dimer

Intermediate L16 Dimer was prepared in the same manner as used to synthesize Intermediate L4 Dimer of Synthesis Example 1, except that Intermediate L16 was used instead of Intermediate L4.

Synthesis of Compound 16

0.6 g (yield of 40%) of Compound 16 was prepared in the same manner as used to synthesize Compound 4 of Synthesis Example 1, except that Intermediate L16 Dimer was used instead of Intermediate L4 Dimer.
LC-MS m/z=1071 (M+H)⁺

Synthesis Example 7 (Compound 18)

Synthesis of Intermediate L18-2

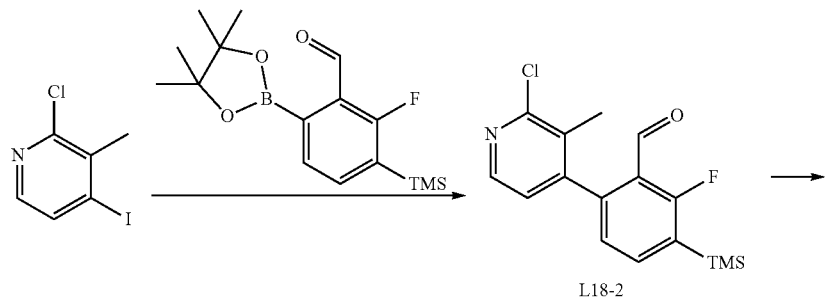

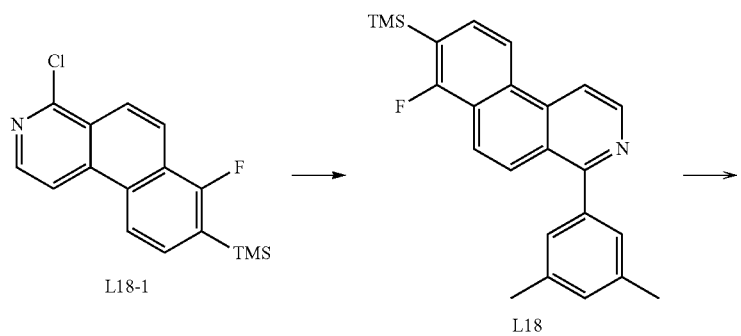

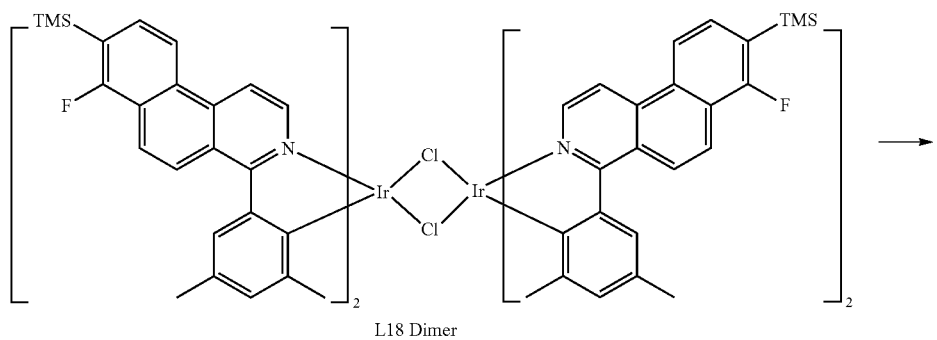

-continued

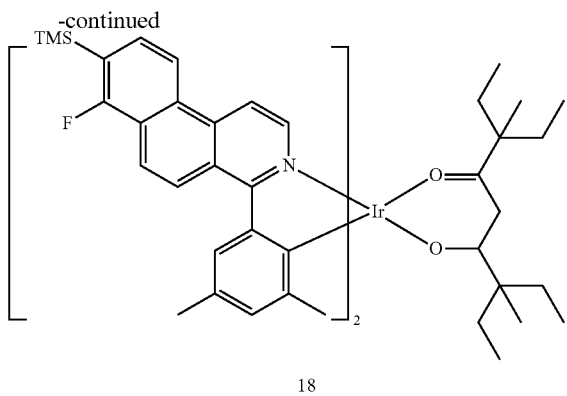

18

2.6 g (yield of 80%) of Intermediate L18-2 was prepared in the same manner as used to synthesize Intermediate L1-2 of Synthesis Example 2, except that 2-fluoro-6-(4,4,5,5-tetramethyl-1,3,2-dioxaborolan-2-yl)-3-(trimethylsilyl)benzaldehyde was used instead of 3-fluoro-2-formylphenyl) boronic acid.
LC-MS m/z=322 (M+H)$^+$ Synthesis of Intermediate L18-1

0.7 g (yield of 30%) of Intermediate L18-1 was prepared in the same manner as used to synthesize Intermediate L1-1 of Synthesis Example 2, except that Intermediate L18-2 was used instead of Intermediate L1-2.
LC-MS m/z=304 (M+H)$^+$ Synthesis of Intermediate L18

0.6 g (yield of 73%) of Intermediate L18 was prepared in the same manner as used to synthesize Intermediate L1 of Synthesis Example 2, except that Intermediate L18-1 was used instead of Intermediate L1-1.
LC-MS m/z=374 (M+H)$^+$ Synthesis of Intermediate L18 Dimer Intermediate L18 Dimer was prepared in the same manner as used to synthesize Intermediate L1 Dimer of Synthesis Example 2, except that Intermediate L18 was used instead of Intermediate L1.

Synthesis of Compound 18

0.4 g (yield of 40%) of Compound 18 was prepared in the same manner as used to synthesize Compound 1 of Synthesis Example 2, except that Intermediate L18 Dimer was used instead of Intermediate L1 Dimer.
LC-MS m/z=1180 (M+H)$^+$ Synthesis Example 8 (Compound 23)

Synthesis of Intermediate L23

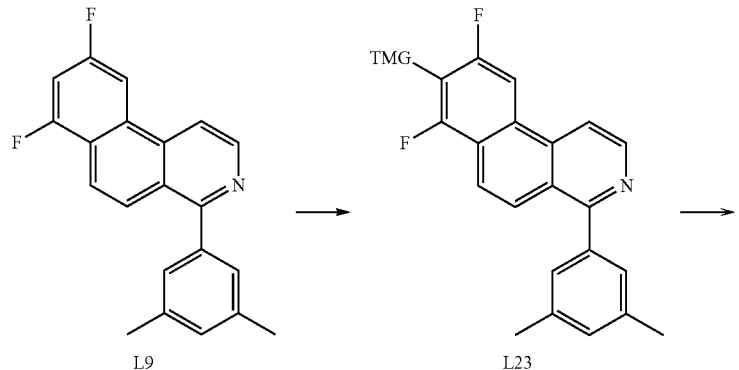

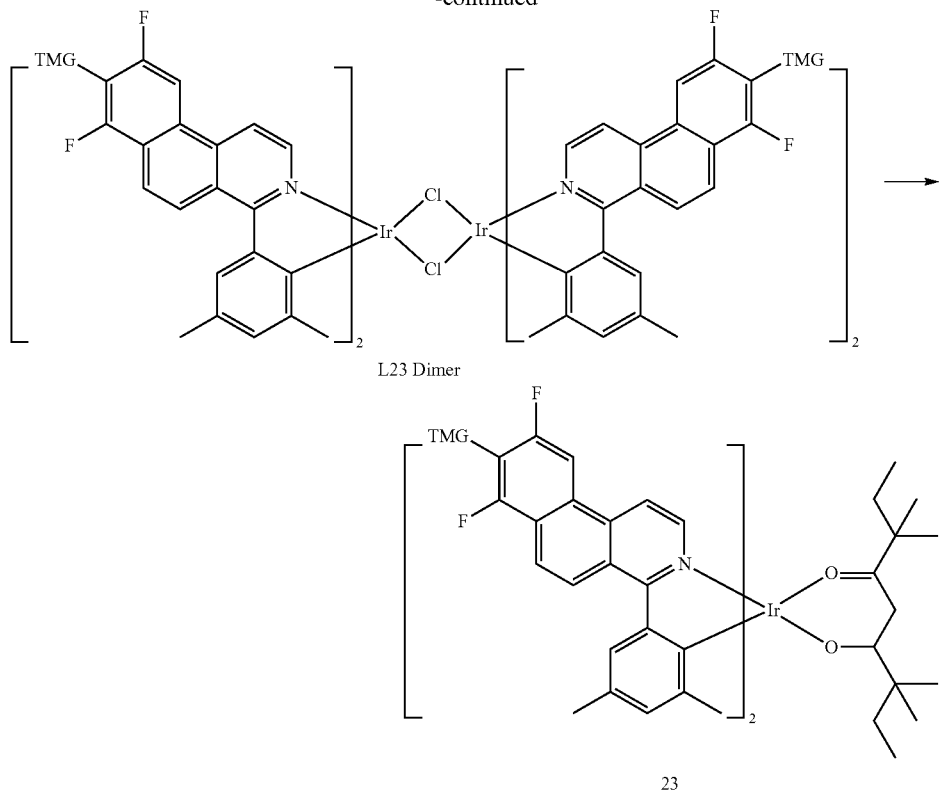

L23 Dimer

23

1.2 g (3.7 mmol) of Intermediate L9 was dissolved in 60 ml of anhydrous tetrahydrofuran (THF), and then, 2.4 ml (3.7 mmol) of 1.6 M BuLi solution in hexane was slowly added thereto at a temperature of −78° C. After about one hour, 0.7 ml (5.6 mmol) of chlorotrimethylgermane was slowly added dropwise thereto and stirred for 18 hours at room temperature. Once the reaction was completed, 50 ml of ethyl acetate and a saturated sodium thiosulfate aqueous solution were added thereto to extract an organic layer, which was then dried by using magnesium sulfate and distilled under reduced pressure. The crude product was purified by liquid chromatography to obtain 1.2 g (yield of 76%) of Intermediate L23.
LC-MS m/z=438 (M+H)$^+$ Synthesis of Intermediate L23 Dimer Intermediate L23 Dimer was prepared in the same manner as used to synthesize Intermediate L6 Dimer of Synthesis Example 3, except that Intermediate L23 was used instead of Intermediate L6.

Synthesis of Compound 23

0.8 g (yield of 45%) of Compound 23 was prepared in the same manner as used to synthesize Compound 6 of Synthesis Example 3, except that Intermediate L23 Dimer was used instead of Intermediate L6 Dimer.
LC-MS m/z=1279 (M+H)$^+$ Synthesis Example 9 (Compound 28)

Synthesis of Intermediate L28-6

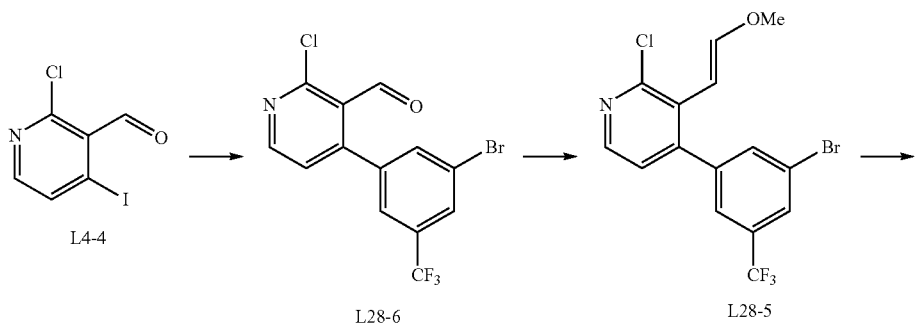

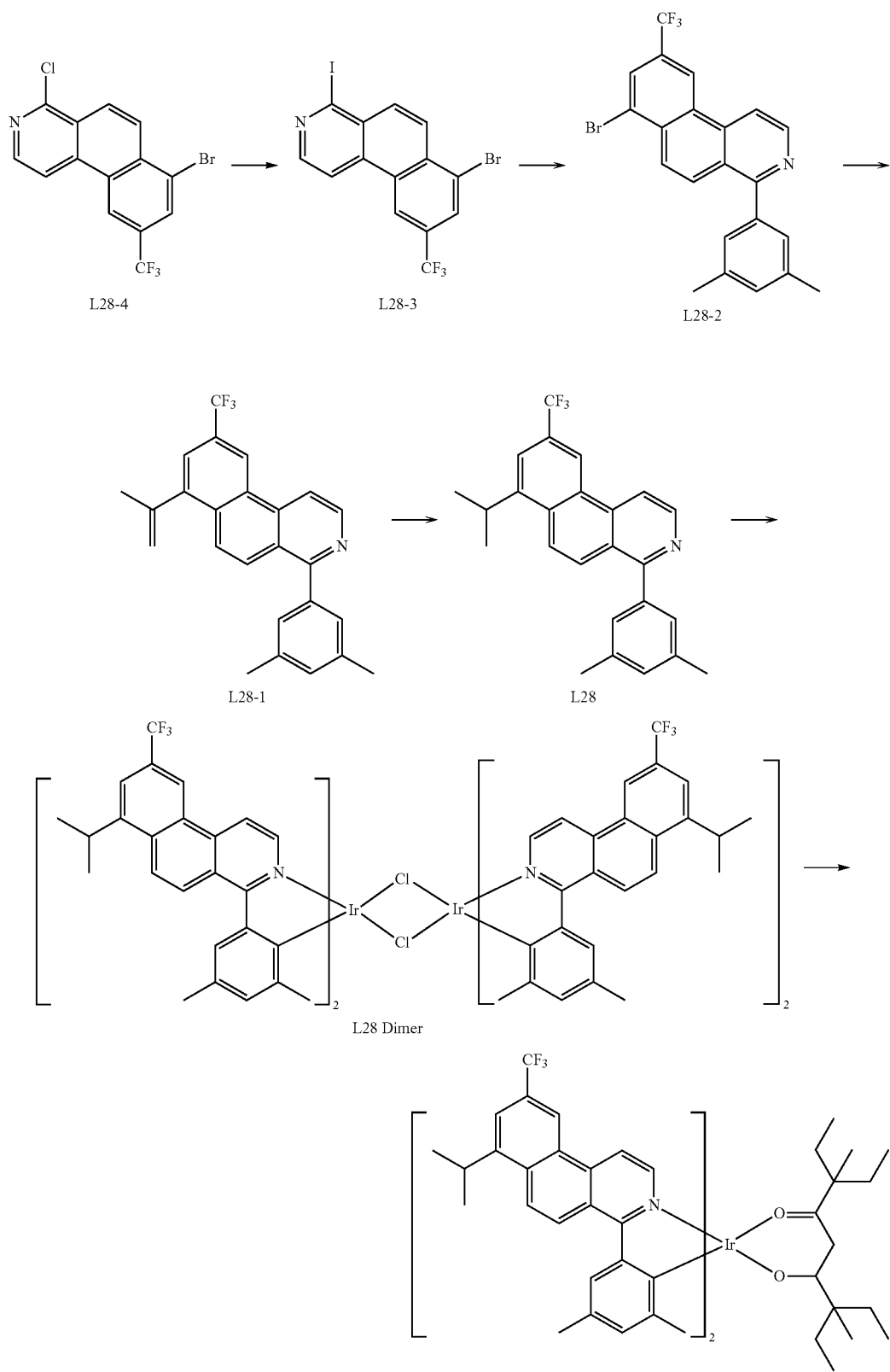

6.2 g (yield of 71%) of Intermediate L28-6 was prepared in the same manner as used to synthesize Intermediate L4-3 of Synthesis Example 1, except that 3-bromo-5-(trifluoromethyl)phenyl)boronic acid was used instead of 3-fluorophenylboronic acid.

LC-MS m/z=364 (M+H)$^+$

Synthesis of Intermediate L28-5

6.5 g (yield of 98%) of Intermediate L28-5 was prepared in the same manner as used to synthesize Intermediate L4-2 of Synthesis Example 1, except that Intermediate L28-6 was used instead of Intermediate L4-3.

LC-MS m/z=392 (M+H)$^+$

Synthesis of Intermediate L28-4

2.1 g (yield of 35%) of Intermediate L28-4 was prepared in the same manner as used to synthesize Intermediate L4-1 of Synthesis Example 1, except that Intermediate L28-5 was used instead of Intermediate L4-2.

LC-MS m/z=360 (M+H)$^+$

Synthesis of Intermediate L28-3

2.1 g (5.9 mmol) of Intermediate L28-4 was mixed with 120 ml of acetonitrile, and then, 1.1 ml (8.9 mmol) of chlorotrimethylsilane and 1.3 g (8.9 mmol) of NaI were added thereto and then heated while refluxing for 36 hours at a temperature of 90° C. Once the reaction was completed, 60 ml of ethyl acetate and a saturated sodium thiosulfate aqueous solution were added thereto to extract an organic layer, which was then dried by using magnesium sulfate and distilled under reduced pressure. The crude product was purified by liquid chromatography to obtain 2.3 g (yield of 87%) of Intermediate L28-3.

LC-MS m/z=452 (M+H)$^+$

Synthesis of Intermediate L28-2

1.8 g (yield of 80%) Intermediate L28-2 was prepared in the same manner as used to synthesize Intermediate L4 of Synthesis Example 1, except that Intermediate L28-3 was used instead of Intermediate L4-1.

LC-MS m/z=430 (M+H)$^+$

Synthesis of Intermediate L28-1

1.8 g (4.2 mmol) of Intermediate L28-2 was mixed with 60 ml of tetrahydrofuran (THF) and 15 ml of water, and then, 0.9 g (5.0 mmol) of 4,4,5,5-tetramethyl-2-(prop-1-en-2-yl)-1,3,2-dioxaborolane, 0.1 g (0.4 mmol) of Pd(OAc)$_2$, 0.3 g (0.8 mmol) of Sphos, and 1.5 g (10.5 mmol) of K$_2$CO$_3$ were added thereto, and heated while refluxing at a temperature of 80° C. for 18 hours. When the reaction was completed, an organic layer, obtained by performing an extraction process on the reaction mixture by using 50 ml of ethyl acetate, was dried by using magnesium sulfate, distilled under reduced pressure, and purified by liquid chromatography to obtain 1.2 g (yield of 75%) of Intermediate L28-1.

LC-MS m/z=392 (M+H)$^+$

Synthesis of Intermediate L28

1.2 g (3.1 mmol) of Intermediate L28-1 was mixed with 60 ml of ethanol, and then, 0.1 g (10 wt %) of Pd/C was added thereto, and hydrogen was injected thereto, followed by 18 hours of mixing at room temperature. When the reaction was completed, the reaction mixture was allowed to pass through a celite pad and then concentrated under reduced pressure, and then, purified by liquid chromatography to obtain 1.1 g (yield of 90%) of Intermediate L28.

LC-MS m/z=394 (M+H)$^+$

Synthesis of Intermediate L28 Dimer

Intermediate L28 Dimer was prepared in the same manner as used to synthesize Intermediate L1 Dimer of Synthesis Example 2, except that Intermediate L28 was used instead of Intermediate L1.

Synthesis of Compound 28

0.6 g (yield of 38%) of Compound 28 was prepared in the same manner as used to synthesize Compound 2 of Synthesis Example 1, except that Intermediate L28 Dimer was used instead of Intermediate L1 Dimer.

LC-MS m/z=1219 (M+H)$^+$

Synthesis Example 10 (Compound 20)

Synthesis of Intermediate L20-3

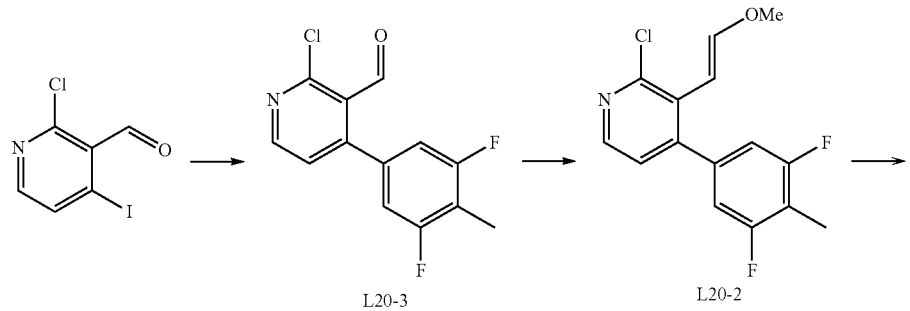

-continued

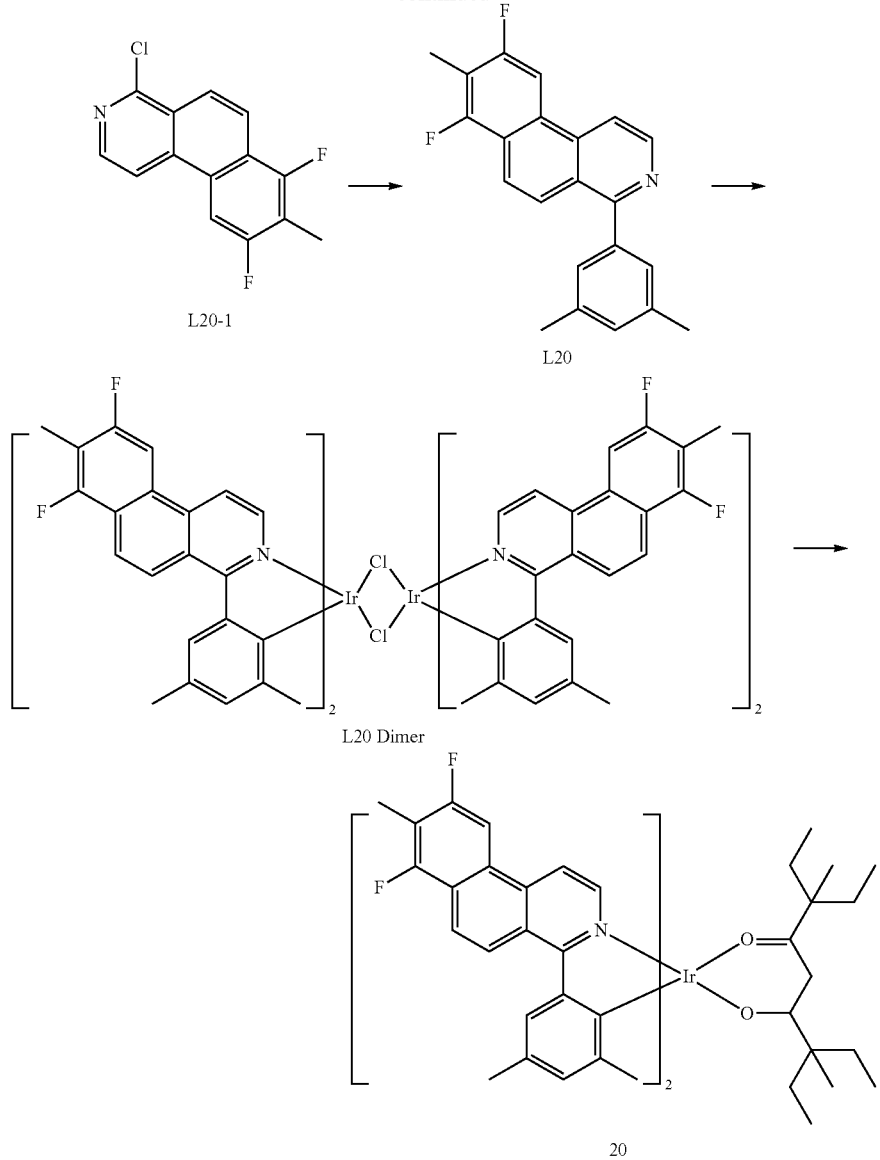

1.8 g (yield of 80%) of Intermediate L20-3 was prepared in the same manner as used to synthesize Intermediate L4-3 of Synthesis Example 1, except that (3,5-difluoro-4-methylphenyl)boronic acid was used instead of 3-fluorophenylboronic acid.

LC-MS m/z=268 (M+H)$^+$

Synthesis of Intermediate L20-2

1.9 g (yield of 97%) of Intermediate L20-2 was prepared in the same manner as used to synthesize Intermediate L4-2 of Synthesis Example 1, except that Intermediate L20-3 was used instead of Intermediate L4-3.

LC-MS m/z=296 (M+H)$^+$

Synthesis of Intermediate L20-1

0.8 g (yield of 47%) of Intermediate L20-1 was prepared in the same manner as used to synthesize Intermediate L4-1 of Synthesis Example 1, except that Intermediate L20-2 was used instead of Intermediate L4-2.

LC-MS m/z=264 (M+H)$^+$

Synthesis of Intermediate L20

0.8 g (yield of 84%) of Intermediate L20 was prepared in the same manner as used to synthesize Intermediate L4 of Synthesis Example 1, except that Intermediate L20-1 was used instead of Intermediate L4-1.

LC-MS m/z=333 (M+H)$^+$

Synthesis of Intermediate L20 Dimer

Intermediate L20 Dimer was prepared in the same manner as used to synthesize Intermediate L4 Dimer of Synthesis Example 1, except that Intermediate L20 was used instead of Intermediate L4.

Synthesis of Compound 20

0.5 g (yield of 40%) of Compound 20 was prepared in the same manner as used to synthesize Compound 4 of Synthesis Example 1, except that Intermediate L20 Dimer was used instead of Intermediate L4 Dimer.

LC-MS m/z=1099 (M+H)$^+$

Synthesis Example 11 (Compound 23)

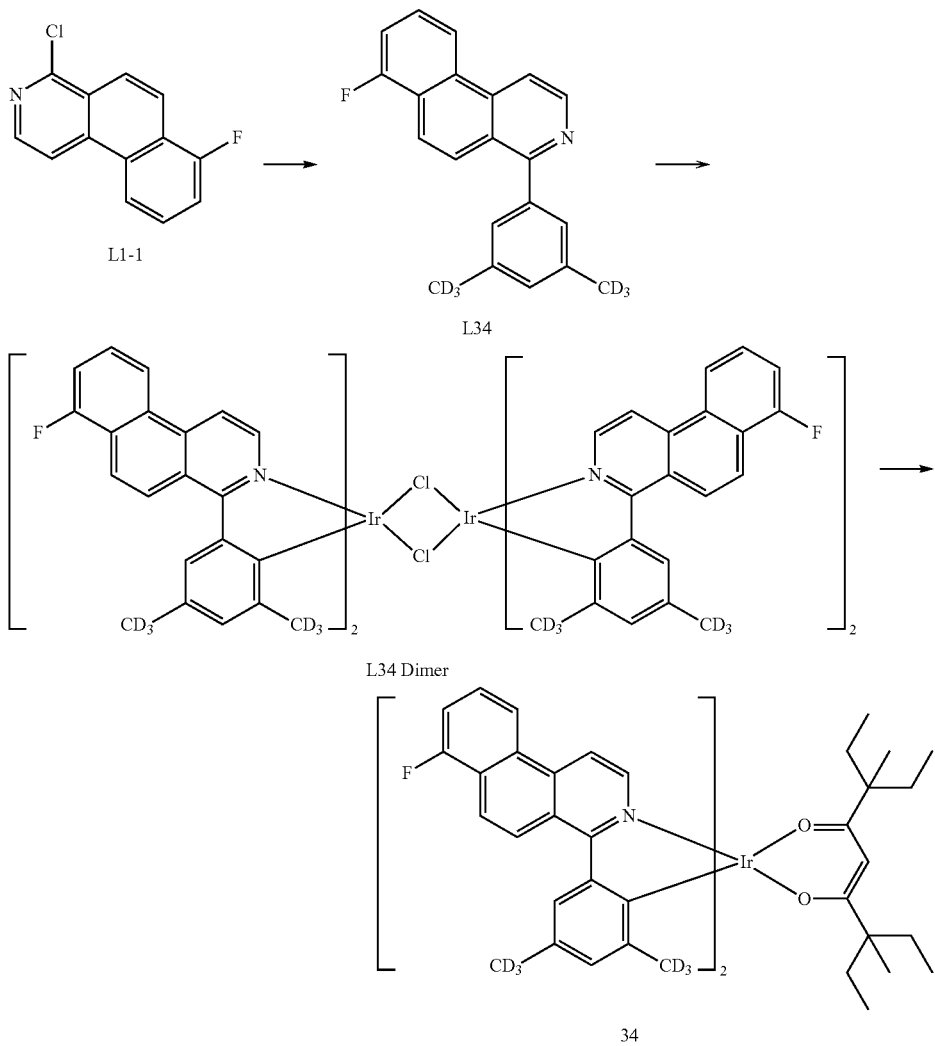

Synthesis of Intermediate L34

1.0 g (yield of 78%) of Intermediate L34 was prepared in the same manner as used to synthesize Intermediate L1 of Synthesis Example 2, except that (3,5-bis(methyl-d3)phenyl)boronic acid was used instead of 3,5-Dimethylphenylboronic acid.

LC-MS m/z=308 (M+H)$^+$

Synthesis of Intermediate L34 Dimer

Intermediate L34 Dimer was prepared in the same manner as used to synthesize Intermediate L4 Dimer of Synthesis Example 1, except that Intermediate L34 was used instead of Intermediate L4.

Synthesis of Compound 34

0.8 g (yield of 52%) of Compound 34 was prepared in the same manner as used to synthesize Compound 4 of Synthesis Example 1, except that Intermediate L34 Dimer was used instead of Intermediate L4 Dimer.

LC-MS m/z=1045 (M+H)$^+$

Evaluation Example 1: Evaluation of Photoluminescence Quantum Yields (PLQY)

Compound H52 and Compound 4 were co-deposited at a vacuum pressure of 10$^{-7}$ torr and at a weight ratio of 98:2 to produce a 40 nm-thick film.

The PLQY of Compound 4 in film was evaluated by using a Hamamatsu Photonics absolute PL quantum yield measurement system equipped with a xenon light source, a monochromator, a photonic multichannel analyzer, and an integrating sphere, and using PLQY measurement software (Hamamatsu Photonics, Ltd., Shizuoka, Japan). The results thereof are shown in Table 1.

The PLQY of each of Compounds 1, 6, 7, 9, 16, 18, 23, 28, 34, A1, B1, and C1 were performed, and the results thereof are shown in Table 1.

TABLE 1

| Compound No. | PLQY in film (%) |
| --- | --- |
| 4 | 99 |
| 1 | 99 |
| 6 | 99 |
| 7 | 98 |
| 9 | 99 |
| 16 | 97 |
| 18 | 97 |
| 23 | 98 |
| 28 | 99 |
| 34 | 99 |
| A1 | 90 |
| B1 | 88 |
| C1 | 90 |

4

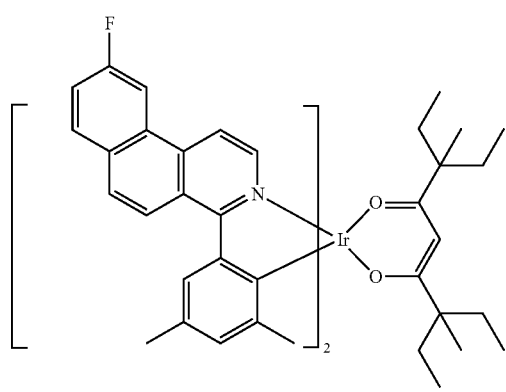

1

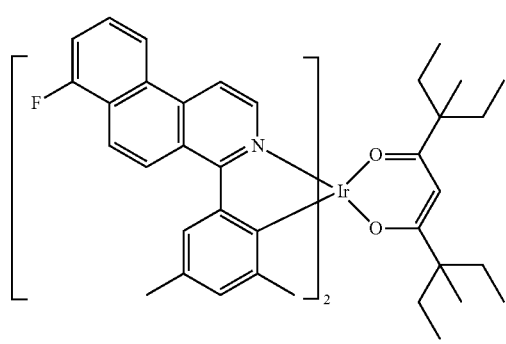

6

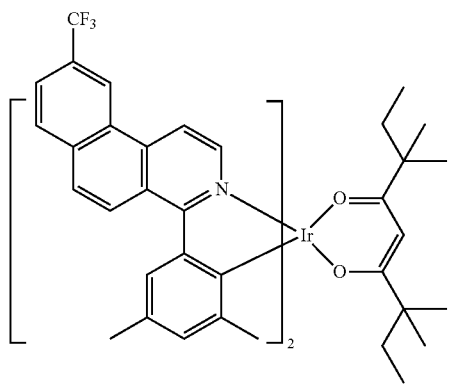

7

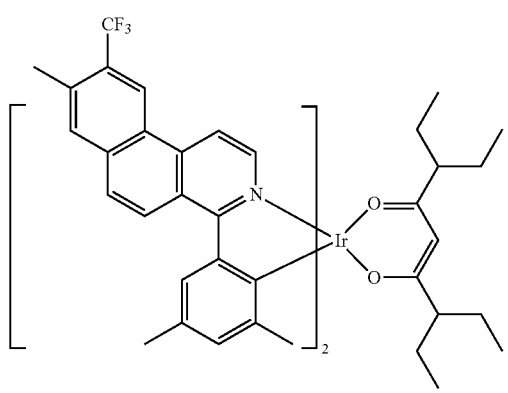

9

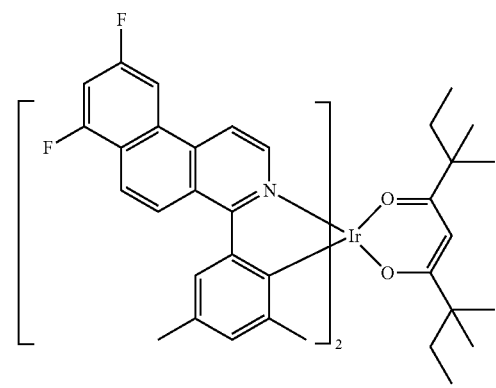

16

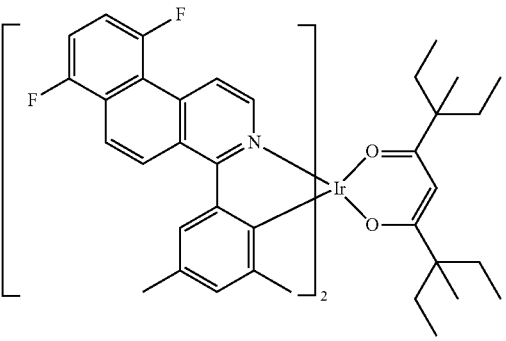

18
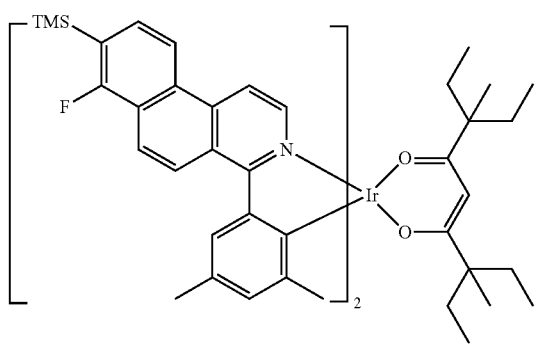
A1
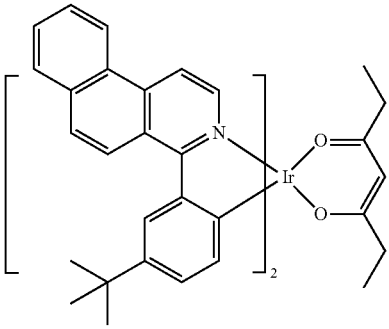
23
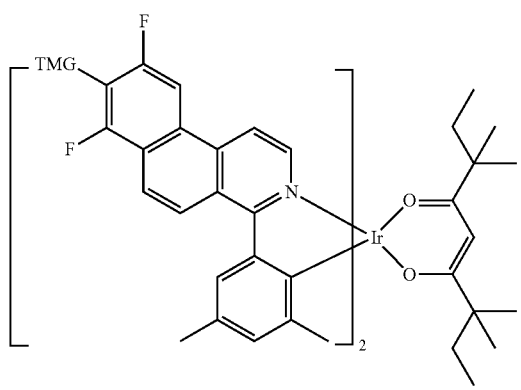
B1
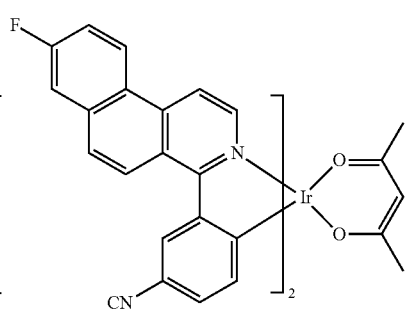
28
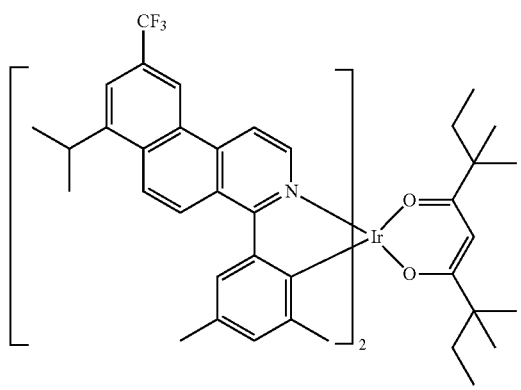
C1
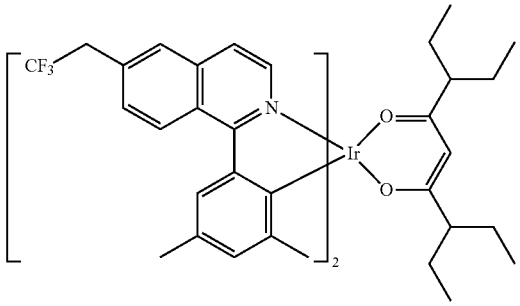
H52
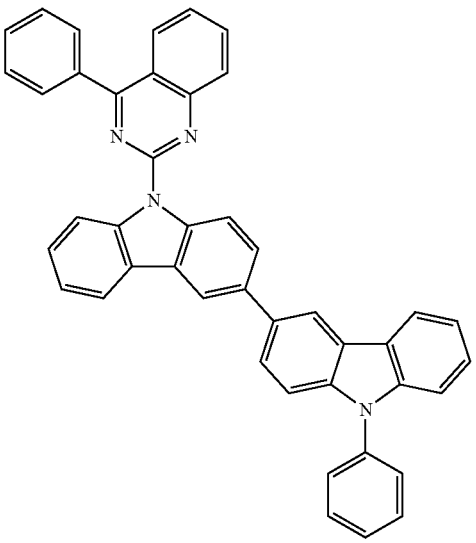
34
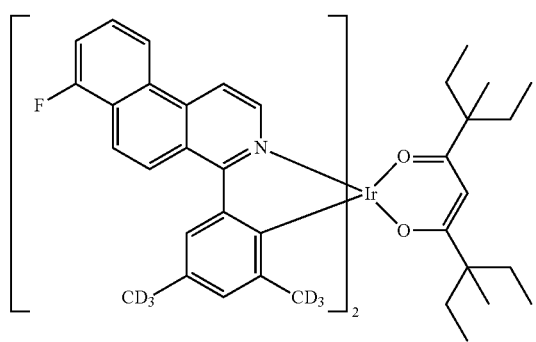
From Table 1, it was confirmed that Compounds 4, 1, 6, 7, 9, 16, 18, 23, 28 and 34 showed better PLQY characteristics than Compounds A1, B1, and C1.

Evaluation Example 2: Evaluation of Horizontal Orientation Ratio (Optical Orientation Ratio)

In a vacuum deposition apparatus having a vacuum pressure of $1\times10^{-7}$ torr, Compound H52 and Compound 4 were co-deposited on a fused silica layer (thickness of 1 mm) at a weight ratio of 98:2 to form a 40 nm thick film. Then, the film was sealed with glass and glue under a nitrogen atmosphere.

Meanwhile, an angle-dependent PL measuring apparatus having the structure shown in FIG. 3 of KR application 2013-0150834 was prepared. Specific specifications are as follows:

Excitation-light wavelength: 325 nm

Excitation-light source: He—Cd laser, Melles Griot, Inc.

Excitation-light irradiation member: optical fiber, diameter of 1 mm, Thorlabs, Inc.

Semi-cylindrical prism: fused silica, diameter of 100 mm, and length of 30 mm,

Emitted-light detection member: photomultiplier tube, Acton, Inc.

Polarizer mounted on emitted-light detection member: Linear polarizer, Thorlabs, Inc.

Recording apparatus SpectraSense, Acton, Inc.

Excitation-light incident angle: $\theta P=45°$, $\theta H=0°$

Distance from a sample to an emitted-light detection member (or radius of travel path of emitted-light detection member): 900 mm Then, the film was fixed on the semi-cylindrical lens and irradiated with a 325 nm laser to emit light. The emitted light was guided to pass through a polarizing film and the p-polarized photoluminescence intensity was measured with respect to light at a Max wavelength of the spectrum of 90 degrees to 0 degree by rotating the semi-cylindrical lens on which the sample is fixed by 1 degree with respect to the axis of the lens by using a charge-coupled device (CCD).

A p-polarized photoluminescence intensity which is shown when each compound has a vertical orientation (first p-polarized photoluminescence intensity), and a p-polarized photoluminescence intensity which is shown when each compound has a horizontal orientation (second p-polarized photoluminescence intensity) were each calculated from at the degree of 0 to the degree of 90. A weighted value where a p-polarized photoluminescence intensity obtained by multiplying each of the first and second p-polarized photoluminescence intensities with a weighted value matches with a measured p-polarized photoluminescence intensity, was identified to measure the horizontal orientation ratio of compounds shown in Table 2. The results thereof are shown in Table 2. In this case, the angle-dependent photoluminescence spectrum was analyzed using a classical dipole model, in which the emission from excitons is regarded as the dissipated power consumed from the oscillating dipole, to evaluate the horizontal orientation ratio with respect to Compound 4.

The horizontal orientation ratio of each of Compounds 1, 6, 7, 9, 16, 18, 23, 28, 34, A1, B1, and C1 were performed, and the results thereof are shown in Table 2.

TABLE 2

| Co-Deposition Materials | Horizontal orientation ratio (optical orientation ratio) (%) |
|---|---|
| H52 Compound 4 (2 wt %) | 91 |
| H52 Compound 1 (2 wt %) | 91 |
| H52 Compound 6 (2 wt %) | 91 |
| H52 Compound 7 (2 wt %) | 93 |
| H52 Compound 9 (2 wt %) | 92 |
| H52 Compound 16 (2 wt %) | 91 |
| H52 Compound 18 (2 wt %) | 93 |
| H52 Compound 23 (2 wt %) | 94 |
| H52 Compound 28 (2 wt %) | 93 |
| H52 Compound 34 (2 wt %) | 91 |
| H52 Compound A1 (2 wt %) | 83 |
| H52 Compound B1 (2 wt %) | 82 |
| H52 Compound C1 (2 wt %) | 88 |

From Table 2, it was confirmed that Compounds 4, 1, 6, 7, 9, 16, 18, 23, 28 and 34 showed better horizontal orientation ratio characteristics than Compounds A1, B1, and C1.

Example 1

The ITO-patterned glass substrate as an anode was cut into a size of 50 mm×50 mm×0.5 mm, ultrasonically cleaned with isopropyl alcohol and pure water, each for 5 minutes, and then irradiated with ultraviolet light for 30 minutes and cleaned by exposure to ozone. Then, the resultant substrate was mounted on a vacuum deposition apparatus.

HT3 and F6TCNNQ were vacuum co-deposited on the ITO anode at the weight ratio of 98:2 to form a hole injection layer having a thickness of 100 Å, HT3 was vacuum-deposited on the hole injection layer to form a hole transport layer having a thickness of 1350 Å, and then, HT21 was vacuum-deposited on the hole transport layer to form an electron blocking layer having a thickness of 300 Å.

Then, H52 (host) and Compound 4 (dopant) were co-deposited at a weight ratio of 98:2 on the electron blocking layer to form an emission layer having a thickness of 400 Å.

Then, ET3 and ET-D1 were co-deposited at a volume ratio of 50:50 on the emission layer to form an electron transport layer having a thickness of 350 Å, and ET-D1 was vacuum-deposited on the electron transport layer to form an electron injection layer having a thickness of 10 Å, and Al was vacuum-deposited on the electron injection layer to form a cathode having a thickness of 1000 Å, thereby completing the manufacture of an organic light-emitting device having the structure of ITO (1500 Å)/HT3+F6TCNNQ (2 wt %) (100 Å)/HT3 (1350 Å)/HT21 (300 Å)/H52+Compound 4 (2 wt %) (400 Å) /ET3+ET-D1 (50%) (350 Å)/ET-D1 (10 Å)/Al (1000 Å).

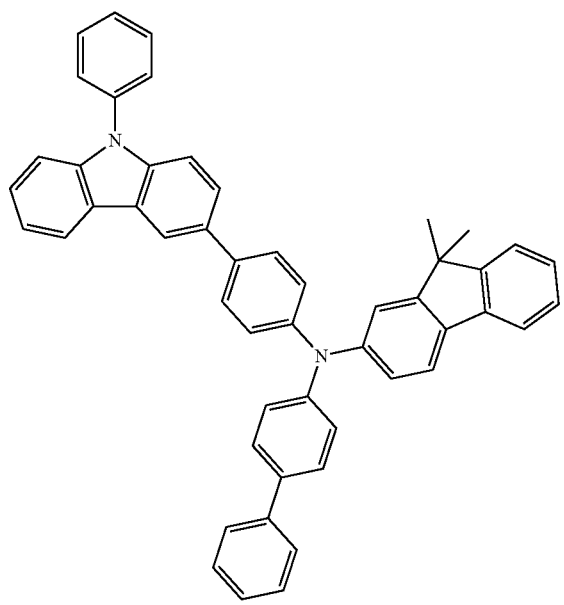

HT3

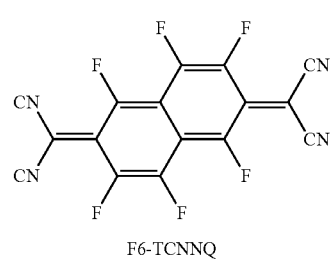

F6-TCNNQ

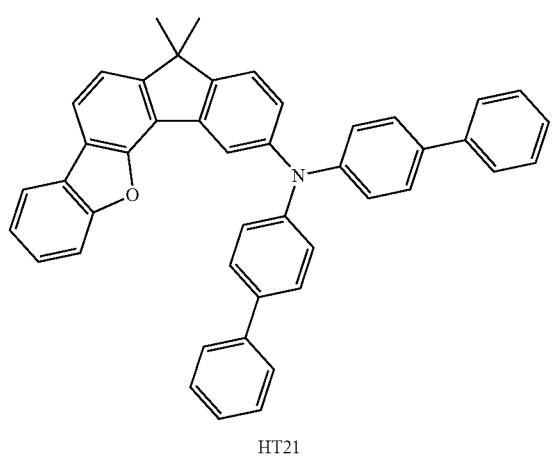

HT21

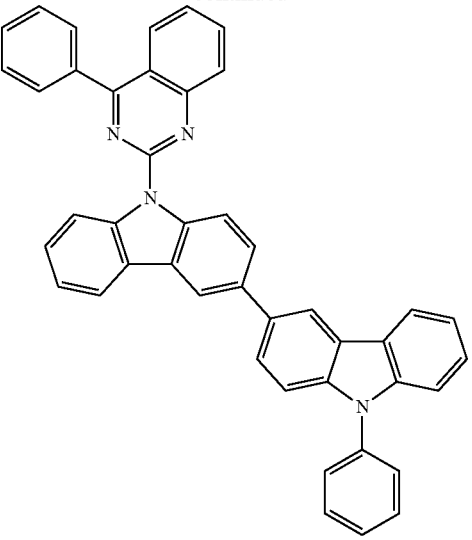

H52

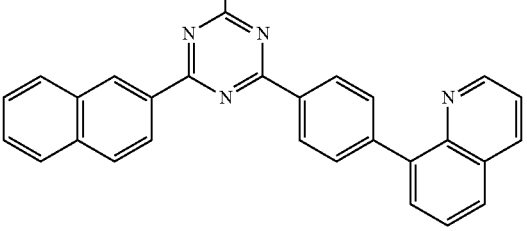

ET3

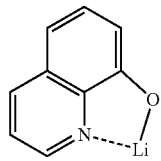

ET-D1

Examples 2 to 10 and Comparative Examples A1 to C1

Organic light-emitting devices were manufactured in the same manner as in Example 1, except that in forming an emission layer, for use as a dopant, corresponding compounds shown in Table 3 were used instead of Compound 4.

Evaluation Example 3: Evaluation on Characteristics of Organic Light-Emitting Device The driving voltage, current density, maximum external quantum efficiency (Max EQE), FWHM and maximum emission wavelength (peak emission wavelength) of the EL spectrum ($\lambda_{max}$) and lifespan ($LT_{97}$) of each of the organic light-emitting devices manufactured according to Examples 1 to 10 and Comparative Examples A1 to C1 were evaluated. The results thereof are shown in Tables 3 and 4. This evaluation was performed using a current-voltage meter (Keithley 2400) and a luminescence meter (Minolta Cs-1,000A), and the lifespan ($LT_{97}$)(at 3500 nit) was evaluated for each organic light-emitting device by measuring the amount of time that elapsed until luminescence was reduced to 97% of the initial luminescence of 100%, and expressed as a relative value (%).

TABLE 3

| | Dopant in emission layer Compound No. | Driving voltage (V) | Current density (mA/cm$^2$) | Max EQE (%) | FWHM (nm) |
|---|---|---|---|---|---|
| Example 1 | 4 | 4.2 | 10 | 29 | 50 |
| Example 2 | 1 | 4.2 | 10 | 29 | 50 |
| Example 3 | 6 | 4.0 | 10 | 28 | 52 |
| Example 4 | 7 | 4.0 | 10 | 30 | 52 |
| Example 5 | 9 | 3.8 | 10 | 31 | 53 |
| Example 6 | 16 | 4.1 | 10 | 30 | 52 |
| Example 7 | 18 | 4.0 | 10 | 32 | 51 |
| Example 8 | 23 | 3.9 | 10 | 31 | 50 |
| Example 9 | 28 | 4.1 | 10 | 30 | 54 |
| Example 10 | 34 | 4.2 | 10 | 29 | 49 |
| Comparative Example A1 | A1 | 4.5 | 10 | 25 | 76 |
| Comparative Example B1 | B1 | 4.7 | 10 | 22 | 78 |
| Comparative Example C1 | C1 | 4.4 | 10 | 24 | 65 |

TABLE 4

| | Dopant compound No. in Emission layer | $\lambda_{max}$ (nm) | Lifespan ($LT_{97}$) (Relative value, %) |
|---|---|---|---|
| Example 1 | 4 | 622 | 200 |
| Example 2 | 1 | 622 | 185 |
| Example 3 | 6 | 625 | 160 |
| Example 4 | 7 | 623 | 180 |
| Example 5 | 9 | 629 | 230 |
| Example 6 | 16 | 622 | 150 |
| Example 7 | 18 | 624 | 130 |
| Example 8 | 23 | 627 | 140 |
| Example 9 | 28 | 626 | 170 |
| Example 10 | 34 | 622 | 300 |
| Comparative Example A1 | A1 | 614 | 90 |
| Comparative Example B1 | B1 | 605 | 95 |
| Comparative Example C1 | C1 | 631 | 70 |

-continued

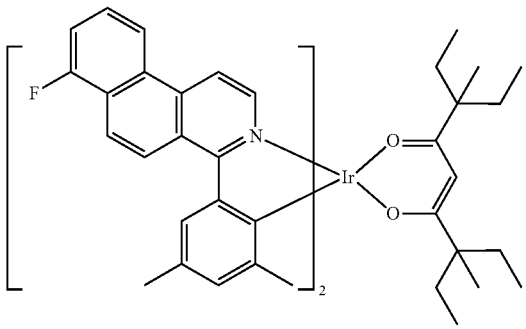

1

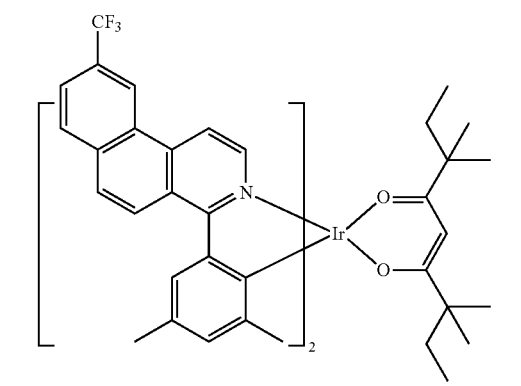

6

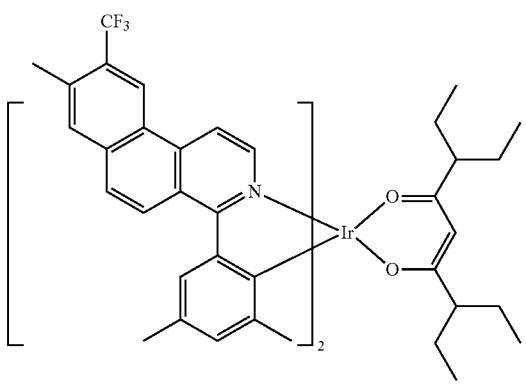

7

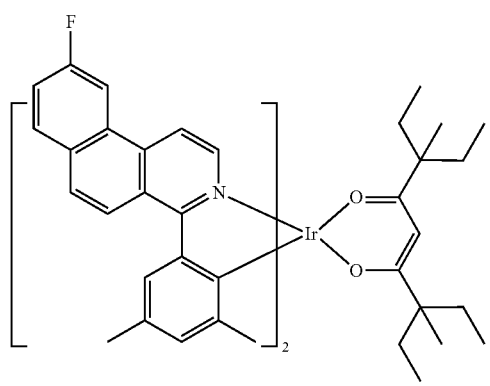

4

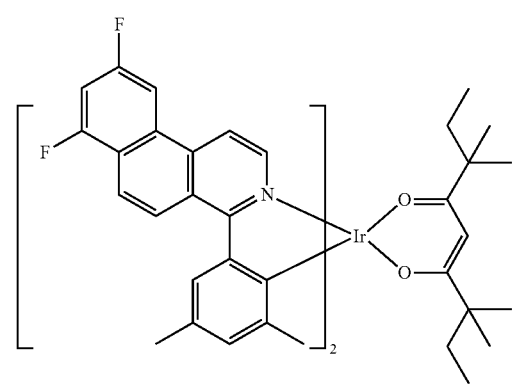

9

-continued

16
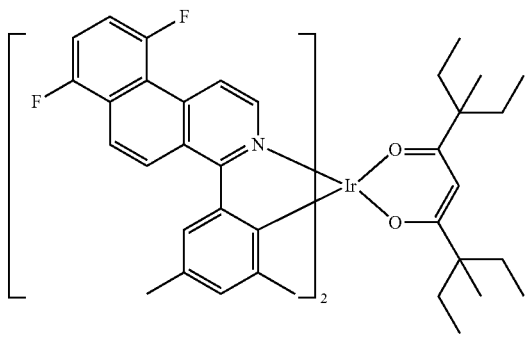

18
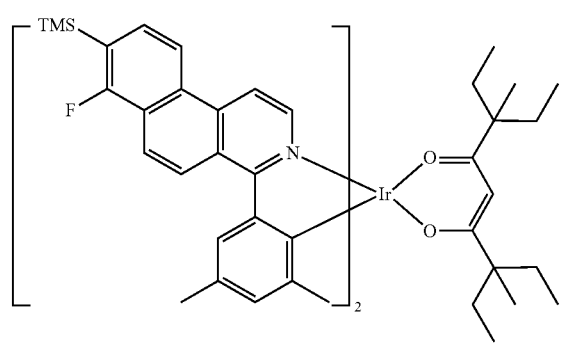

23
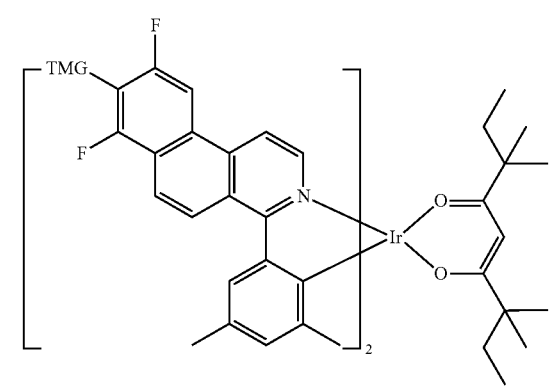

28
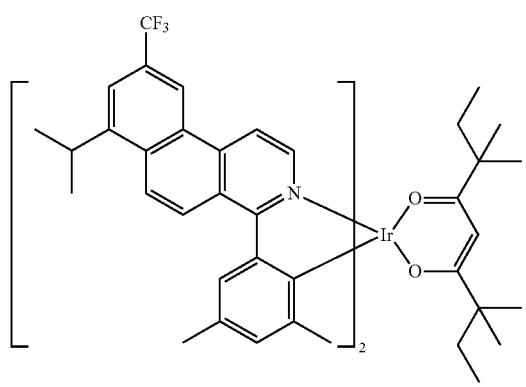

-continued

34
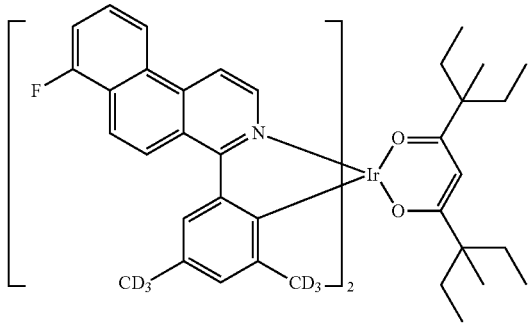

A1
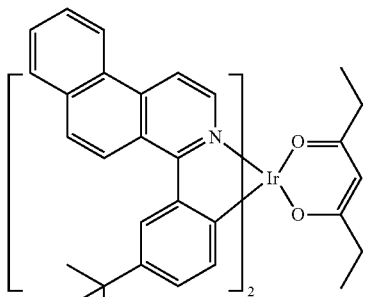

B1
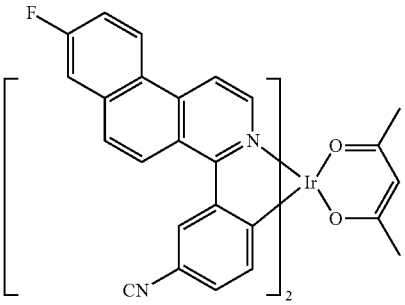

C1
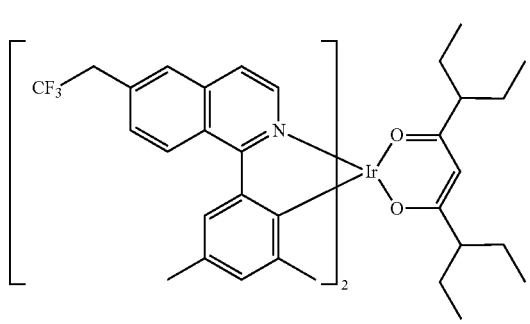

Referring to Tables 3 and 4, the FWHM of light emitted from the organic light-emitting devices of Examples 1 to 10 was smaller than the FWHM of light emitted from the organic light-emitting devices of Comparative Examples A1 to C1. Accordingly, it was confirmed that the organic light-emitting devices of Examples 1 to 10 had higher color purity levels than the organic light-emitting devices of Comparative Examples A1 to C1. It was confirmed that the organic light-emitting devices of Example 1 to 10 have improved characteristics compared to the organic light-emitting device of Comparative Example A1 to $C_1$ in terms of the driving voltage, external quantum efficiency, and lifespan.

The organometallic compounds, according to embodiments of the disclosure, have excellent characteristics in terms of quantum luminescence efficiency and the horizontal orientation ratio. Thus, the emission peak of the electroluminescent spectrum of an organic light-emitting device including the organometallic compounds has a relatively narrow FWHM, and an organic light-emitting device including the organometallic compound may have excellent external quantum efficiency and lifespan characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the FIGURES, it will be understood by those of ordinary skill in the art that various changes in form and details may be made therein without departing from the spirit and scope as defined by the following claims.

What is claimed is:

1. An organometallic compound represented by Formula 1:

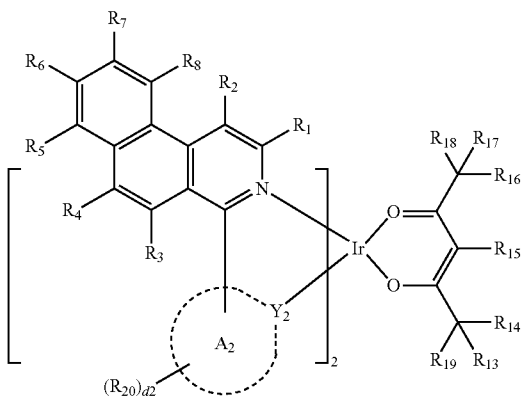

wherein, in Formula 1,
$Y_2$ is C,
a group represented by

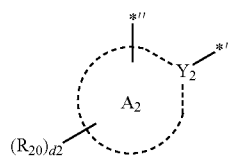

in Formula 1 is a group represented by Formula A(1):

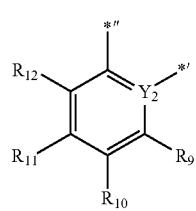

A(1)

wherein, in Formula A(1), $R_9$ and $R_{11}$ are each independently be a $C_1$-$C_{29}$ alkyl group, a $C_3$-$C_{10}$ cycloalkyl group, or a $C_2$-$C_{10}$ heteroalkyl group, each unsubstituted or substituted with deuterium, a $C_1$-$C_{20}$ alkyl group, a $C_3$-$C_{10}$ cycloalkyl group, a $C_2$-$C_{10}$ heteroalkyl group, or any combination thereof and $R_{10}$ and $R_{12}$ are each independently hydrogen or deuterium,

*' indicates a binding site or Ir in Formula 1, and
*'' indicates a binding site to a neighboring atom in Formula 1,
wherein, in Formula 1 and A(1),
$R_1$ to $R_8$; and $R_{13}$ to $R_{17}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$),
provided that at least one of $R_1$ to $R_8$ is —F;
$R_{18}$ and $R_{19}$ are each independently a substituted or unsubstituted $C_2$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group,
two or more of $R_1$ to $R_8$ are optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$,
two or more of $R_{13}$ to $R_{19}$ are optionally linked to form a $C_5$-$C_{30}$ carbocyclic group which is unsubstituted or substituted with at least one $R_{1a}$ or a $C_1$-$C_{30}$ heterocyclic group which is unsubstituted or substituted with at least one $R_{1a}$,
$R_{1a}$ is the same as explained in connection with $R_2$,
a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —Ge(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), —P(=O)(Q$_{28}$)(Q$_{29}$), —P(Q$_{28}$)(Q$_{29}$), or any combination thereof;

—N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$); or any combination thereof, wherein Q$_1$ to Q$_9$, Q$_{11}$ to Q$_{19}$, Q$_{21}$ to Q$_{29}$, and Q$_{31}$ to Q$_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group, unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_2$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group, unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein $R_1$ to $R_8$, $R_{13}$ to $R_{17}$ are each independently hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_2$-$C_{10}$ heterocycloalkyl group, —Si(Q$_3$)(Q$_4$)(Q$_5$), or —Ge(Q$_3$)(Q$_4$)(Q$_5$).

3. The organometallic compound of claim 1, wherein $R_1$ to $R_8$ and $R_{13}$ to $R_{17}$ are each independently:
hydrogen, deuterium, or —F;
a $C_1$-$C_{20}$ alkyl group, a $C_3$-$C_{10}$ cycloalkyl group, or a $C_2$-$C_{10}$ heterocycloalkyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, or any combination thereof; or
—Si(Q$_3$)(Q$_4$)(Q$_5$) or —Ge(Q$_3$)(Q$_4$)(Q$_5$).

4. The organometallic compound of claim 1, wherein $R_{18}$ and $R_{19}$ are each independently an unsubstituted or substituted $C_2$-$C_{60}$ alkyl group, an unsubstituted or substituted $C_3$-$C_{10}$ cycloalkyl group, or an unsubstituted or substituted $C_2$-$C_{10}$ heterocycloalkyl group.

5. The organometallic compound of claim 1, wherein $R_{18}$ and $R_{19}$ are each independently a $C_2$-$C_{20}$ alkyl group, a $C_3$-$C_{10}$ cycloalkyl group, or a $C_2$-$C_{10}$ heterocycloalkyl group, each unsubstituted or substituted with deuterium, —F, a $C_1$-$C_{20}$ alkyl group, a $C_3$-$C_{10}$ cycloalkyl group, a $C_2$-$C_{10}$ heterocycloalkyl group, or any combination thereof.

6. The organometallic compound of claim 1, wherein at least one of $R_4$ to $R_8$ is a fluoro group (—F).

7. The organometallic compound of claim 1, wherein one or two of $R_1$ to $R_8$ is a fluoro group (—F), and at least one of $R_1$ to $R_8$ i) does not comprise a fluoro group (—F), and ii) is not hydrogen.

8. The organometallic compound of claim 1, wherein a group represented by

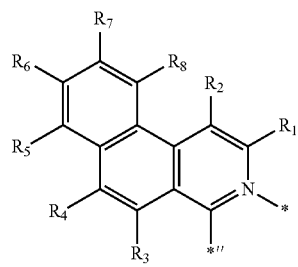

in Formula 1 is a group represented by one of Formulae CY1 to CY88:
CY1
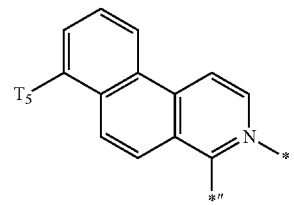
CY2
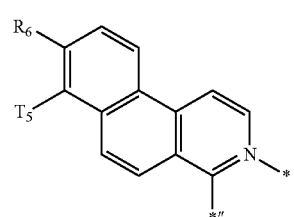
CY3
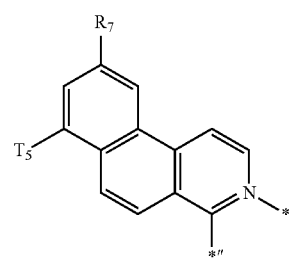
CY4
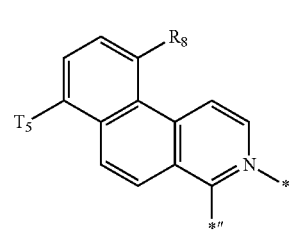
CY5
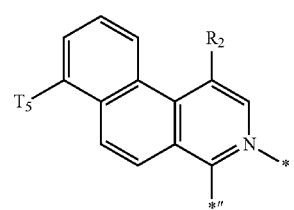
CY6
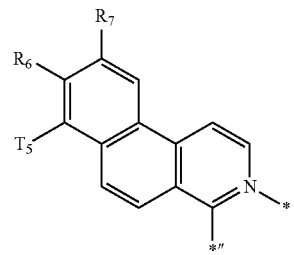
-continued
CY7
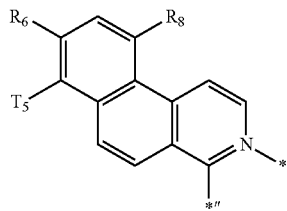
CY8
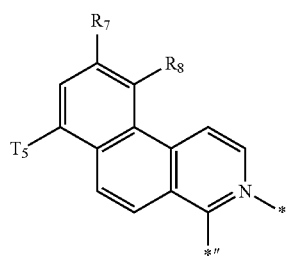
CY9
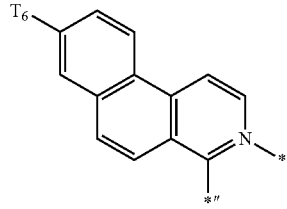
CY10
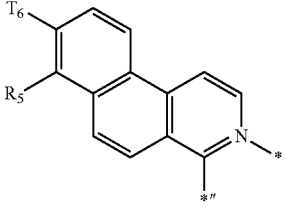
CY11
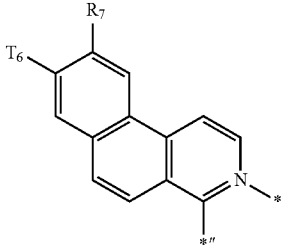
CY12
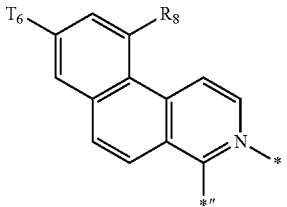
CY13

CY14
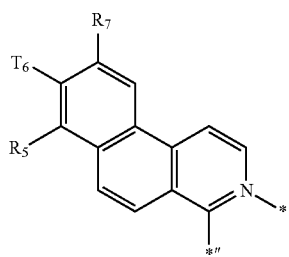
CY15
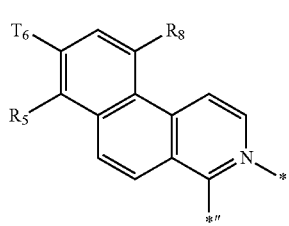
CY16
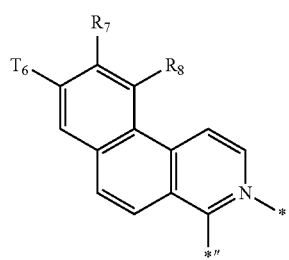
CY17
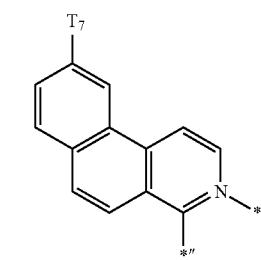
CY18
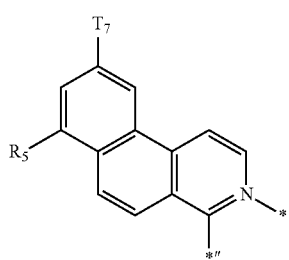
CY19
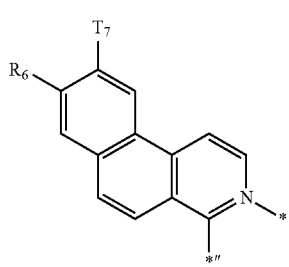
CY20
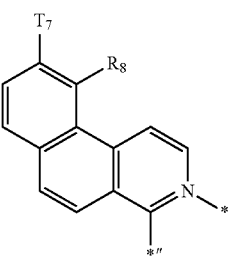
CY21
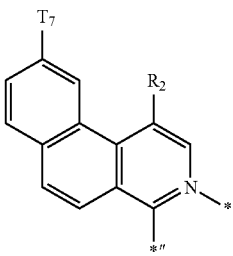
CY22
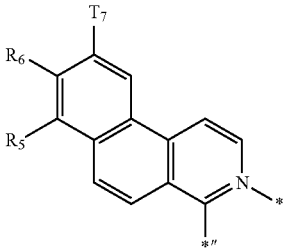
CY23
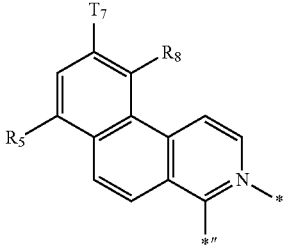
CY24
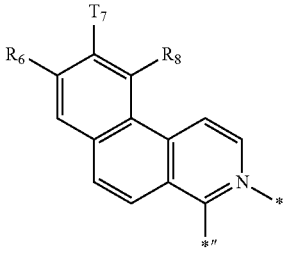
CY25
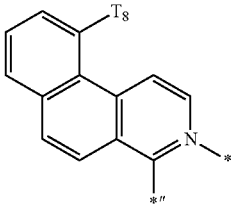

| CY26 | CY32 |
| CY27 | CY33 |
| CY28 | CY34 |
| CY29 | CY35 |
| CY30 | CY36 |
| CY31 | CY37 |
|  | CY38 |

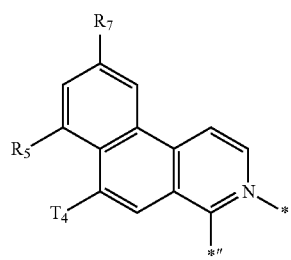
CY39
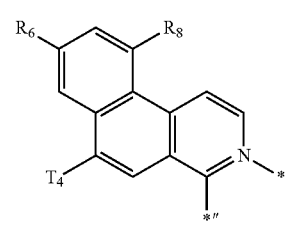
CY40
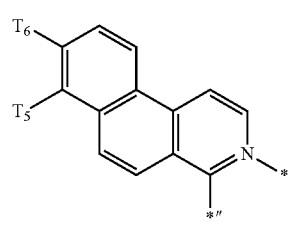
CY41
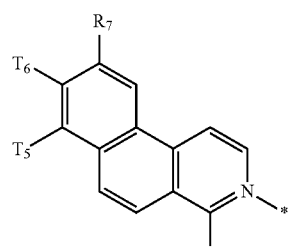
CY42
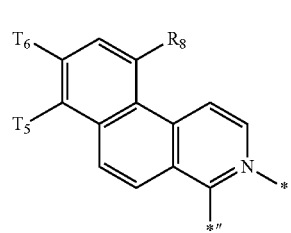
CY43
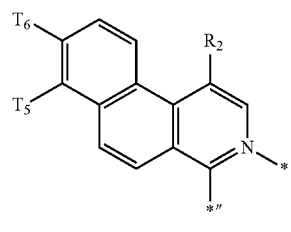
CY44
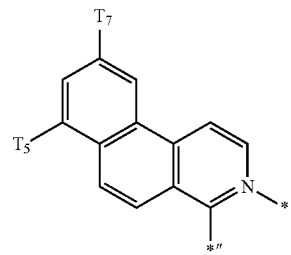
CY45
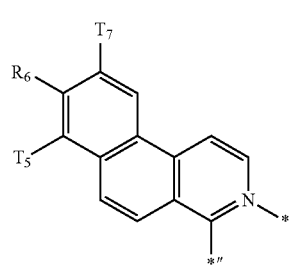
CY46
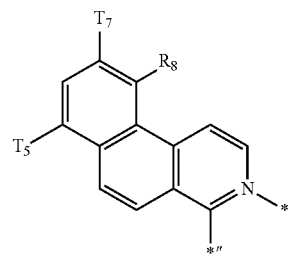
CY47
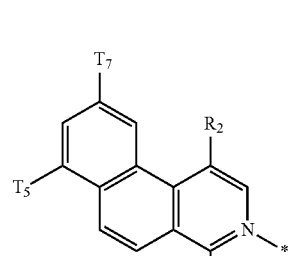
CY48
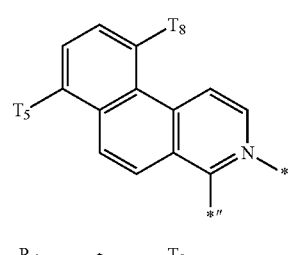
CY49
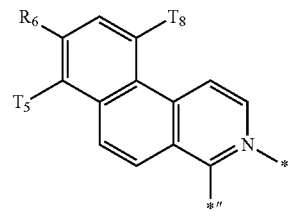
CY50

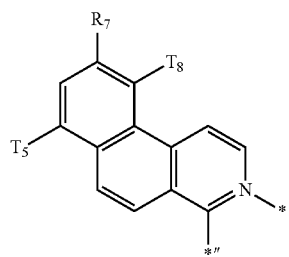
CY51
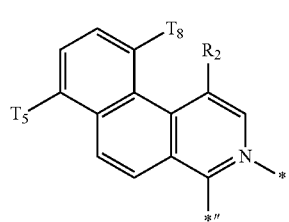
CY52
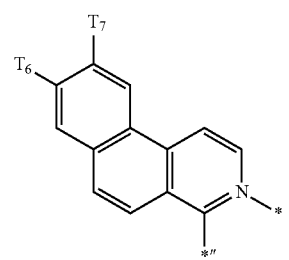
CY53
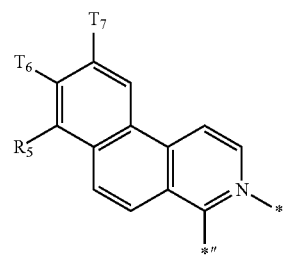
CY54
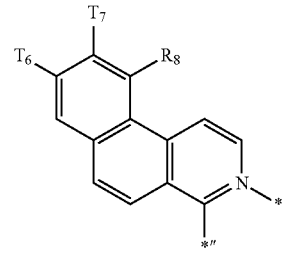
CY55
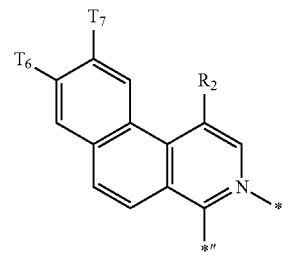
CY56
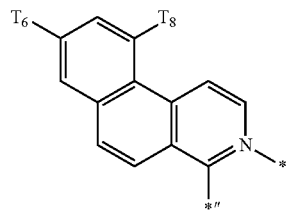
CY57
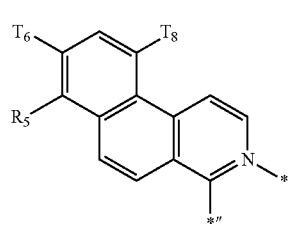
CY58
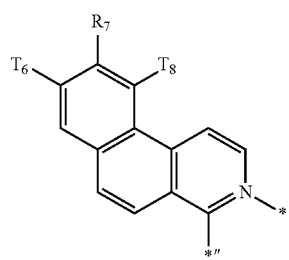
CY59
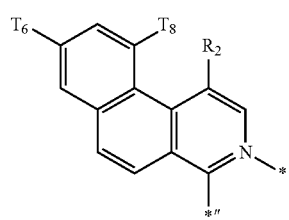
CY60
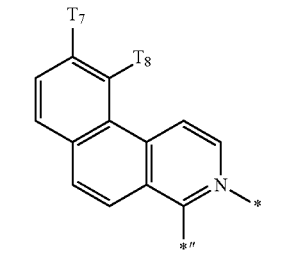
CY61
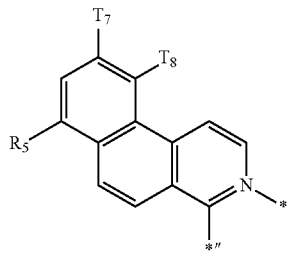
CY62

CY63
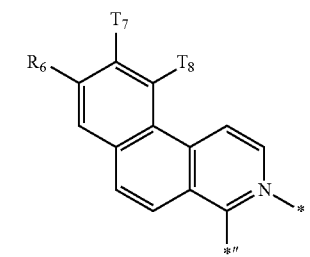
CY64
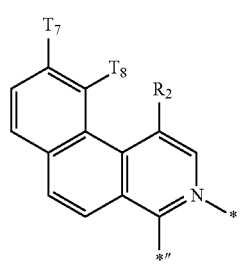
CY65
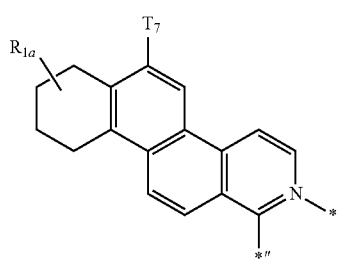
CY66
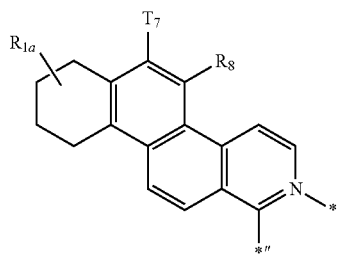
CY67
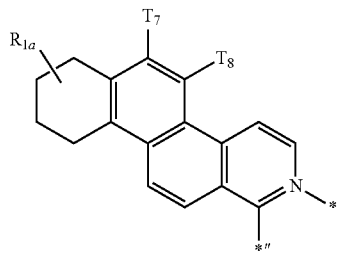
CY68
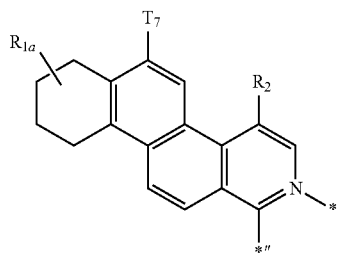
CY69
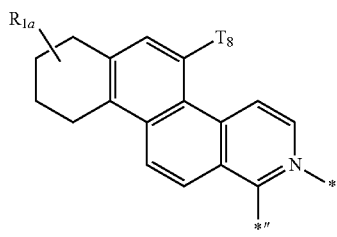
CY70
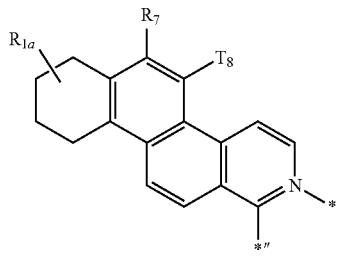
CY71
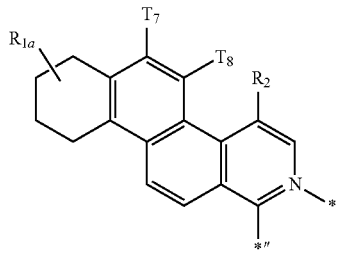
CY72
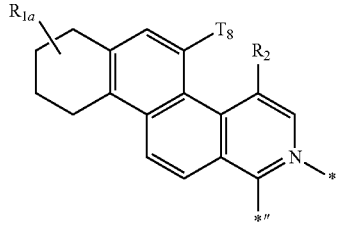
CY73
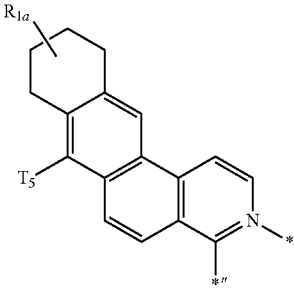
CY74
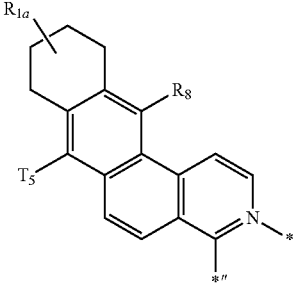

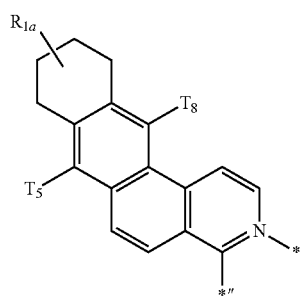 CY75
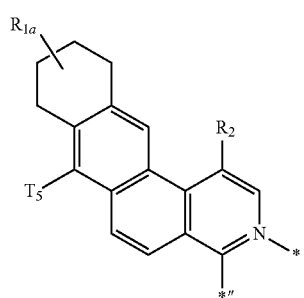 CY76
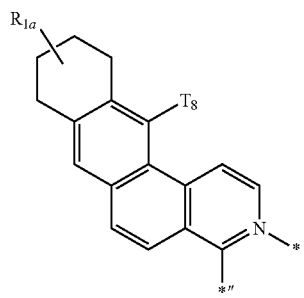 CY77
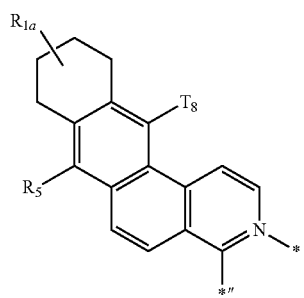 CY78
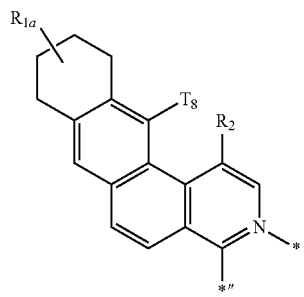 CY79
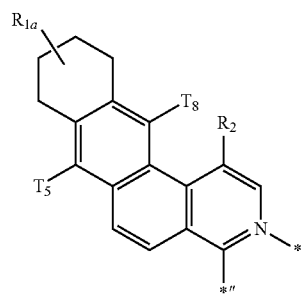 CY80
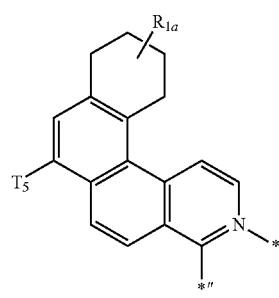 CY81
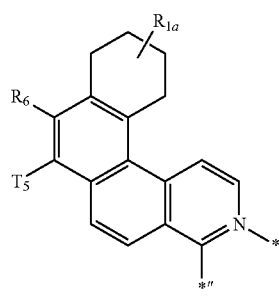 CY82
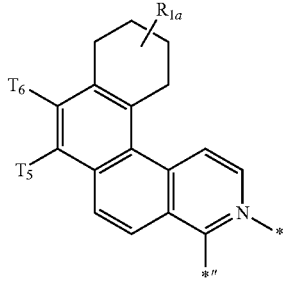 CY83
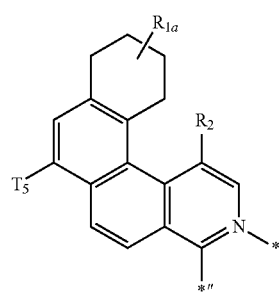 CY84

-continued

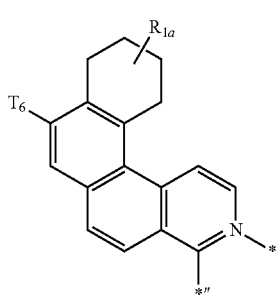
CY85

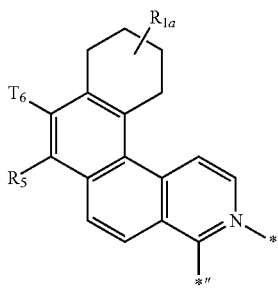
CY86

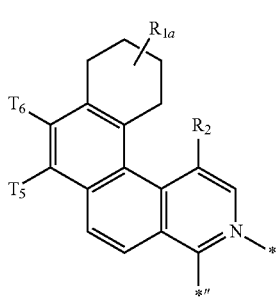
CY87

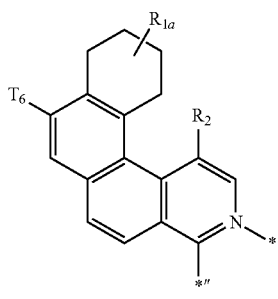
CY88 wherein, in Formulae CY1 to CY88,
$T_4$ to $T_8$ are each independently:
a fluoro group (—F);
each of $R_2$, $R_4$ to $R_8$, and $R_{1a}$ are the same as described in claim 1, and $R_2$ and $R_4$ to $R_8$ are not hydrogen,
* indicates a binding site to Ir in Formula 1, and
*'' indicates a binding site to a neighboring atom in Formula 1.

9. The organometallic compound of claim 8, wherein $R_2$ and $R_4$ to $R_8$ in Formulae CY1 to CY88 are each independently:
deuterium; or
a $C_1$-$C_{20}$ alkyl group, a $C_3$-$C_{10}$ cycloalkyl group, or a $C_1$-$C_{10}$ heterocycloalkyl group, each unsubstituted or substituted with deuterium, a $C_1$-$C_{20}$ alkyl group, a $C_3$-$C_{10}$ cycloalkyl group, a $C_2$-$C_{10}$ heterocycloalkyl group, or any combination thereof.

10. The organometallic compound of claim 1, wherein none of $R_{14}$ and $R_{16}$ is hydrogen.

11. The organometallic compound of claim 1, wherein
a number of carbons in a group represented by *—C($R_{13}$)($R_{14}$)($R_{19}$) in Formula 1 is 5 or more, and
a number of carbons in a group represented by *—C($R_{16}$)($R_{17}$)($R_{18}$) in Formula 1 is 5 or more.

12. An organic light-emitting device comprising:
a first electrode;
a second electrode; and
an organic layer disposed between the first electrode and the second electrode and comprising an emission layer,
wherein the organic layer comprises at least one organometallic compound of claim 1.

13. The organic light-emitting device of claim 12, wherein
the first electrode is an anode,
the second electrode is a cathode,
the organic layer further comprises a hole transport region between the first electrode and the emission layer and an electron transport region between the emission layer and the second electrode,
the hole transport region comprises a hole injection layer, a hole transport layer, an electron blocking layer, a buffer layer, or any combination thereof, and
the electron transport region comprises a hole blocking layer, an electron transport layer, an electron injection layer, or any combination thereof.

14. The organic light-emitting device of claim 12, wherein the organometallic compound is included in the emission layer.

15. The organic light-emitting device of claim 14, wherein the emission layer emits red light.

16. An organometallic compound selected from Compounds 1 to 5, 9 to 11, 13 to 16, 18 to 26, 29, 30 and 32 to 37 below:

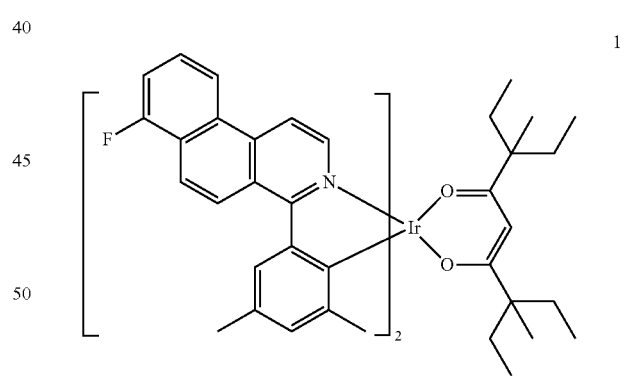
1

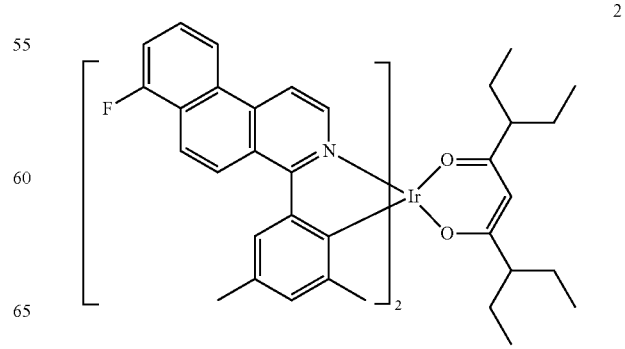
2

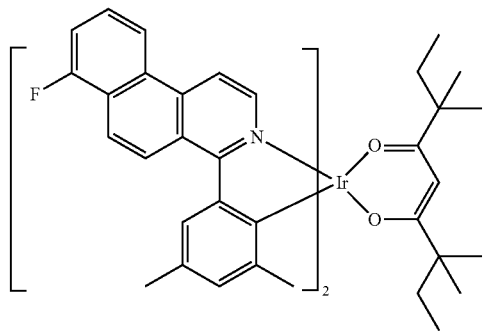
3
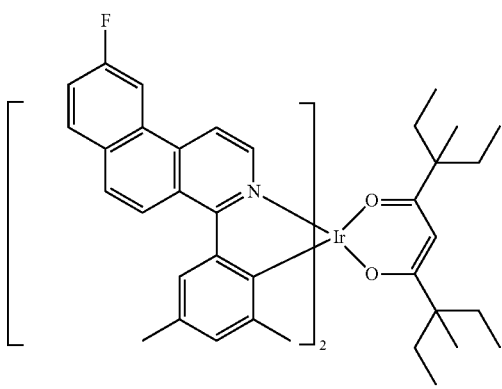
4
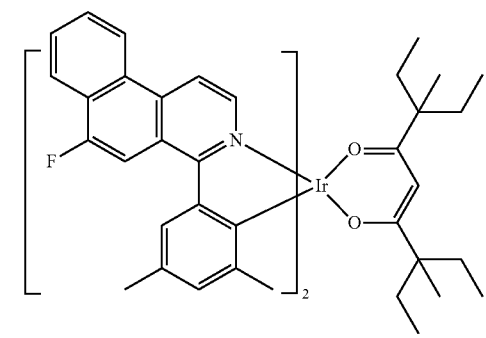
5
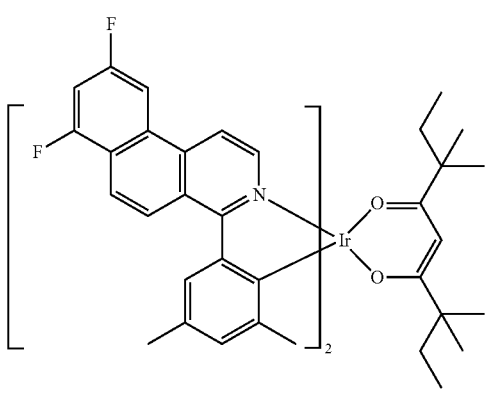
9
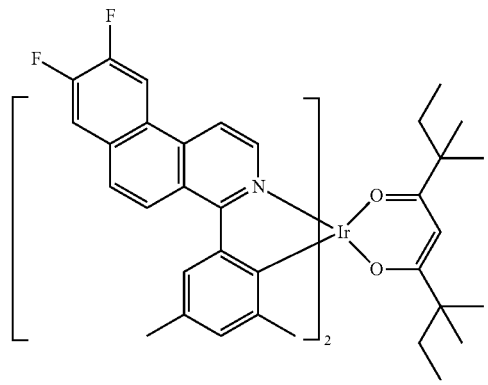
10
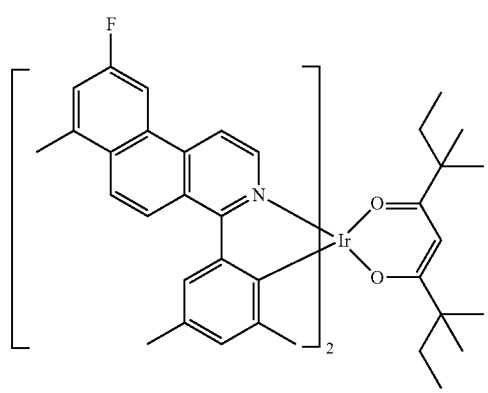
11
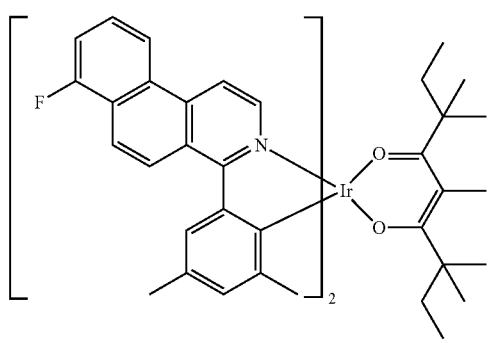
13
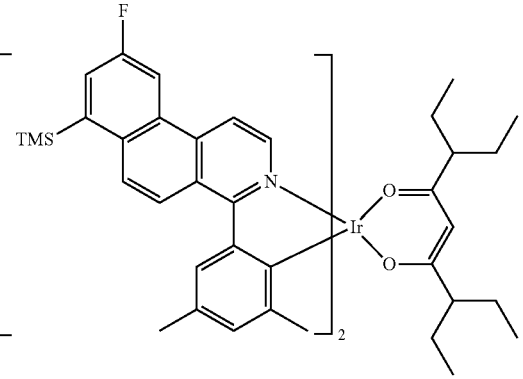
14

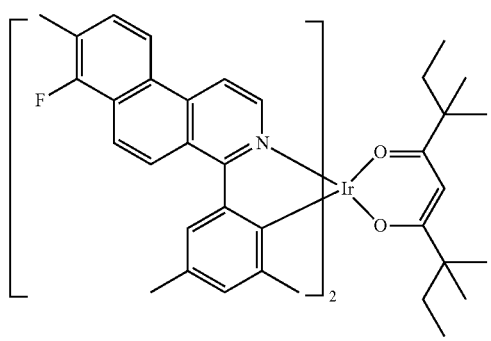
15
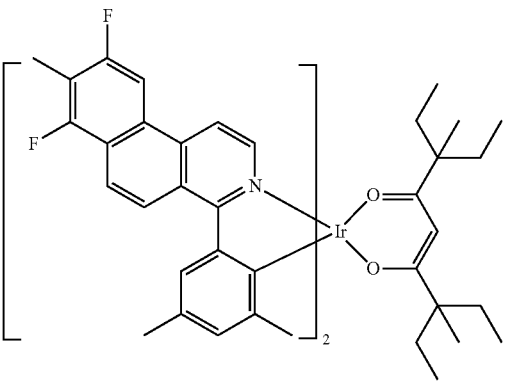
20
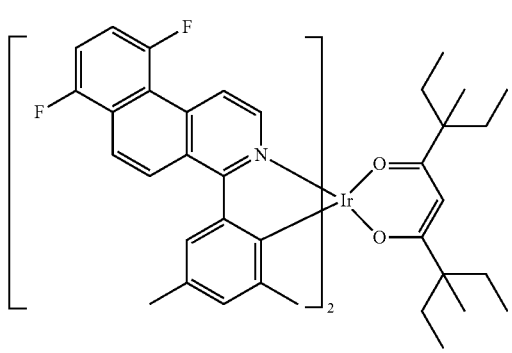
16
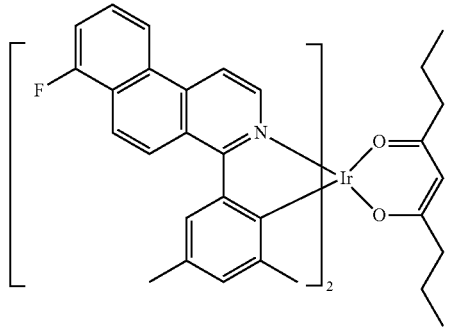
21
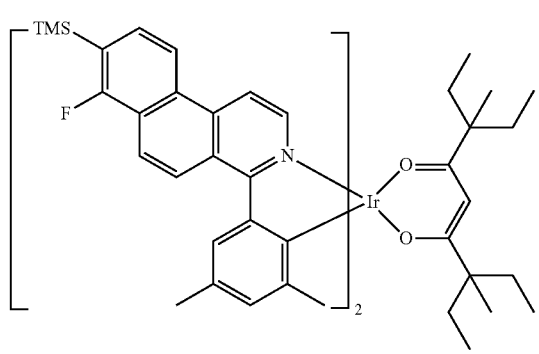
18
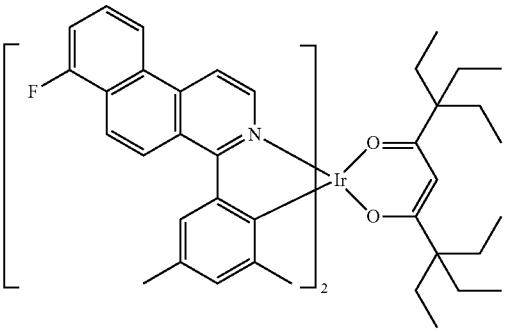
22
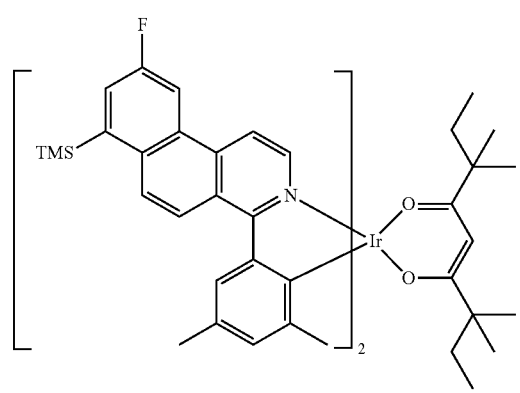
19
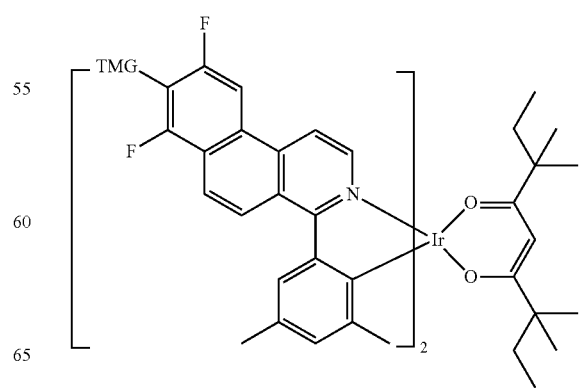
23

199
-continued
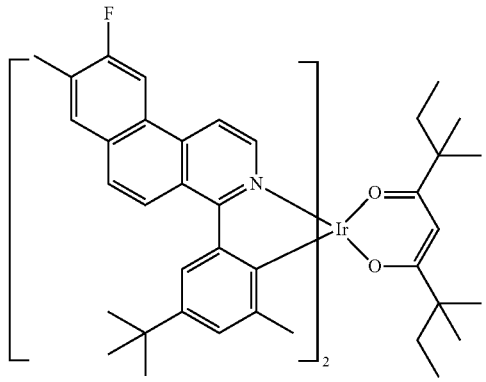
24
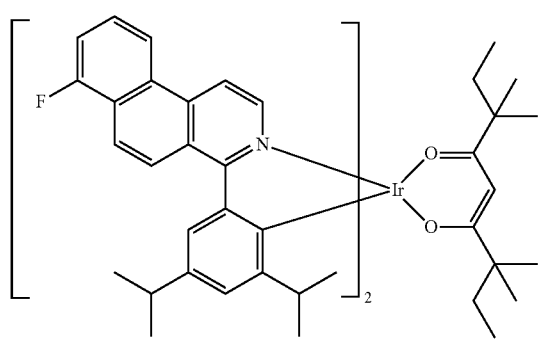
26
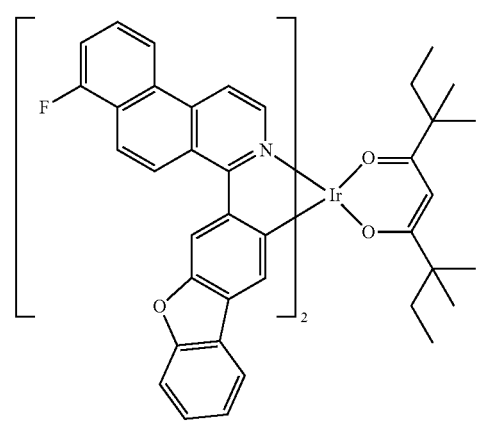
200
-continued
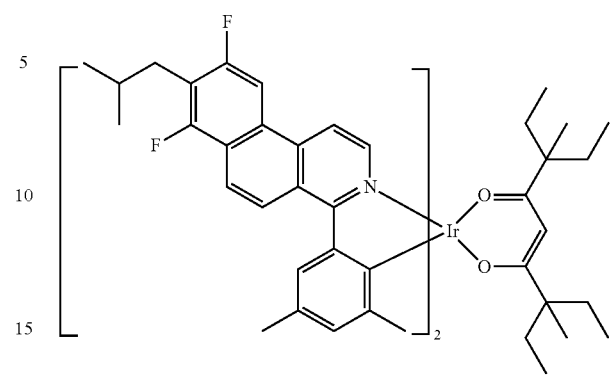
29
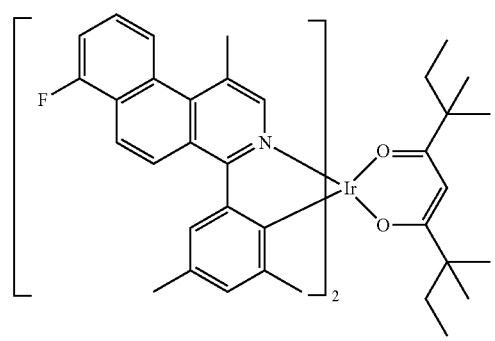
30
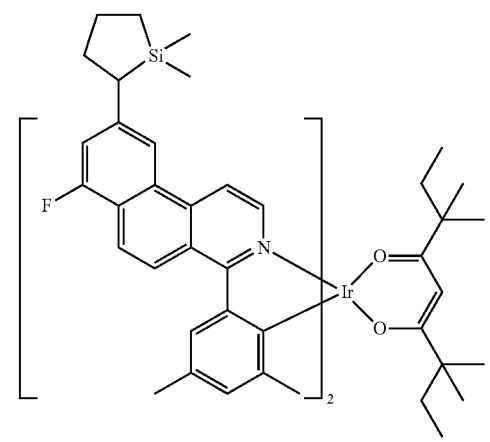
32

201
-continued
33
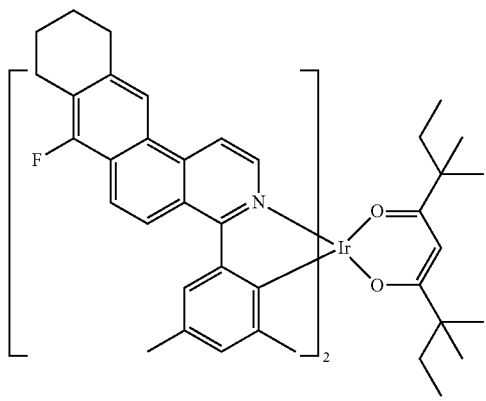
34
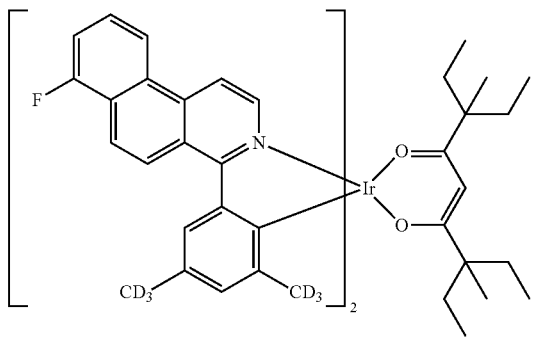
202
-continued
35
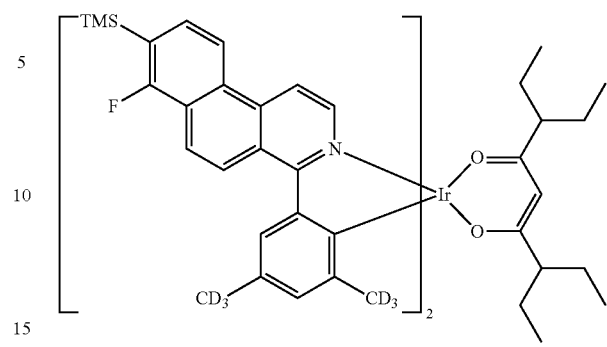
36
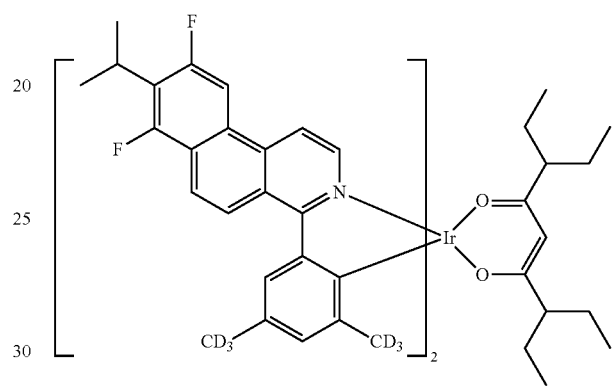
37
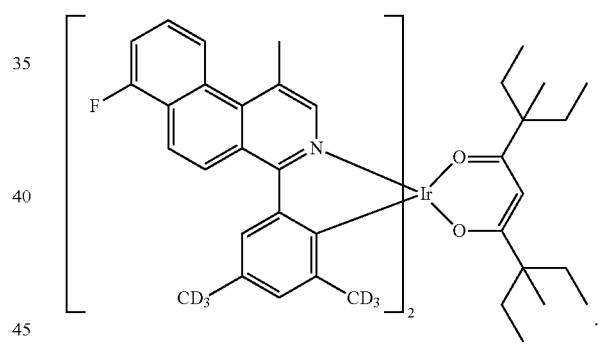
* * * * *